US012610701B2

(12) United States Patent
Yu et al.

(10) Patent No.: US 12,610,701 B2
(45) Date of Patent: Apr. 21, 2026

(54) DISPLAY SUBSTRATE, MANUFACTURING METHOD THEREFOR, AND DISPLAY DEVICE

(71) Applicants:Chengdu BOE Optoelectronics Technology Co., Ltd., Chengdu (CN); BOE Technology Group Co., Ltd., Beijing (CN)

(72) Inventors: Ziyang Yu, Beijing (CN); Mengqi Wang, Beijing (CN); Shilong Wang, Beijing (CN); Zhiliang Jiang, Beijing (CN); Ming Hu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 546 days.

(21) Appl. No.: 18/033,560

(22) PCT Filed: Apr. 28, 2022

(86) PCT No.: PCT/CN2022/089822
§ 371 (c)(1),
(2) Date: Apr. 25, 2023

(87) PCT Pub. No.: WO2023/206217
PCT Pub. Date: Nov. 2, 2023

(65) Prior Publication Data
US 2024/0381715 A1      Nov. 14, 2024

(51) Int. Cl.
*H10K 59/12*        (2023.01)
*H10K 59/131*       (2023.01)
(52) U.S. Cl.
CPC ....... *H10K 59/131* (2023.02); *H10K 59/1201* (2023.02)

(58) Field of Classification Search
CPC ......................... H10K 59/1201; H10K 59/131
See application file for complete search history.

(56) References Cited

U.S. PATENT DOCUMENTS

| | | | | |
|---|---|---|---|---|
| 10,714,015 B2 * | 7/2020 | Nie | ...................... | G09G 3/3275 |
| 11,800,764 B2 * | 10/2023 | Cho | .................... | H10K 59/131 |

(Continued)

FOREIGN PATENT DOCUMENTS

| | | |
|---|---|---|
| CN | 109791745 A | 5/2019 |
| CN | 112216721 A | 1/2021 |

(Continued)

OTHER PUBLICATIONS

Office Action dated Jan. 20, 2023 for Chinese Patent Application No. 202280001013.3 and English Translation.

(Continued)

*Primary Examiner* — Jaehwan Oh
(74) *Attorney, Agent, or Firm* — Ling Wu; Stephen Yang; Ling and Yang Intellectual Property

(57) ABSTRACT

A display substrate, a manufacturing method therefor, and a display device are disclosed. The display substrate includes multiple circuit units constituting multiple unit rows and multiple unit columns, multiple data signal lines and multiple data connection lines, the data connection lines include first connection lines extending along a first direction and second connection lines extending along a second direction, and the first connection lines are connected to the second connection lines; and in at least one circuit unit, the first connection lines are connected to the data signal lines through first connection holes, and at least one data signal line is provided between two first connection holes adjacent in the first direction.

20 Claims, 26 Drawing Sheets

(56) References Cited

U.S. PATENT DOCUMENTS

| 2017/0102795 A1 | 4/2017 | Wang et al. | |
| 2019/0057658 A1* | 2/2019 | Nie | G09G 3/3266 |
| 2019/0278145 A1 | 9/2019 | Tanaka et al. | |
| 2020/0013848 A1* | 1/2020 | Moon | H10K 59/131 |
| 2021/0013287 A1 | 1/2021 | Bang et al. | |
| 2021/0020724 A1 | 1/2021 | Cho et al. | |
| 2021/0111191 A1* | 4/2021 | Zeng | H10D 86/411 |
| 2021/0273035 A1 | 9/2021 | Cho et al. | |
| 2022/0406875 A1* | 12/2022 | Zhang | H10K 30/81 |
| 2023/0320147 A1* | 10/2023 | Son | G09G 3/3291 |
| 2023/0345785 A1* | 10/2023 | Feng | H10K 59/131 |

FOREIGN PATENT DOCUMENTS

| CN | 112242425 A | 1/2021 |
| CN | 112840475 A | 5/2021 |
| CN | 113745286 A | 12/2021 |
| WO | 2021232411 A1 | 11/2021 |
| WO | 2022028132 A1 | 2/2022 |
| WO | 2022037287 A1 | 2/2022 |
| WO | 2022056907 A1 | 3/2022 |

OTHER PUBLICATIONS

Office Action dated Apr. 21, 2023 for Chinese Patent Application No. 202280001013.3 and English Translation.

* cited by examiner (N-4)-th Column  (N-3)-th Column  (N-2)-th Column  (N-1)-th Column  N-th Column  (N+1)-th Column  (N+2)-th Column  (N+3)-th Column  (N+4)-th Column  (N+5)-th Column (M-3)-th Row (M-2)-th Row (M-1)-th Row M-th Row

92

92

410  420

210  210  210

310  310

DISPLAY SUBSTRATE, MANUFACTURING METHOD THEREFOR, AND DISPLAY DEVICE

CROSS-REFERENCE TO RELATED APPLICATION

The present application is a U.S. National Phase Entry of International Application PCT/CN2022/089822 having an international filing date of Apr. 28, 2022, and entitled "Display Substrate, Manufacturing Method Therefor, and Display Device", the contents of the above-identified application are incorporated herein by reference.

TECHNICAL FIELD

The present disclosure relates to, but is not limited to, the field of display technologies, and particularly to a display substrate, a method for manufacturing the display substrate, and a display device.

BACKGROUND

An Organic Light Emitting Diode (OLED for short) and a Quantum-dot Light Emitting Diode (QLED for short) are active light emitting display devices and have advantages such as self-luminescence, wide viewing angle, high contrast ratio, low power consumption, very high response speed, lightness and thinness, flexibility, and low costs. With constant development of display technologies, a flexible display that uses an OLED or a QLED as a light emitting device and performs signal control by a Thin Film Transistor (TFT for short) has become a mainstream product in the field of display at present.

SUMMARY

The following is a summary of subject matter described herein in detail. The summary is not intended to limit the protection scope of claims.

In one aspect, the present disclosure provides a display substrate, comprising a display area and a bonding area located on a side of the display area, wherein the display area includes a plurality of circuit units constituting a plurality of unit rows and a plurality of unit columns, a plurality of data signal lines and a plurality of data connection lines, the data connection line include first connection lines extending along a first direction and second connection lines extending along a second direction, the first connection lines are connected to the second connection lines respectively, and the first direction intersects with the second direction; and in at least one circuit unit, the data signal lines are connected to the first connection lines through first connection holes, and at least one data signal line is provided between two first connection holes adjacent in the first direction.

In an exemplary implementation, the first connection holes are arranged in circuit units of odd-numbered unit columns, and m data signal lines are provided between two first connection holes adjacent in the first direction, wherein m is an odd number greater than or equal to 1.

In an exemplary implementation, the first connection holes are arranged in circuit units of even-numbered unit columns, and m data signal lines are provided between two first connection holes adjacent in the first direction, wherein m is an odd number greater than or equal to 1.

In an exemplary implementation, the first connection holes are arranged in circuit units of odd-numbered unit columns, and other first connection holes adjacent to the first connection holes in the first direction are provided in circuit units of even-numbered unit columns; and two data signal lines are arranged between two first connection holes adjacent in the first direction.

In an exemplary implementation, at least one second connection line is arranged between two data signal lines adjacent in the first direction.

In an exemplary implementation, second connection lines are connected to the first connection lines through second connection holes, and a first connection hole and a second connection hole connecting a same first connection line are respectively arranged on two sides of the first connection line in the second direction.

In an exemplary implementation, each circuit unit at least includes a pixel drive circuit, and the data signal lines are connected to pixel drive circuits of a plurality of circuit units in one unit column; and the plurality of unit columns at least include a first unit column and a second unit column, wherein pixel drive circuits of a plurality of circuit units in the first unit column are respectively connected to a red light emitting device emitting red light and a blue light emitting device emitting blue light, pixel drive circuits of a plurality of circuit units in the second unit column are connected to a green light emitting device emitting green light, the first connection line is connected to a data signal line of the first unit column, and the first connection line is not connected to a data signal line of the second unit column.

In an exemplary implementation, the display area further includes a plurality of first power supply traces extending along the first direction and a plurality of second power supply traces extending along the second direction, wherein the second power supply traces are connected to the first power supply traces through third connection holes.

In an exemplary implementation, the second power supply traces are arranged between two data signal lines adjacent in the first direction.

In an exemplary implementation, the bonding area is provided with bonding power supply leads connected to the plurality of second power supply traces of the display area.

In an exemplary implementation, the display substrate further includes a bezel area located on other sides of the display area, wherein the bezel area is provided with a bezel power supply lead, and the bezel power supply lead is connected to the plurality of first power supply traces of the display area.

In an exemplary implementation, the first power supply traces and the first connection lines are arranged in a same layer, at least one circuit unit includes a first fracture arranged between a first connection line and a first power supply trace, and an orthographic projection of the first fracture on the plane of the display substrate is at least partially overlapped with an orthographic projection of a second power supply trace on the plane of the display substrate.

In an exemplary implementation, the second power supply traces and the second connection line are arranged in a same layer, the at least one circuit unit includes a second fracture arranged between the second connection line and the second power supply trace, and an orthographic projection of the second fracture on the plane of the display substrate is at least partially overlapped with an orthographic projection of the first connection line on the plane of the display substrate.

In an exemplary implementation, the bonding area at least includes a lead region, the lead region includes a plurality of lead-out lines, and the plurality of lead-out lines include a first lead-out line group and a second lead-out line group, wherein lead-out lines in the first lead-out line group are connected to the data signal lines through data connection lines, and lead-out lines in the second lead-out line group are connected to data signal lines.

In an exemplary implementation, a plurality of lead-out lines of the first lead-out line group are arranged sequentially along the first direction in an order of increasing numbers, and a plurality of lead-out lines of the second lead-out line group are arranged sequentially along an opposite direction of the first direction in an order of increasing numbers; or, the plurality of lead-out lines of the first lead-out line group are arranged sequentially along the opposite direction of the first direction in the order of increasing numbers, and the plurality of lead-out lines of the second lead-out line group are arranged sequentially along the first direction in the order of increasing numbers.

In an exemplary implementation, each circuit unit at least includes a pixel drive circuit, the pixel drive circuit includes a storage capacitor and a plurality of transistors; and in a plane perpendicular to the display substrate, the drive circuit layer includes a semiconductor layer, a first conductive layer, a second conductive layer, a third conductive layer and a fourth conductive layer which are arranged sequentially on the base substrate, wherein the semiconductor layer at least includes active layers of the plurality of transistors, the first conductive layer at least includes gate electrodes of the plurality of transistors and a first plate of the storage capacitor, the second conductive layer at least includes a second plate of the storage capacitor, the third conductive layer at least includes first electrodes and second electrodes of the plurality of transistors and the first connection lines, and the fourth conductive layer at least includes the data signal lines, the second connection lines and first power supply lines, wherein the data signal lines are connected to first ends of the first connection lines through the first connection holes, and the second connection lines are connected to second ends of the first connection lines through the second connection holes.

In an exemplary implementation, the bonding area at least includes a lead region, the lead region at least includes a plurality of lead-out lines, and the plurality of lead-out lines include a plurality of first lead-out lines arranged in the first conductive layer and a plurality of second lead-out lines arranged in the second conductive layer; the first lead-out lines are connected to data signal lines of odd-numbered unit columns in the display area, and the second lead-out lines is connected to data signal lines of even-numbered unit columns in the display area; or, the first lead-out lines are connected to data signal lines of even-numbered unit columns in the display area, and the second lead-out lines are connected to data signal lines of odd-numbered unit columns in the display area.

In an exemplary implementation, the first conductive layer further includes a plurality of first lead electrodes connected to the first lead-out lines; the second conductive layer further includes a plurality of second lead electrodes connected to the second lead-out lines; the third conductive layer further includes a plurality of third lead electrodes and a plurality of fourth lead electrodes, wherein the third lead electrodes are connected to the first lead electrodes through via holes, and the fourth lead electrodes are connected to the second lead electrodes through via holes; data signal lines of the odd-numbered unit columns in the display area are connected to the third lead electrodes through via holes, and data signal lines of the even-numbered unit columns in the display area are connected to the fourth lead electrodes through via holes; or, the data signal lines of the even-numbered unit columns in the display area are connected to the third lead electrodes through via holes, and the data signal lines of the odd-numbered unit columns in the display area are connected to the fourth lead electrodes through the via holes.

In an exemplary implementation, the third conductive layer further includes a plurality of first power supply traces extending along the first direction, the fourth conductive layer further includes a plurality of second power supply traces extending along the second direction, and the second power supply traces are connected to the first power supply traces through third connection holes.

In an exemplary implementation, the bonding area at least includes a lead region, the lead region at least includes a plurality of bonding high-voltage electrodes arranged sequentially along the first direction, the bonding high-voltage electrodes are configured to be connected to the first power supply lines, and one lead electrode connected to a data signal line is provided between bonding high-voltage electrodes adjacent in the first direction.

In an exemplary implementation, one lead electrode connected to a second connection line is further provided between part of adjacent bonding high-voltage electrodes.

In an exemplary implementation, the plurality of transistors at least include a drive transistor, a reset transistor and a compensation transistor, the storage capacitor includes a first plate and a second plate, and the third conductive layer further includes a first connection electrode and a second connection electrode, wherein the first connection electrode is respectively connected to the first plate, a gate electrode of the drive transistor, a second electrode of the reset transistor and a first electrode of the compensation transistor, and the second connection electrode is respectively connected to the second plate and the first power supply line.

In an exemplary implementation, an orthographic projection of the first connection electrode on the base substrate is at least partially overlapped with an orthographic projection of the first power supply line on the base substrate.

In an exemplary implementation, an orthographic projection of the second connection electrode on the base substrate is at least partially overlapped with the orthographic projection of the first power supply line on the base substrate.

In an exemplary implementation, the plurality of transistors at least include a data write transistor, and in at least one circuit unit, a pattern of the third conductive layer further includes a data connection electrode, wherein the data connection electrode is connected to the first connection line, and the data connection electrode and a first electrode of the data write transistor have a shared structure.

In another aspect, the present disclosure further provides a display device, including the aforementioned display substrate.

In yet another aspect, the present disclosure further provides a method for manufacturing the display substrate including a display area and a bonding area on a side of the display area, and the display area includes a plurality of circuit units constituting a plurality of unit rows and a plurality of unit columns, a plurality of data signal lines and a plurality of data connection lines, wherein the data connection lines include first connection lines extending along the first direction and second connection lines extending along the second direction, the first connection lines are connected to the second connection lines, and the first direction intersects with the second direction; and the method includes:

forming the data signal lines and the first connection lines in at least one circuit unit, wherein the first connection lines are connected to the data signal lines through first connection holes, and at least one data signal line is provided between two first connection holes adjacent in the first direction.

Other aspects may be understood upon reading and understanding the drawings and the detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

Description of reference signs:

| | | |
|---|---|---|
| 11-first active layer; | 12-second active layer; | 13-third active layer; |
| 14-fourth active layer; | 15-fifth active layer; | 16-sixth active layer; |
| 17-seventh active layer; | 21-first scan signal line | 21-1-gate block; |
| 22-second scan signal line | 23-third scan signal line; | 24-light emitting control line; |
| 25-first plate; | 31-first initial signal line; | 32-second initial signal line; |
| 33-second plate; | 34-plate connection line; | 35-shield electrode; |
| 36-opening; | 41-first connection electrode; | 42-second connection electrode; |
| 43-third connection electrode; | 44-fourth connection electrode; | 45-fifth connection electrode; |
| 46-sixth connection electrode; | 47-seventh connection electrode; | 51-first power supply line; |
| 52-anode connection electrode; | 60-data signal line; | 70-data connection line; |
| 71-first connection line; | 72-second connection line; | 80-lead-out line; |
| 81-data connection electrode; | 82-data connection block; | 83-fan-out connection electrode; |
| 84-fan-out connection block; | 85-power supply connection electrode; | |
| 86-power supply connection block; | | |
| 87-dummy electrode; | 91-first power supply trace; | 92-second power supply trace; |
| 100-display area; | 101-base substrate; | 102-drive circuit layer; |
| 103-light emitting structure layer; | 104-encapsulation structure layer; | 110-first region; |
| 120-second region; | 130-third region; | 200-bonding area; |
| 201-lead region; | 210-first lead electrode; | 220-second lead electrode; |
| 230-third lead electrode; | 240-fourth lead electrode; | 250-bonding high-voltage line; |
| 260-bonding high-voltage electrode; | 300-bezel area; | 301-anode; |
| 302-pixel definition layer; | 303-organic light emitting layer; | 304-cathode; |
| 310-eleventh lead electrode; | 320-twelfth lead electrode; | 330-thirteenth lead electrode; |
| 340-fourteenth lead electrode; | 401-first encapsulation layer; | 402-second encapsulation layer; |
| 403-third encapsulation layer; | 410-bonding power supply lead; | 420-lead opening; |
| 510-bezel power supply lead. | | |

FIG. 7a to FIG. 7e are schematic diagrams of an arrangement of data connection lines according to an exemplary embodiment of the present disclosure.

Figure 8A:
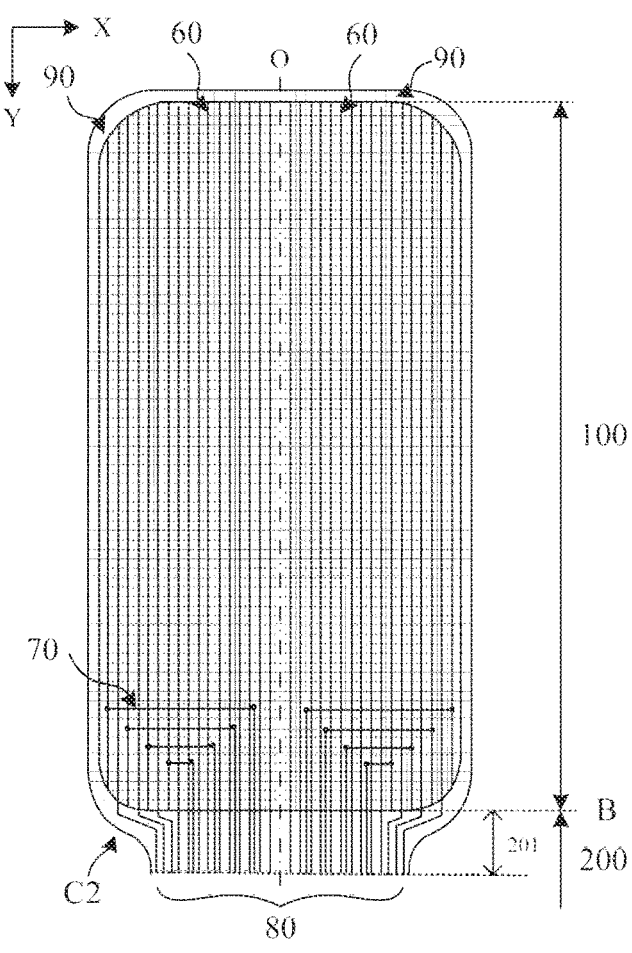
Figure 8B:
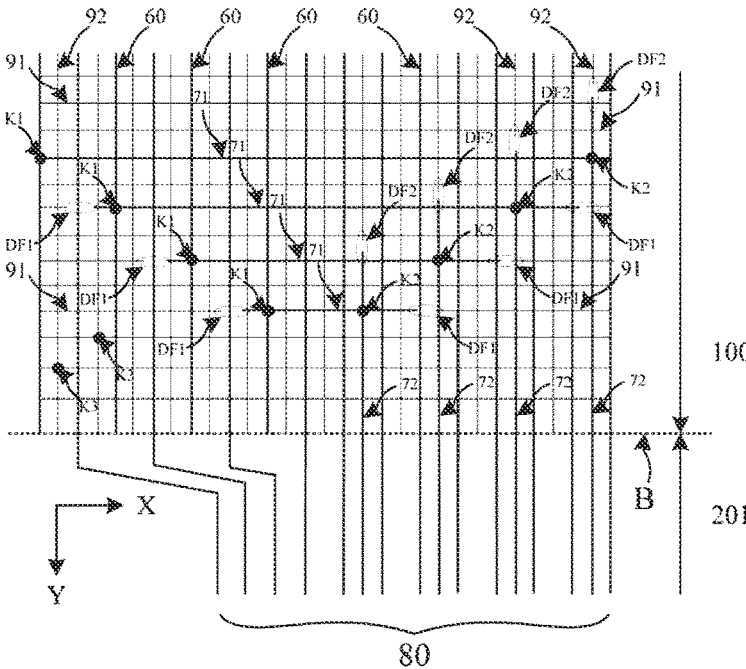

FIG. 8a to FIG. 8b are schematic diagrams of a planar structure of another display substrate according to an exemplary embodiment of the present disclosure.

Figure 9:
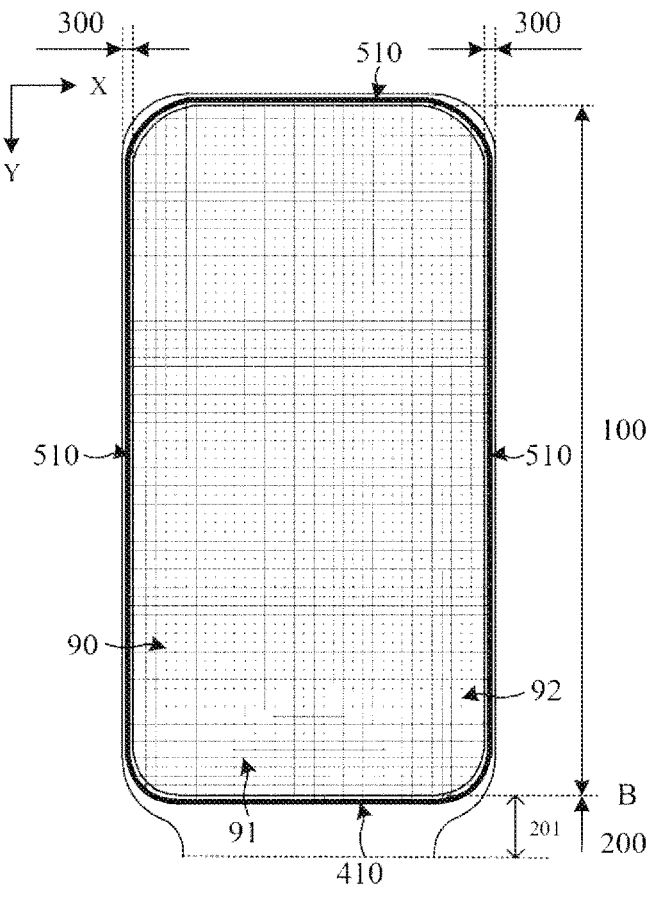

FIG. 9 is a schematic diagram of a planar structure of a power supply trace according to an exemplary embodiment of the present disclosure.

DETAILED DESCRIPTION

To make objectives, technical solutions, and advantages of the present disclosure clearer, the embodiments of the present disclosure will be described in detail with reference to the accompanying drawings. It is to be noted that implementations may be practiced in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

Scales of the drawings in the present disclosure may be used as a reference in an actual process, but are not limited thereto. For example, a width-length ratio of a channel, a thickness and spacing of each film layer, and a width and spacing of each signal line may be adjusted according to actual needs. The number of pixels in the display substrate and the number of sub-pixels in each pixel are not limited to the numbers shown in the drawings. The drawings described in the present disclosure are schematic structural diagrams only, and one implementation of the present disclosure is not limited to the shapes, numerical values or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection, or an integral connection. It may be a mechanical connection or an electrical connection. It may be a direct mutual connection, or an indirect connection through middleware, or an internal communication between two components. Those of ordinary skills in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with the certain electrical effect" is not particularly limited as long as electrical signals can be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above $-10°$ and below $10°$, and thus also includes a state in which the angle is above $-5°$ and below $5°$. In addition, "perpendicular" refers to a state in which an angle formed by two straight lines is above $80°$ and below $100°$, and thus also includes a state in which the angle is above $85°$ and below $95°$.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon and hexagon in this specification are not strictly defined, and they may be approximate triangle, rectangle, trapezoid, pentagon or hexagon, etc. There may be some small deformations caused by tolerance, and there may be chamfers, arc edges and deformations, etc.

In the present disclosure, "about" refers to that a boundary is defined not so strictly and numerical values within process and measurement error ranges are allowed.

Figure 1:
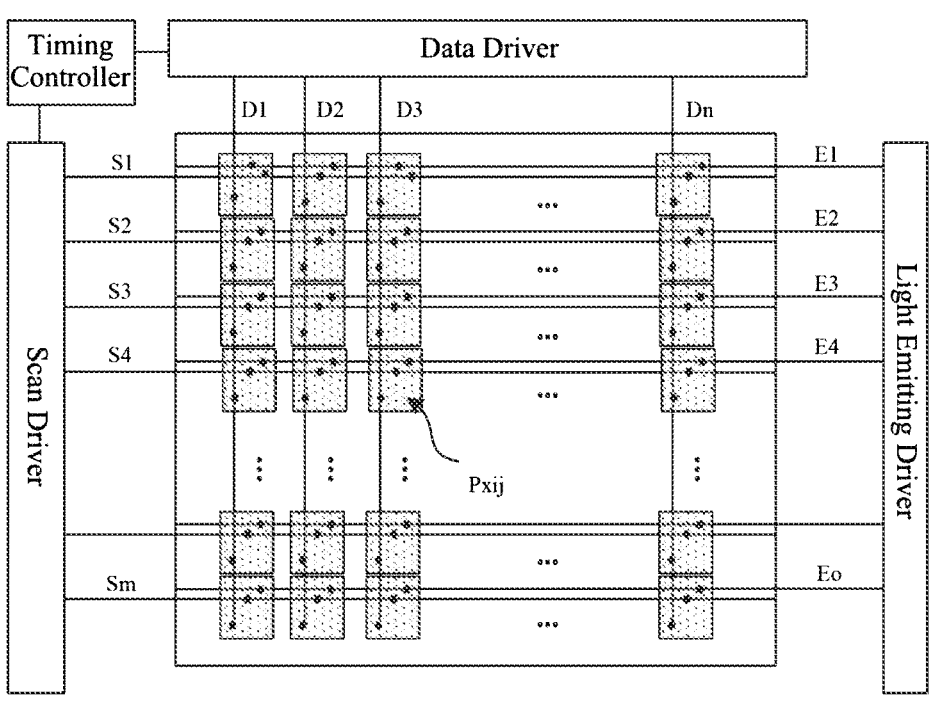
FIG. 1 is a schematic diagram of a structure of a display device.

FIG. 1 is a schematic diagram of a structure of a display device. As shown in FIG. 1, the display device may include a timing controller, a data driver, a scan driver, a light emitting driver and a pixel array. The timing controller is connected to the data driver, the scan driver and the light emitting driver respectively, the data driver is connected to a plurality of data signal lines (D1 to Dn) respectively, the scan driver is connected to a plurality of scan signal lines (S1 to Sm) respectively, and the light emitting driver is connected to a plurality of light emitting signal lines (E1 to Eo) respectively. The pixel array may include a plurality of sub-pixels Pxij, wherein i and j may be natural numbers. At least one sub-pixel Pxij may include a circuit unit and a light emitting device connected to the circuit unit, wherein the circuit unit may at least include a pixel drive circuit, which is respectively connected to a scan signal line, a light emitting signal line and a data signal line. In an exemplary embodiment, the timing controller may provide the data driver with a gray scale value and a control signal which are suitable for a specification of the data driver, provide the scan driver with a clock signal, a scan start signal, etc., which are suitable for a specification of the scan driver, and provide the light emitting driver with a clock signal, an emission stop signal, etc., which are suitable for a specification of the light emitting driver. The data driver may generate a data voltage to be provided to the data signal lines D1, D2, D3, . . . , and Dn by using the gray scale value and the control signal that are received from the timing controller. For example, the data driver may sample the gray scale value by using the clock signal and apply a data voltage corresponding to the gray scale value to the data signal lines D1 to Dn by taking a pixel row as a unit, wherein n may be a natural number. The scan driver may receive the clock signal, the scan start signal, etc., from the timing controller to generate a scan signal to be provided to the scan signal lines S1, S2, S3, . . . , and Sm. For example, the scan driver may provide a scan signal with an on-level pulse to the scan signal lines S1 to Sm sequentially. For example, the scan driver may be constructed in a form of a shift register and may generate a scan signal in a manner that the scan start signal provided in a form of an on-level pulse is transmitted to a next-stage circuit sequentially under the control of the clock signal, wherein m may be a natural number. The light emitting driver may receive the clock signal, the emission stop signal, etc., from the timing controller to generate an emission signal to be provided to the light emitting signal lines E1, E2, E3, . . . , and Eo. For example, the light emitting driver may provide an emission signal with an off-level pulse to the light emitting signal lines E1 to Eo sequentially. For example, the light emitting driver may be constructed in a form of a shift register and may generate the emission signal in a manner that the emission stop signal provided in a form of an off-level pulse is transmitted to a next-stage circuit sequentially under the control of the clock signal, wherein o may be a natural number.

Figure 2:
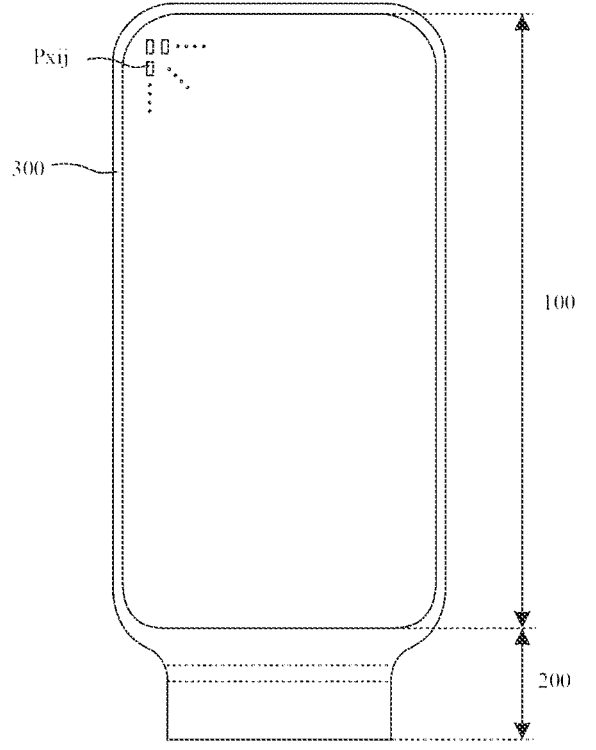
FIG. 2 is a schematic diagram of a structure of a display substrate.

FIG. 2 is a schematic diagram of a structure of a display substrate. As shown in FIG. 2, the display substrate may include a display area 100, a bonding area 200 on a side of the display area 100, and a bezel area 300 on other sides of the display area 100. In an exemplary embodiment, the display area 100 may be a flat area including a plurality of sub-pixels Pxij that constitute a pixel array. The plurality of sub-pixels Pxij are configured to display a dynamic picture or a static image, and the display area 100 may be referred to as an active area (AA). In an exemplary embodiment, the display substrate may be a flexible substrate, and accordingly the display substrate can be deformed, for example, may be rolled, bent, folded, or curled.

In an exemplary embodiment, the bonding area 200 may include a fan-out region, a bending region, a drive chip region, and a bonding pin region which are arranged sequentially in a direction away from the display area. The fan-out region is connected to the display area 100 and at least includes data fan-out lines, a plurality of which are configured to be connected to data signal lines of the display area in a fan-out tracing manner. The bending region is connected to the fan-out region and may include a composite insulation layer provided with a groove, and is configured to allow the bonding area to be bent to the back of the display area. The drive chip region may include an Integrated Circuit (IC for short), and is configured to be connected to a plurality of data fan-out lines. The bonding pin region may include bonding pads, which are configured to be bonded to an external flexible printed circuit (FPC for short).

In an exemplary embodiment, the bezel area 300 may include a circuit region, a power supply line region, and a crack dam region and a cutting region which are arranged sequentially along the direction away from the display area 100. The circuit region is connected to the display area 100 and may at least include a gate drive circuit which is connected to a first scan line, a second scan line and a light emitting control line of a pixel drive circuit in the display area 100. The power supply line region is connected to the circuit region and may at least include a bezel power supply lead-out line that extends along a direction parallel to an edge of the display area and is connected to a cathode in the display area 100. The crack dam region and may at least include a plurality of cracks provided on the composite insulation layer. The cutting region is connected to the crack dam region and may at least include a cutting groove arranged on the composite insulation layer, and the cutting groove is configured such that a cutting equipment cuts along the cutting groove respectively after all film layers of the display substrate are prepared.

In an exemplary embodiment, the fan-out region in the bonding area 200 and the power supply line region in the bezel area 300 may be provided with a first isolation dam and a second isolation dam, and the first isolation dam and the second isolation dam may extend in a direction parallel to an edge of the display area 100, thus forming an annular structure surrounding the display area 100. The edge of the display area is an edge on a side of the display area, the bonding area or the bezel area.

Figure 3:
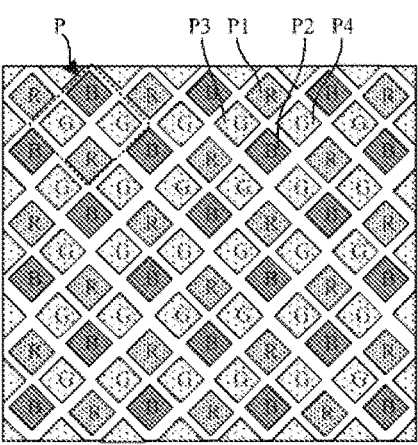
FIG. 3 is a schematic diagram of a planar structure of a display area in a display substrate.

FIG. 3 is a schematic diagram of a planar structure of a display area in a display substrate. As shown in FIG. 3, the display substrate may include a plurality of pixel units P arranged in a matrix. At least one pixel unit P includes a first sub-pixel P1 emitting light of a first color, a second sub-pixel P2 emitting light of a second color, a third sub-pixel P3 emitting light of a third color and a fourth sub-pixel P4 emitting light of a fourth color. Each sub-pixel may include a circuit unit and a light emitting device. The circuit unit may at least include a pixel drive circuit which is connected to a scan signal line, a data signal line, and a light emitting signal line respectively. The pixel drive circuit is configured to receive a data voltage transmitted by the data signal line and output a corresponding current to the light emitting device under control of the scan signal line and the light emitting signal line. The light emitting device in each sub-pixel is connected to a pixel drive circuit of the sub-pixel where the light emitting device is located, and is configured to emit light with a corresponding brightness in response to a current output by the pixel drive circuit of the sub-pixel where the light emitting device is located.

In an exemplary embodiment, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary embodiment, a shape of a sub-pixel may be rectangular, diamond-shaped, pentagonal and hexagonal. The four sub-pixels may be arranged in a diamond form to form an RGBG pixel arrangement. In other exemplary embodiments, the four sub-pixels may be arranged side by side horizontally, side by side vertically, or square-shaped manner, which is not limited in the present disclosure.

In an exemplary embodiment, each pixel unit may include three sub-pixels, and the three sub-pixels may be arranged side by side horizontally, side by side vertically, or in a delta-shaped arrangement, which is not limited in the present disclosure.

Figure 4:
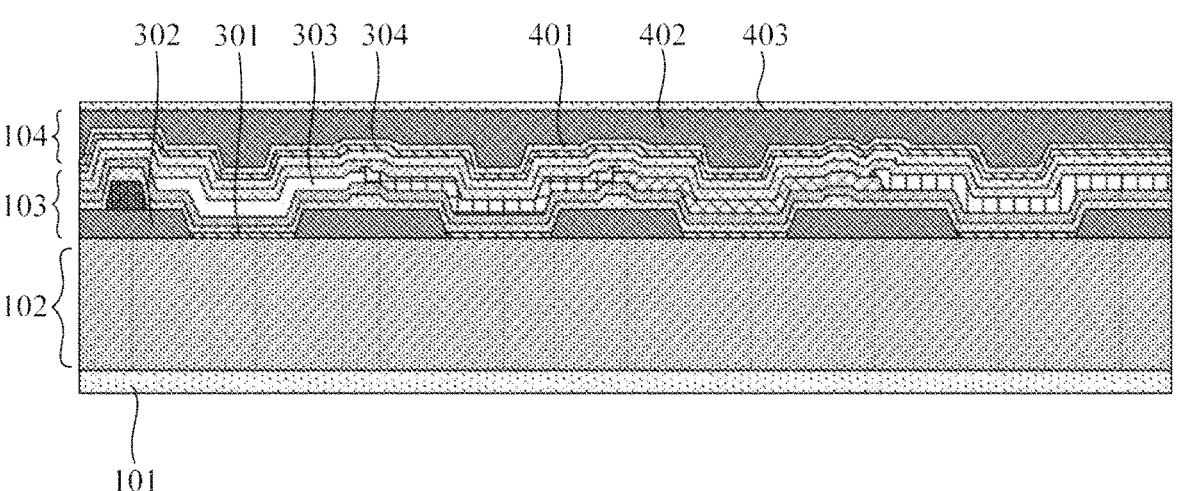
FIG. 4 is a schematic diagram of a sectional structure of a display area in a display substrate.

FIG. 4 is a schematic diagram of a sectional structure of a display area in a display substrate, illustrating a structure of four sub-pixels in the display area. As shown in FIG. 4, in a plane perpendicular to the display substrate, the display substrate may include a drive circuit layer 102 arranged on the base substrate 101, a light emitting structure layer 103 arranged on a side of the drive circuit layer 102 away from the base substrate 101, and an encapsulation structure layer 104 arranged on a side of the light emitting structure layer 103 away from the base substrate 101. In some possible implementations, the display substrate may include other film layers, such as a touch structure layer, which is not limited here in the present disclosure.

In an exemplary embodiment, the base substrate 101 may be a flexible substrate, or may be a rigid substrate. The drive circuit layer 102 of each sub-pixel may include a pixel drive circuit composed of a plurality of transistors and storage capacitors. The light emitting structure layer 103 of each sub-pixel may at least include an anode 301, a pixel definition layer 302, an organic light emitting layer 303 and a cathode 304. The anode 301 is connected to the pixel drive circuit, the organic light emitting layer 303 is connected to the anode 301, the cathode 304 is connected to the organic light emitting layer 303, and the organic light emitting layer 303 emits light of a corresponding color under driving of the anode 301 and the cathode 304. The encapsulation structure layer 104 may include a first encapsulation layer 401, a second encapsulation layer 402, and a third encapsulation layer 403 that are stacked. The first encapsulation layer 401 and the third encapsulation layer 403 may be made of an inorganic material, the second encapsulation layer 402 may be made of an organic material, and the second encapsulation layer 402 is arranged between the first encapsulation layer 401 and the third encapsulation layer 403 to form a stacked structure of inorganic material/organic material/inorganic material and ensure that external moisture cannot enter the light emitting structure layer 103.

In an exemplary embodiment, the organic light emitting layer may include an emitting layer (EML), and any one or more of following layers a hole injection layer (HIL), a hole transport layer (HTL), an electron block layer (EBL), a hole block layer (HBL), an electron transport layer (ETL), and an electron injection layer (EIL). In an exemplary embodiment, one or more of hole injection layer, hole transport layer, electron block layer, hole block layer, electron transport layer, and electron injection layer of all sub-pixels may be a common layer communicated together. Emitting layers of adjacent sub-pixels may be overlapped slightly, or may be mutually isolated.

Figure 5:
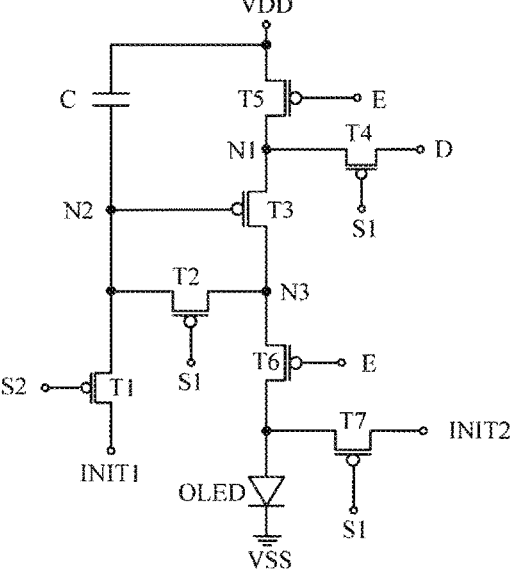
FIG. 5 is a schematic diagram of an equivalent circuit of a pixel drive circuit.

FIG. 5 is a schematic diagram of an equivalent circuit of a pixel drive circuit. In an exemplary embodiment, the pixel drive circuit may have a structure of 3T1C, 4T1C, 5T1C, 5T2C, 6T1C, 7T1C or 8T1C. FIG. 5 is a schematic diagram of an equivalent circuit of a pixel drive circuit. As shown in FIG. 5, the pixel drive circuit may include seven transistors (a first transistor T1 to a seventh transistor T7), one memory capacitor C, and the pixel drive circuit is respectively connected to eight signal lines (a data signal line D, a first scan signal line S1, a first scan signal line S2, a light emitting signal line E, a first initial signal line INIT1, a second initial signal line INIT2, a first power supply line VDD, and a second power supply line VSS).

In an exemplary embodiment, the pixel drive circuit may include a first node N1, a second node N2, and a third node N3. Herein, the first node N1 is respectively connected to a first electrode of the third transistor T3, a second electrode of the fourth transistor T4, and a second electrode of the fifth transistor T5. The second node N2 is respectively connected to a second electrode of the first transistor, a first electrode of the second transistor T2, a control electrode of the third transistor T3, and a second end of the storage capacitor C. The third node N3 is respectively connected to a second electrode of the second transistor T2, a second electrode of the third transistor T3, and a first electrode of the sixth transistor T6.

In an exemplary embodiment, a first end of the storage capacitor C is connected to the first power supply line VDD, and the second end of the storage capacitor C is connected to the second node N2, i.e., the second end of the storage capacitor C is connected to the control electrode of the third transistor T3.

A control electrode of the first transistor T1 is connected to the second scan signal line S2, a first electrode of the first transistor T1 is connected to the first initial signal line INIT1, and the second electrode of the first transistor is connected to the second node N2. When a scan signal with an on-level is applied to the second scan signal line S2, the first transistor T1 transmits a first initial voltage to the control electrode of the third transistor T3 so as to initialize a charge amount of the control electrode of the third transistor T3.

A control electrode of the second transistor T2 is connected to the first scan signal line S1, the first electrode of the second transistor T2 is connected to the second node N2, and the second electrode of the second transistor T2 is connected to the third node N3. When a scan signal with an on-level is applied to the first scan signal line S1, the second transistor T2 enables the control electrode of the third transistor T3 to be connected to the second electrode of the third transistor T3.

The control electrode of the third transistor T3 is connected to the second node N2, i.e., the control electrode of the third transistor T3 is connected to the second end of the storage capacitor C, the first electrode of the third transistor T3 is connected to the first node N1, and the second electrode of the third transistor T3 is connected to the third node N3. The third transistor T3 may be referred to as a drive transistor, and the third transistor T3 determines a magnitude of a drive current flowing between the first power supply line VDD and the second power supply line VSS according to a potential difference between the control electrode and the first electrode of the third transistor T3.

A control electrode of the fourth transistor T4 is connected to the first scan signal line S1, a first electrode of the fourth transistor T4 is connected to the data signal line D, and the second electrode of the fourth transistor T4 is connected to the first node N1. The fourth transistor T4 may be referred to as a switch transistor, a scan transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected to the light emitting signal line E, a first electrode of the fifth transistor T5 is connected to the first power supply line VDD, and the second electrode of the fifth transistor T5 is connected to the first node N1. A control electrode of the sixth transistor T6 is connected to the light emitting signal line E, the first electrode of the sixth transistor T6 is connected to the third node N3, and a second electrode of the sixth transistor T6 is connected to a first electrode of a light emitting device. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

A control electrode of the seventh transistor T7 is connected to the first scan signal line S1, a first electrode of the seventh transistor T7 is connected to the second initial signal line INIT2, and a second electrode of the seventh transistor T7 is connected to the first electrode of the light emitting device. When a scan signal with an on-level is applied to the first scan signal line S1, the seventh transistor T7 transmits a second initial voltage to the first electrode of the light emitting device so as to initialize a charge amount accumulated in the first electrode of the light emitting device or release a charge amount accumulated in the first electrode of the light emitting device.

In an exemplary embodiment, the light emitting device may be an OLED including a first electrode (anode), an organic light emitting layer, and a second electrode (cathode) which are stacked, or may be a QLED including a first electrode (anode), a quantum dot light emitting layer, and a second electrode (cathode) which are stacked.

In an exemplary embodiment, a second electrode of the light emitting device is connected to the second power supply line VSS, a signal of the second power supply line VSS is a low-level signal continuously provided, and a signal of the first power supply line VDD is a high-level signal continuously provided.

In an exemplary embodiment, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementations, the first transistor T1 to the seventh transistor T7 may include P-type transistors and N-type transistors.

In an exemplary embodiment, the first transistor T1 to the seventh transistor T7 may be low temperature polysilicon thin film transistors, or may be oxide thin film transistors, or may be low temperature poly-silicon thin film transistors and oxide thin film transistors. An active layer of a low temperature poly-silicon thin film transistor may be made of Low Temperature Poly-Silicon (LTPS for short), and an active layer of an oxide thin film transistor may be made of an oxide semiconductor (Oxide). The low temperature poly-silicon thin film transistor has advantages such as high migration rate and fast charging. The oxide thin film transistor has advantages such as low drain current. The low temperature poly-silicon thin film transistor and the oxide thin film transistor are integrated on one display substrate, i.e. LTPS+Oxide (LTPO for short) display substrate, so that advantages of the low temperature poly-silicon thin film transistor and the oxide thin film transistor can be utilized, low-frequency drive can be realized, power consumption can be reduced, and display quality can be improved.

In an exemplary embodiment, taking the first transistor T1 to the seventh transistor T7 all being P-type transistors as an example, an operating working process of a pixel drive circuit of may include the following.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, a first initial voltage of the first initial signal line INIT1 is provided to the second node N2 to initialize the storage capacitor C, thereby clearing an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, the signal of the first scan signal line S1 is a low-level signal, signals of the second scan signal line S2 and the light emitting signal line E are high-level signals, and the data signal line D outputs a data voltage. In this stage, a second end of the storage capacitor C is at a low level, so the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through a first node N1, the turned-on third transistor T3, a third node N3, and the turned-on second transistor T2, and the storage capacitor C is charged with a difference between the data voltage output by the data signal line D and a threshold voltage of the third transistor T3. A voltage at the second end (the second node N2) of the storage capacitor C is Vd−|Vth|, wherein Vd is the data voltage output by the data signal line D, and Vth is the threshold voltage of the third transistor T3. The seventh transistor T7 is turned on, so that a second initial voltage of the second initial signal line INIT2 is provided to a first electrode of the OLED to initialize (reset) the first electrode of the OLED and clear a pre-stored voltage therein, thereby completing initialization and ensuring that the OLED does not emit light. The signal of the second scan signal line S2 is a high-level signal, so that the first transistor T1 is turned off. The signal of the light emitting signal line E is a high-level signal, so that the fifth transistor T5 and the sixth transistor T6 are turned off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is the low-level signal, so that the fifth transistor T5 and the sixth transistor T6 are turned on, and a power voltage output by the first power supply line VDD provides a drive voltage to the first electrode of the OLED through the turned-on fifth transistor T5, third transistor T3, and sixth transistor T6 to drive the OLED to emit light.

In a driving process of the pixel drive circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows.

$$I=K*(Vgs-Vth)^2=K*[(Vdd-Vd+|Vth|)-Vth]^2=K*[(Vdd-Vd]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With the development of OLED display technologies, consumers have increasingly higher requirements for display effects of display products. Super-narrow bezels have become a new trend in the development of display products. Therefore, bezel narrowing or even-numbered a bezel-less design has received more attention in the design of OLED display products. In a display substrate, the bonding area generally includes a fan-out region, a bending region, a drive chip region and a bonding pin region which are arranged sequentially along the direction away from the display area. Since a width of the bonding area is smaller than a width of the display area, signal lines of integrated circuits and bonding pads in the bonding area need to be lead into the wider display area through the fan-out region in a fan-out manner, and the greater a width difference between the display area and the bonding area, the more oblique fan-out lines in the fan region, the longer a distance between the drive chip region and the display area, so the fan region occupies a large space, which makes it difficult for design of a narrow lower bezel, and the lower bezel is always maintained at about 2.0 mm. In another display substrate, a bezel area is usually provided with a bezel power supply lead, which is configured to transmit a low-voltage power supply signal. In order to reduce a voltage drop of the low-voltage power supply signal, a width of the bezel power supply lead is large, resulting in larger widths of the left and right bezels of the display device.

An exemplary embodiment of the present disclosure provides a display substrate, comprising a display area and a bonding area located on a side of the display area. The display area includes a plurality of circuit units constituting a plurality of unit rows and a plurality of unit columns, and a plurality of data signal lines and a plurality of data connection lines extending along a second direction. The data connection lines include a first connection line extending along a first direction and a second connection line extending along the second direction, the first connection line is connected to the second connection line, and the first direction intersects with the second direction. In at least one circuit unit, the first connection line is connected to a data signal line through a first connection hole, and at least one data signal line is provided between two adjacent first connection holes in the first direction.

In the present disclosure, "A extends in a B direction" means that A may include a main portion, which is a line, a line segment or a strip-shaped body, and a secondary portion connected to the main portion. The main portion extends in the B direction, and a length of the main portion extending in the B direction is greater than a length of the secondary portion extending in another direction. In the following description, "A extends in a B direction" means "the main body portion of A extends in the B direction". In an exemplary implementation, the second direction Y may be a direction towards the bonding area from the display area, and an opposite direction of the second direction Y may be a direction towards the display area from the bonding area.

Figure 6:
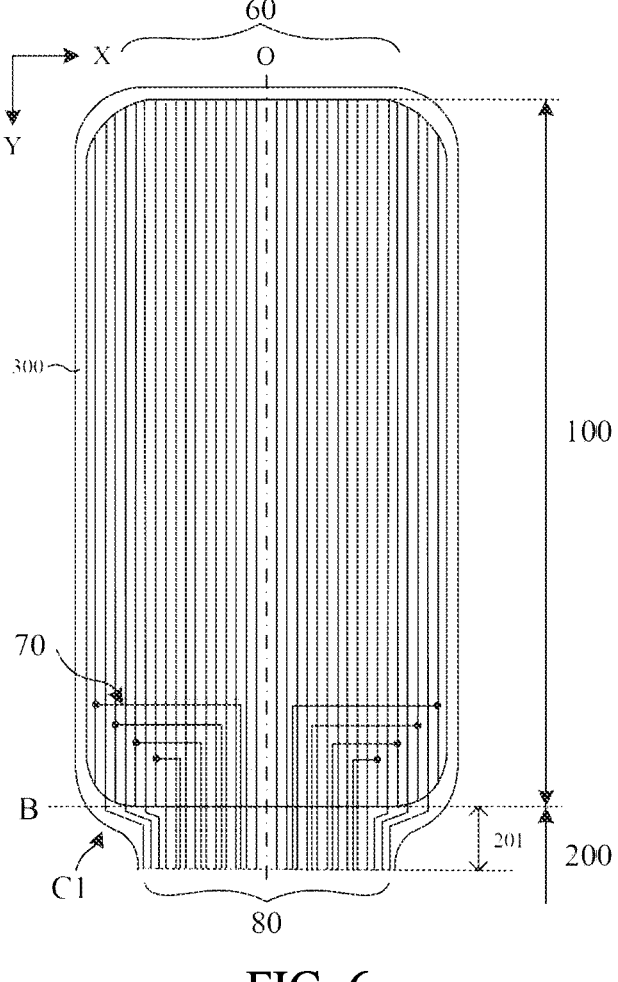
FIG. 6 is a schematic diagram of a planar structure of a display substrate according to an exemplary embodiment of the present disclosure.

FIG. 6 is a schematic diagram of a planar structure of a display substrate according to an exemplary embodiment of the present disclosure. In a plane perpendicular to the display substrate, the display substrate may include a drive circuit layer arranged on the base substrate, a light emitting structure layer arranged on a side of the drive circuit layer away from the base substrate, and an encapsulation structure layer arranged on a side of the light emitting structure layer away from the base substrate. As shown in FIG. 6, in a plane parallel to the display substrate, the display substrate may at least include a display area 100, a bonding area 200 on a side of the display area 100 in the second direction Y, and a bezel area 300 on other sides of the display area 100. In an exemplary embodiment, the drive circuit layer of the display area 100 may include a plurality of circuit units constituting a plurality of unit rows and a plurality of unit columns, a plurality of data signal lines 60, and a plurality of data connection lines 70. At least one circuit unit may include a pixel drive circuit configured to output a corresponding current to a light emitting device connected thereto. The light emitting structure layer of the display area 100 may include a plurality of sub-pixels constituting a pixel array. At least one sub-pixel may include a light emitting device, the light emitting device is connected to a pixel drive circuit of a corresponding circuit unit, and is configured to emit light of a corresponding brightness in response to a current output by the pixel drive circuit connected to the light emitting device.

In an exemplary embodiment, at least one data signal line 60 is connected to a plurality of pixel drive circuits in a unit column, the at least one data signal line 60 is configured to provide a data signal to the pixel drive circuits connected thereto. At least one data connection line 70 is connected correspondingly to a data signal line 60, and the at least one data connection line 70 is configured to correspondingly connect the data signal line 60 to a lead-out line 80 in the bonding area 200 through the at least one data connection line 70.

In an exemplary embodiment, the sub-pixels mentioned in the present disclosure refer to regions divided according to light emitting devices, and the circuit units mentioned in the present disclosure refer to regions divided according to pixel drive circuits. In an exemplary embodiment, a position of an orthographic projection of a sub-pixel on the base substrate may correspond to a position of an orthographic projection of a circuit unit on the base substrate, or the position of the orthographic projection of the sub-pixel on the base substrate may not correspond to the position of the orthographic projection of the circuit unit on the base substrate.

In an exemplary embodiment, a plurality of circuit units arranged sequentially along the first direction X may be referred to as a unit row, and a plurality of circuit units arranged sequentially along the second direction Y may be referred to as a unit column. The plurality of unit rows and the plurality of unit columns form an array of circuit units, and the first direction X intersects with the second direction Y.

In an exemplary embodiment, the second direction Y may be an extension direction of the data signal lines (vertical direction), and the first direction X may be perpendicular to the second direction Y (horizontal direction).

In an exemplary embodiment, the bonding area 200 may include a lead region 201, a bending region, a drive chip region, and a bonding pin region which are arranged sequentially along a direction away from the display area. The lead region 201 is connected to the display area 100, and the bending region 202 is connected to the lead region 201. A plurality of lead-out lines 80 may be arranged in the lead region 201, the plurality of lead-out lines 80 extend along the direction away from the display area, first ends of part of the lead-out lines 80 are connected correspondingly to the data connection lines 70 in the display area 100, first ends of the other part of the lead-out lines are connected correspondingly to the data signal lines 60 in the display area 100, and the second ends of all the lead-out lines 80 are connected to the integrated circuits of the composite circuit region across the bending region, so that the integrated circuits apply data signals to the data signal lines through the lead-out lines and the data connection lines. Since the data connection lines are arranged in the display area, a length of the lead region in the second direction Y may be effectively reduced, a width of the lower bezel is greatly reduced, and a screen-to-body ratio is increased, which is conducive to achieving a full-screen display.

In an exemplary embodiment, a plurality of data signal lines of the display area 100 may extend along the second direction Y and are arranged sequentially in a set interval along the first direction X in an order of increasing numbers. The plurality of data signal lines may be divided into a first data signal line group and a second data signal line group according to whether or not they are connected to the data connection lines. The plurality of data signal lines in the first data signal line group are connected correspondingly to the data connection lines, and the plurality of data signal lines in the second data signal line group are not connected to the data connection lines. A plurality of lead-out lines in the lead region 201 may be divided into a first lead-out line group and a second lead-out line group according to whether they are connected to data connection lines or they are connected to data signal lines, wherein the plurality of lead-out lines in the first lead-out line group are correspondingly connected to the data connection lines, and the plurality of lead-out lines in the second lead-out line group are correspondingly connected to the data signal line.

In an exemplary embodiment, first ends of a plurality of data connection lines 70 arranged in the display area 100 are connected to the plurality of data signal lines 60 of the first data signal line group through first connection holes, and second ends of a plurality of data connection lines 70 extend towards the bonding area 200 and cross a boundary B of the display area to be connected correspondingly to a plurality of lead-out lines 80 of the first lead-out line group in the lead-out line region 201, so that the plurality of data signal lines 60 of the first data signal line group in the display area 100 are indirectly connected to the lead-out lines 80 through the data connection lines 70. The plurality of data signal lines 60 of the second data signal line group extend towards the bonding area 200 and cross the boundary B of the display area to be connected correspondingly to a plurality of lead-out lines 80 of the second lead-out line group in the lead region 201, so that the plurality of data signal lines 60 of the second data signal line group in the display area 100 are directly connected to the lead-out lines 80. In an exemplary embodiment, the boundary B of the display area is a junction between the display area 100 and the bonding area 200.

In an exemplary embodiment, the lead-out lines 80 and the data signal lines 60 may be directly connected or may be connected through via holes, the lead-out lines 80 and the data connection lines 70 may be directly connected or may be connected through via holes, which is not limited here in the present disclosure.

In an exemplary embodiment, a data connection line 70 may include a first connection line and a second connection line which are connected to each other. A first end of the first connection line is connected to a data signal line through a first connection hole, a second end of the first connection line is connected to a first end of the second connection line after extending along the first direction X or an opposite direction of the first direction X, and a second end of the second connection line is connected to a lead-out line after extending along the second direction Y towards the lead region.

In an exemplary embodiment, at least one data signal line may be arranged between two first connection holes adjacent in the first direction X.

In an exemplary embodiment, at least one second connection line may be arranged between adjacent data signal lines, or at least one second connection hole may be provided between adjacent data signal lines.

In an exemplary embodiment, n data signal lines may be provided between second connection lines adjacent in the first direction X (between adjacent second connection holes in the first direction X), wherein n may be a positive integer greater than or equal to 1. In an exemplary embodiment, n may be 1, 2, 3, 4, 5 or 6. For example, when n=1, one data signal line may be provided between adjacent second connection lines. For another example, when n=2, two data signal lines may be provided between adjacent second connection lines. For another example, when n=3, three data signal lines may be provided between adjacent second connection lines.

In an exemplary embodiment, a plurality of second connection lines may be arranged parallel to the data signal lines, and a plurality of first connection lines may be arranged perpendicular to the data signal lines.

In an exemplary embodiment, a spacing between adjacent second connection lines may be substantially the same and a spacing between adjacent first connection lines may be substantially the same, which is not limited here in the present disclosure.

In an exemplary embodiment, the display area 100 may have a center line O, and the plurality of data signal lines 60, the plurality of data connection lines 70 and the plurality of lead-out lines 80 in the lead region 201 in the display area 100 may be symmetrically arranged with respect to the center line O. The center line O may be a straight line bisecting a plurality of unit columns of the display area 100 and extending along the second direction Y.

NA data signal lines, NB data connection lines, and NA lead-out lines being included in left side of the display area 100 is taken as an example for description below, where NA is a positive integer greater than or equal to 2, and NB is a positive integer greater than or equal to 2 and less than or equal to NA.

In an exemplary embodiment, a first connection hole is provided in a circuit unit of an odd-numbered unit column, that is, the first data signal line group may include NB odd-numbered data signal lines, and the second data signal line group may include data signal lines other than the first data signal line group. For example, the first data signal line group may include a first data signal line, a third data signal line, . . . , a (2NB−1)-th data signal line, and the second data signal line group may include a second data signal line, a fourth data signal line, . . . , a (2NB)-th data signal line to an (NA)-th data signal line. In the present disclosure, the odd-numbered data signal lines refer to data signal lines arranged in the odd-numbered unit columns, and even-numbered data signal lines refer to data signal lines arranged in the even-numbered unit columns.

In an exemplary embodiment, m data signal lines may be provided between two first connection holes adjacent in the first direction X, where m is an odd number greater than or equal to 1. For example, when the first data signal line group includes a first data signal line, a third data signal line, . . . , and a (2NB−1)-th data signal line, one data signal line of the second data signal line group is provided between two adjacent data signal lines in the first data signal line group (between two adjacent first connection holes). For another example, when the first data signal line group includes a first data signal line, a fifth data signal line, . . . , and a (4NB−3)-th data signal line, three data signal lines of the second data signal line group are provided between two adjacent data signal lines in the first data signal line group (between two adjacent first connection holes).

In another exemplary embodiment, the first connection holes are provided in circuit units of the even-numbered unit columns, that is, the first data signal line group may include NB even-numbered data signal lines, and the second data signal line group may include data signal lines other than the first data signal line group. For example, the first data signal line group may include a second data signal line, a fourth data signal line, . . . , a 2NB data signal line, and the second data signal line group may include a first data signal line, a third data signal line, . . . , a (2NB−1)-th data signal line, a (2NB+1)-th data signal line to an (NA)-th data signal line.

In an exemplary embodiment, m data signal lines may be provided between two first connection holes adjacent in the first direction X, where m is an odd number greater than or equal to 1. For example, when the first data signal line group includes a second data signal line, a fourth data signal line, . . . , and a (2M)-th data signal line, one data signal line of the second data signal line group is provided between two adjacent data signal lines in the first data signal line group (between two adjacent first connection holes). For another example, when the first data signal line group includes a second data signal line, a sixth data signal line, . . . , and a (4NB–2)-th data signal line, three data signal lines of the second data signal line group are provided between two adjacent data signal lines in the first data signal line group (between two adjacent first connection holes).

In another exemplary embodiment, the first connection holes may be provided in the circuit units of the odd-numbered unit columns and the circuit units of the even-numbered unit columns, respectively. One first connection hole may be provided in a circuit unit of an odd-numbered unit column, and another first connection hole adjacent to the first connection hole in the first direction X may be provided in a circuit unit of an even-numbered unit column. Or, one first connection hole may be provided in a circuit unit of an even-numbered unit column, and another first connection hole adjacent to the first connection hole in the first direction X may be arranged in a circuit unit of an odd-numbered unit column. Two data signal lines may be provided between two first connection holes adjacent in the first direction X. For example, the first data signal line group may include a first data signal line, a fourth data signal line, a seventh data signal line, . . . , a (3NB–2)-th data signal line, and a second data signal line and a third data signal line are provided between the first data signal line and the fourth data signal line.

In an exemplary embodiment, among the NB lead-out lines on the left side of the lead region, the plurality of lead-out lines of the first lead-out line group may be arranged sequentially along the opposite direction of the first direction X in an order of increasing numbers (reverse-sequence design), and the plurality of lead-out lines of the second lead-out line group are arranged sequentially along the first direction X in an order of increasing numbers (positive-sequence design). Among the NB lead-out lines on the right side of the lead region, the plurality of lead-out lines of the first lead-out line group may be arranged sequentially along the first direction X in an order of increasing numbers, and the plurality of lead-out lines of the second lead-out line group are arranged sequentially along the opposite direction of the first direction X in an order of increasing numbers.

In an exemplary embodiment, n lead-out lines of the second lead-out line group are provided between two adjacent lead-out lines in the first lead-out line group, where n may be 1, 2, 3, 4, 5 or 6. For example, when n=1, one lead-out line of the second lead-out line group may be provided between adjacent lead-out lines in the first lead-out line group. For another example, when n=2, one lead-out line of the second lead-out line group may be provided between adjacent lead-out lines in the first lead-out line group.

In an exemplary embodiment, the first lead-out line group may include NB odd-numbered lead-out lines. The NB odd-numbered lead-out lines are connected to NB odd-numbered data signal lines of the first data signal line group through NB data connection lines. The second lead-out line group may include other lead-out lines other than the first lead-out line group, which are connected to a plurality of data signal lines of the second data signal line group.

In another exemplary embodiment, the first lead-out line group may include NB even-numbered lead-out lines. The NB even-numbered lead-out lines are connected to NB even-numbered data signal lines of the first data signal line group through NB data connection lines. The second lead-out line group may include other lead-out lines other than the first lead-out line group, which are connected to a plurality of data signal lines of the second data signal line group.

In another exemplary embodiment, the first lead-out line group may include an odd-numbered lead-out line and an even-numbered lead-out line. One lead-out line may be an odd-numbered lead-out line, and another lead-out line adjacent to the lead-out line in the first direction X may be an even-numbered lead-out line. The plurality of lead-out lines of the first lead-out line group are connected to a plurality of data signal lines of the first data signal line group through a plurality of data connection lines, and the plurality of lead-out lines of the second lead-out line group are connected to a plurality of data signal lines of the second data signal line group.

In an exemplary embodiment, a part of the lead-out lines in the second lead-out line group may be straight lines parallel to the data signal lines, and another part of the lead-out lines may be polygonal lines.

Figure 7A:
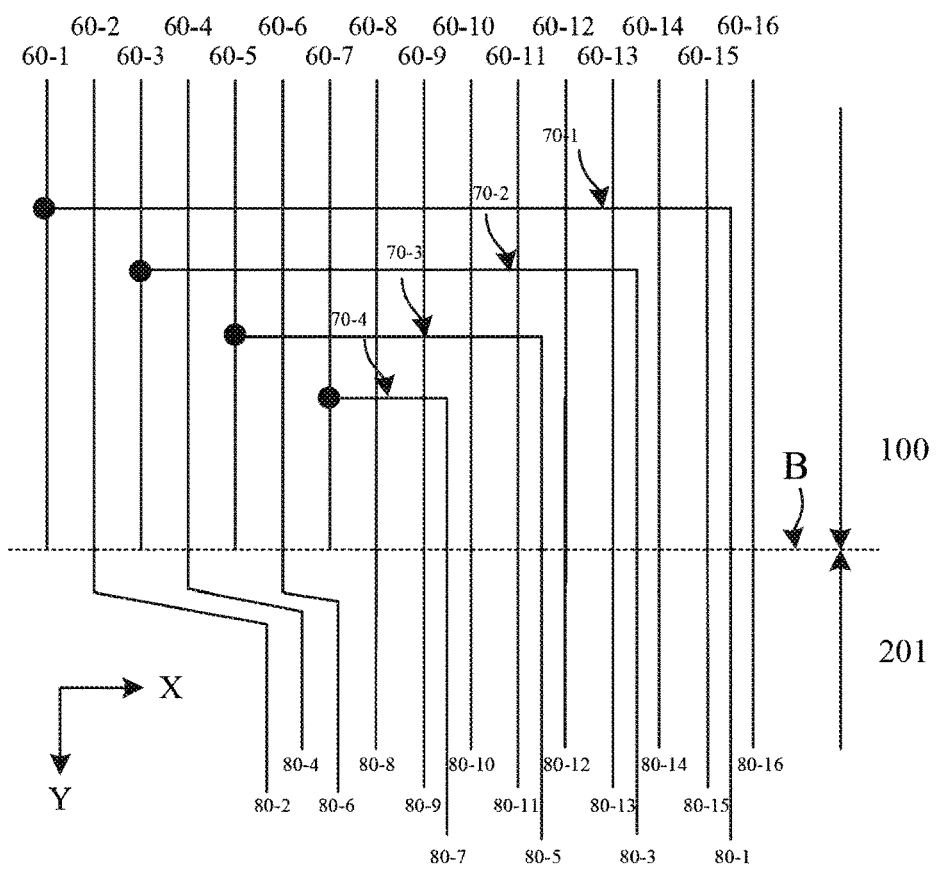

FIG. 7a is a schematic diagram of an arrangement of data connection lines according to an exemplary embodiment of the present disclosure, which is an enlarged view of C1 region in FIG. 6, illustrating a structure of 16 data signal lines, 4 data connection lines, and 16 lead-out lines. As shown in FIG. 7a, in an exemplary embodiment, the plurality of data signal lines of the display area may include a first data signal line 60-1 to a sixteenth data signal line 60-16, the plurality of data connection line of the display area may include a first data connection line 70-1 to a fourth data connection line 70-4, and the plurality of lead-out lines of the lead region 201 may include a first lead-out line 80-1 to a sixteenth lead-out line 80-16.

In an exemplary embodiment, the first data signal line group includes four odd-numbered data signal lines (a first data signal line 60-1, a third data signal line 60-3, a fifth data signal line 60-5 and a seventh data signal line 60-7), the second data signal line group includes the remaining 12 data signal lines, and the first data signal line 60-1 to the sixteenth data signal line 60-16 may be arranged sequentially along the first direction X.

In an exemplary embodiment, the first lead-out line group includes four odd-numbered lead-out lines (a first lead-out line 80-1, a third lead-out line 80-3, a fifth lead-out line 80-5 and a seventh lead-out line 80-7), the second lead-out line group includes the remaining 12 lead-out lines, the plurality of lead-out lines of the first lead-out line group may be arranged sequentially along the opposite direction of the first direction X, the plurality of lead-out lines of the second lead-out line group may be arranged sequentially along the first direction X, and two lead-out lines of the second lead-out line group are provided between adjacent lead-out lines in the first lead-out line group. For example, the plurality of lead-out lines may include a second lead-out line 80-2, a fourth lead-out line 80-4, a sixth lead-out line 80-6, an eighth lead-out line 80-8, a ninth lead-out line 80-9, a seventh lead-out line 80-7, a tenth lead-out line 80-10, an eleventh lead-out line 80-11, a fifth lead-out line 80-5, a twelfth lead-out line 80-12, a thirteenth lead-out line 80-13, a third lead-out line 80-3, a fourteenth lead-out line 80-14, a fifteenth lead-out line 80-15, a first lead-out line 80-1 and a sixteenth lead-out line 80-16 which are arranged sequentially along the first direction X.

In an exemplary embodiment, the fourteenth lead-out line 80-14 and the fifteenth lead-out line 80-15 may be provided between the first lead-out line 80-1 and the third lead-out line 80-3, the twelfth lead-out lines 80-12 and the thirteenth lead-out line 80-13 may be provided between the third lead-out line 80-3 and the fifth lead-out line 80-5, and the tenth lead-out line 80-10 and the eleventh lead-out line 80-11 may be provided between the fifth lead-out line 80-5 and the seventh lead-out line 80-7.

In an exemplary embodiment, first connection holes are provided in circuit units of the odd-numbered unit columns. A first end of the first data connection line 70-1 in the display area 100 is connected to the first data signal line 60-1 through a first connection hole, and a second end of the first data connection line 70-1 is connected to the first lead-out line 80-1 after extending to the lead region 201. A first end of the second data connection line 70-2 in the display area 100 is connected to the third data signal line 60-3 through a first connection hole, and a second end of the second data connection line 70-2 is connected to the third lead-out line 80-3 after extending to the lead region 201. A first end of the third data connection line 70-3 in the display area 100 is connected to the fifth data signal line 60-5 through a first connection hole, and a second end of the third data connection line 70-3 is connected to the fifth lead-out line 80-5 after extending to the lead region 201. A first end of the fourth data connection line 70-4 in the display area 100 is connected to the seventh data signal line 60-7 through a first connection hole, and a second end of the fourth data connection line 70-4 is connected to the seventh lead-out line 80-7 after extending to the lead region 201.

In an exemplary embodiment, the plurality of data signal lines of the second data signal line group are connected correspondingly to the plurality of lead-out lines of the second lead-out line group after extending to the lead region 201. For example, the second data signal line 60-2, the fourth data signal line 60-4, the sixth data signal line 60-6, and the eighth data signal line 60-8 to the sixteenth data signal line 60-16 are connected correspondingly to the corresponding lead-out lines.

In an exemplary embodiment, distances between an edge B of the display area and a plurality of first connection holes through which the data connection lines and the data signal lines are correspondingly connected may be different. For example, a distance between the edge B of the display area and the first connection hole through which the first data connection line 70-1 is connected to the first data signal line 60-1 may be greater than a distance between the edge B of the display area and the first connection hole through which the second data connection line 70-2 is connected to the third data signal line 60-3. For another example, a distance between the edge B of the display area and the first connection hole through which the second data connection line 70-2 is connected to the third data signal line 60-3 may be greater than a distance between the edge B of the display area and the first connection hole through which the third data connection line 70-3 is connected to the fifth data signal line 60-5. For another example, a distance between the edge B of the display area and the first connection hole through which the third data connection line 70-3 is connected to the fifth data signal line 60-5 may be greater than a distance between the edge B of the display area and the first connection hole through which the fourth data connection line 70-4 is connected to the seventh data signal line 60-7.

In an exemplary embodiment, a data connection line may include a first connection line and a second connection line connected sequentially. A shape of the first connection line may be a straight line shape extending along the first direction X, and a shape of the second connection line may be a straight line shape extending along the second direction Y. A first end of the first connection line is connected to a data signal line through a first connection hole, a second end of the first connection line is connected to a first end of the second connection line after extending along the first direction X or the opposite direction of the first direction X, and a second end of the second connection line is connected to a lead-out line after extending along the second direction Y towards the lead region.

In an exemplary embodiment, two data signal lines may be provided between adjacent second connection lines in the first direction X to form a structure in which the data connection lines are connected to the data signal lines of the odd-numbered unit columns, and two data signal lines are provided between adjacent second connection lines. For example, a fourteenth data signal line 60-14 and a fifteenth data signal line 60-15 may be provided between a second connection line of the first data connection line 70-1 and a second connection line of the second data connection line 70-2. For another example, a twelfth data signal line 60-12 and a thirteenth data signal line 60-13 may be provided between the second connection line of the second data connection line 70-2 and a second connection line of the third data connection line 70-3. For another example, a tenth data signal line 60-10 and an eleventh data signal line 60-11 may be provided between the second connection line of the third data connection line 70-3 and a second connection line of the fourth data connection line 70-4.

In an exemplary embodiment, a part of the lead-out lines in the second lead-out line group are straight lines parallel to the data signal lines, and the other part of the lead-out lines are polygonal lines. For example, shapes of the tenth lead-out line 80-10 to the sixteenth lead-out line 80-16 may be straight lines, and shapes of the second lead-out line 80-2, the fourth lead-out line 80-4, and the sixth lead-out line 80-6 may be polygon lines.

In an exemplary embodiment, positions of the plurality of sub-pixels in the light emitting structure layer may be corresponding to positions of the plurality of circuit units in the drive structure layer, an odd-numbered unit columns may be referred to as a first unit column, a plurality of circuit units of the odd-numbered unit column correspond to a plurality of red sub-pixels and blue sub-pixels, that is, pixel drive circuits of the plurality of circuit units in the odd-numbered unit column are respectively connected to red light emitting devices emitting red light and blue light emitting devices emitting blue light. An even-numbered unit column may be referred to as a second unit column, and a plurality of circuit units of the even-numbered unit column correspond to a plurality of green sub-pixels, that is, pixel drive circuits of the plurality of circuit units in the even-numbered unit column are connected to green light emitting devices emitting green light.

In an exemplary embodiment, the first connection lines are connected to the data signal lines of the first unit columns through the first connection holes, and the first connection lines are not connected to the data signal lines of the second unit columns. In the present disclosure, the first connection holes are provided in the odd-numbered unit columns, that is, data signals of the red sub-pixels and the blue sub-pixels are transmitted by data connection lines, which not only facilitates the layout of the data connection lines, but also may achieve load without sudden change by using the reverse-sequence design, thus improving the display quality.

Figure 7B:
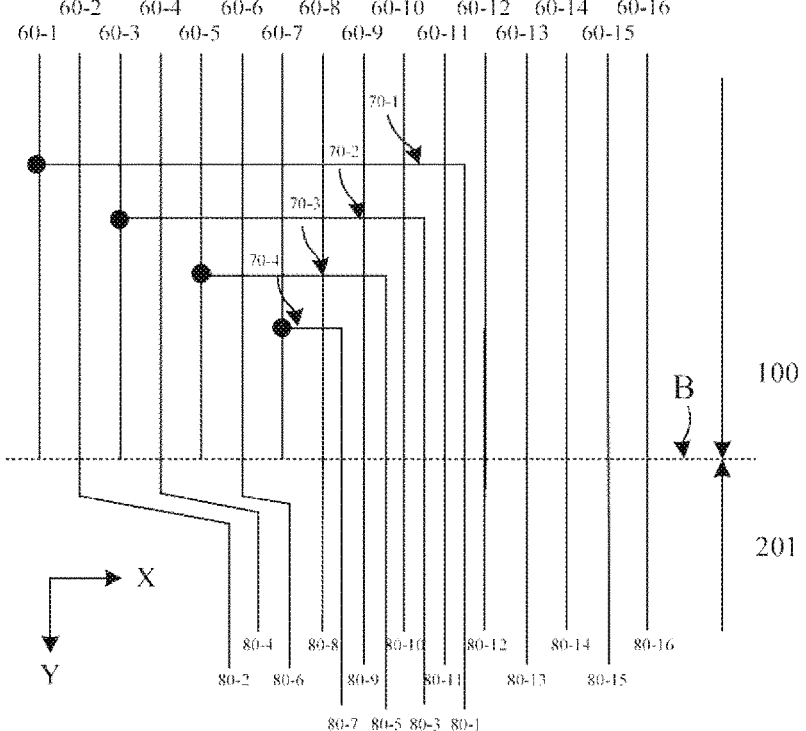

FIG. 7b is a schematic diagram of another arrangement of data connection lines according to an exemplary embodiment of the present disclosure, which is an enlarged view of C1 region in FIG. 6, illustrating a structure of 16 data signal lines, 4 data connection lines, and 16 lead-out lines. As shown in FIG. 7b, in the exemplary embodiment, a structure is shown in which the data connection lines are connected to data signal lines of odd-numbered unit columns and one data signal line is provided between adjacent second connection lines.

In an exemplary embodiment, the first data signal line group includes four odd-numbered data signal lines, which are correspondingly connected to first ends of the four data connection lines, the first lead-out line group includes four odd-numbered lead-out lines, which are correspondingly connected to second ends of the four data connection lines, the twelve data signal lines of the second data signal line group are connected correspondingly to twelve lead-out lines of the second lead-out line group, and the connection structure thereof is substantially the same as that shown in FIG. 7a. The difference is that one lead-out line of the second lead-out line group is arranged between adjacent leads in the first lead-out line group, and one data signal line is arranged between adjacent second connection lines.

In an exemplary embodiment, the plurality of lead-out lines may include a second lead-out line 80-2, a fourth lead-out line 80-4, a sixth lead-out line 80-6, an eighth lead-out line 80-8, a seventh lead-out line 80-7, a ninth lead-out line 80-9, a fifth lead-out line 80-5, a tenth lead-out line 80-10, a third lead-out line 80-3, an eleventh lead-out line 80-11, a first lead-out line 80-1, a twelfth lead-out line 80-12, a thirteenth lead-out line 80-13, a fourteenth lead-out line 80-14, a fifteenth lead-out line 80-15 and a sixteenth lead-out line 80-16 sequentially arranged along the first direction X.

In an exemplary embodiment, the eleventh lead-out line 80-11 may be provided between the first lead-out line 80-1 and the third lead-out line 80-3, the tenth lead-out line 80-10 may be provided between the third lead-out line 80-3 and the fifth lead-out line 80-5, and the ninth lead-out line 80-9 may be provided between the fifth lead-out line 80-5 and the seventh lead-out line 80-7.

In an exemplary embodiment, one data signal line may be provided between second connection lines adjacent in the first direction X. For example, an eleventh data signal line 60-11 may be provided between a second connection line of the first data connection line 70-1 and a second connection line of the second data connection line 70-2. For another example, a tenth data signal line 60-10 may be provided between the second connection line of the second data connection line 70-2 and a second connection line of the third data connection line 70-3. For another example, a ninth data signal line 60-9 may be provided between the second connection line of the third data connection line 70-3 and a second connection line of the fourth data connection line 70-4.

This exemplary embodiment may not only facilitate the layout of the data connection lines and achieve load without sudden change, but also further compress space occupied by the data connection lines and minimize the load difference of the data signals by the structure in which one data signal line is arranged between adjacent second connection lines.

Figure 7C:
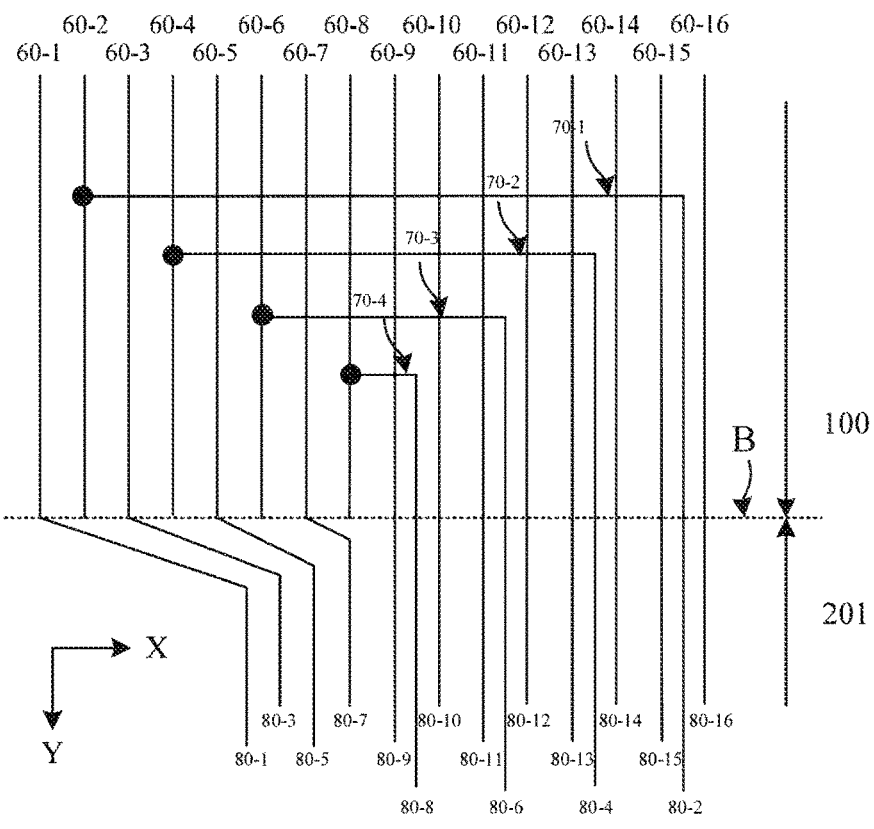

FIG. 7c is a schematic diagram of another arrangement of data connection lines according to an exemplary embodiment of the present disclosure, which is an enlarged view of C1 region in FIG. 6, illustrating a structure of 16 data signal lines, 4 data connection lines, and 16 lead-out lines. As shown in FIG. 7c, in the exemplary embodiment, a structure is shown in which the data connection lines are connected to data signal lines of even-numbered unit columns and two data signal lines are provided between adjacent second connection lines.

In an exemplary embodiment, the first data signal line group includes four even-numbered data signal lines (a second data signal line 60-2, a fourth data signal line 60-4, a sixth data signal line 60-6 and an eighth data signal line 60-8), the second data signal line group includes the remaining 12 data signal lines, and the first data signal line 60-1 to the sixteenth data signal line 60-16 may be arranged sequentially along the first direction X.

In an exemplary embodiment, the first lead-out line group includes four even-numbered lead-out lines (a second lead-out line 80-2, a fourth lead-out line 80-4, a sixth lead-out line 80-6 and an eighth lead-out line 80-8), the second lead-out line group includes the remaining 12 lead-out lines, a plurality of lead-out lines of the first lead-out line group may be arranged sequentially along the opposite direction of the first direction X, a plurality of lead-out lines of the second lead-out line group may be arranged sequentially along the first direction X, and two lead-out lines of the second lead-out line group are provided between adjacent lead-out lines in the first lead-out line group. For example, the plurality of lead-out lines may include a first lead-out line 80-1, a third lead-out line 80-3, a fifth lead-out line 80-5, a seventh lead-out line 80-7, a ninth lead-out line 80-9, an eighth lead-out line 80-8, a tenth lead-out line 80-10, an eleventh lead-out line 80-11, a sixth lead-out line 80-6, a twelfth lead-out line 80-12, a thirteenth lead-out line 80-13, a fourth lead-out line 80-4, a fourteenth lead-out line 80-14, a fifteenth lead-out line 80-15, a second lead-out line 80-2 and a sixteenth lead-out line 80-16.

In an exemplary embodiment, a fourteenth lead-out line 80-14 and a fifteenth lead-out line 80-15 may be provided between the second lead-out line 80-2 and the fourth lead-out line 80-4, a twelfth lead-out lines 80-12 and a thirteenth lead-out line 80-13 may be provided between the fourth lead-out line 80-4 and the sixth lead-out line 80-6, and a tenth lead-out line 80-10 and an eleventh lead-out line 80-11 may be provided between the sixth lead-out line 80-6 and the eighth lead-out line 80-8.

In an exemplary embodiment, the first connection holes are provided in circuit units of even-numbered unit columns. A first end of a first data connection line 70-1 in the display area 100 is connected to the second data signal line 60-2 through a first connection hole, and a second end of a first data connection line 70-1 is connected to the second lead-out line 80-2 after extending to the lead region 201. A first end of the second data connection line 70-2 in the display area 100 is connected to the fourth data signal line 60-4 through a first connection hole, and a second end of the second data connection line 70-2 is connected to the fourth lead-out line 80-4 after extending to the lead region 201. A first end of the third data connection line 70-3 in the display area 100 is connected to the sixth data signal line 60-6 through a first connection hole, and a second end of the third data connection line 70-3 is connected to the sixth lead-out line 80-6 after extending to the lead region 201. A first end of the fourth data connection line 70-4 in the display area 100 is connected to the eighth data signal line 60-8 through a first connection hole, and a second end of the fourth data connection line 70-4 is connected to the eighth lead-out line 80-8 after extending to the lead region 201.

In an exemplary embodiment, the plurality of data signal lines of the second data signal line group are connected correspondingly to the plurality of lead-out lines of the second lead-out line group after extending to the lead region 201. For example, the first data signal line 60-1, the third data signal line 60-3, the fifth data signal line 60-5, the seventh data signal line 60-7, the ninth data signal line 60-9 to the sixteenth data signal line 60-16 are correspondingly connected to the corresponding lead-out lines.

In an exemplary embodiment, two data signal lines may be provided between adjacent second connection lines in the first direction X to form a structure in which the data connection lines are connected to the data signal lines of the even-numbered unit columns, and two data signal lines are provided between adjacent second connection lines. For example, a fourteenth data signal line 60-14 and a fifteenth data signal line 60-15 may be provided between a second connection line of the first data connection line 70-1 and a second connection line of the second data connection line 70-2. For another example, a twelfth data signal line 60-12 and a thirteenth data signal line 60-13 may be provided between the second connection line of the second data connection line 70-2 and a second connection line of the third data connection line 70-3. For another example, a tenth data signal line 60-10 and an eleventh data signal line 60-11 may be provided between the second connection line of the third data connection line 70-3 and a second connection line of the fourth data connection line 70-4.

In an exemplary embodiment, a part of the lead-out lines in the second lead-out line group are straight lines parallel to the data signal lines, and the other part of the lead-out lines are polygonal lines. For example, shapes of the ninth lead-out line 80-9 to the sixteenth lead-out line 80-16 may be straight lines, and shapes of the first data signal line 60-1, the third data signal line 60-3, the fifth data signal line 60-5 and the seventh data signal line 60-7 may be polygonal lines.

In an exemplary embodiment, positions of the plurality of sub-pixels in the light emitting structure layer may correspond to positions of the plurality of circuit units in the drive structure layer, a plurality of circuit units in the odd-numbered unit columns correspond to a plurality of red sub-pixels and blue sub-pixels, and a plurality of circuit units in the even-numbered unit columns correspond to a plurality of green sub-pixels. In the present disclosure, the data connection lines are arranged in the even-numbered unit columns, that is, data signals of the green sub-pixels are transmitted by the data connection lines, which not only facilitates the layout of the data connection lines, but also may achieve load without sudden change by using the reverse-sequence design, thus improving the display quality.

Figure 7D:
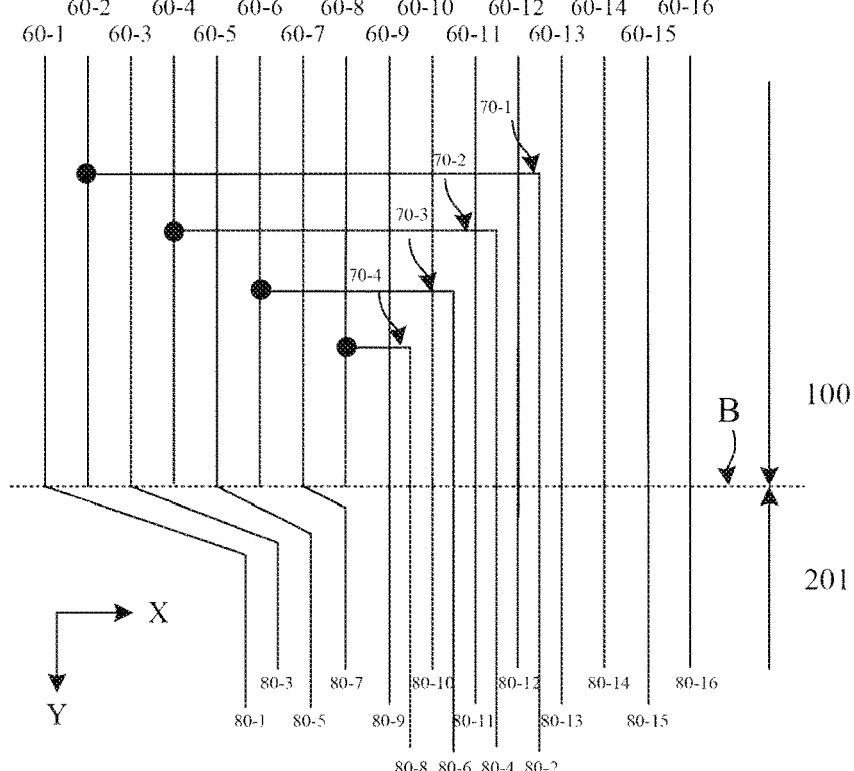

FIG. 7d is a schematic diagram of another arrangement of data connection lines according to an exemplary embodiment of the present disclosure, which is an enlarged view of C1 region in FIG. 6, illustrating a structure of 16 data signal lines, 4 data connection lines, and 16 lead-out lines. As shown in FIG. 7d, in the exemplary embodiment, a structure is shown in which the data connection lines are connected to data signal lines of even-numbered unit columns and one data signal line is provided between adjacent second connection lines.

In an exemplary embodiment, the first data signal line group includes four even-numbered data signal lines, which are correspondingly connected to first ends of the four data connection lines, the first lead-out line group includes four even-numbered lead-out lines, which are correspondingly connected to second ends of the four data connection lines, the twelve data signal lines of the second data signal line group are connected correspondingly to twelve lead-out lines of the second lead-out line group, and the connection structure thereof is substantially the same as that shown in FIG. 7c. The difference is that one lead-out line of the second lead-out line group is arranged between adjacent leads in the first lead-out line group, and one data signal line is arranged between adjacent second connection lines.

In an exemplary embodiment, the plurality of lead-out lines may include a first lead-out lines 80-1, a third lead-out line 80-3, a fifth lead-out line 80-5, a seventh lead-out line 80-7, a ninth lead-out line 80-9, an eighth lead-out line 80-8, a tenth lead-out line 80-10, a sixth lead-out line 80-6, an eleventh lead-out line 80-11, a fourth lead-out line 80-4, a twelfth lead-out line 80-12, a second lead-out line 80-2, a thirteenth lead-out line 80-13, a fourteenth lead-out line 80-14, a fifteenth lead-out line 80-15 and a sixteenth lead-out line 80-16.

In an exemplary embodiment, the twelfth lead-out line 80-12 may be provided between the second lead-out line 80-2 and the fourth lead-out line 80-4, the eleventh lead-out line 80-11 may be provided between the fourth lead-out line 80-4 and the sixth lead-out line 80-6, and the tenth lead-out line 80-10 may be provided between the sixth lead-out line 80-6 and the eighth lead-out line 80-8.

In an exemplary embodiment, one data signal line may be provided between adjacent second connection lines in the first direction X. For example, a twelfth data signal line 60-12 may be provided between a second connection line of the first data connection line 70-1 and a second connection line of the second data connection line 70-2. For another example, an eleventh data signal line 60-11 may be provided between the second connection line of the second data connection line 70-2 and a second connection line of the third data connection line 70-3. For another example, a tenth data signal line 60-10 may be provided between the second connection line of the third data connection line 70-3 and a second connection line of the fourth data connection line 70-4.

This exemplary embodiment may not only facilitate the layout of the data connection lines and achieve load without sudden change, but also further compress space occupied by the data connection lines and minimize the load difference of the data signals by a structure in which one data signal line is arranged between adjacent second connection lines.

FIG. 7a to FIG. 7d respectively illustrate an exemplary structure in which one data signal line of the second data signal line group is provided between adjacent data signal lines in the first data signal line group, and in some other exemplary embodiments, three or more odd-numbered data signal lines of the second data signal line group may be provided between adjacent data signal lines in the first data signal line group, which is not limited here in the present disclosure.

FIG. 7a and FIG. 7c respectively illustrate an exemplary structure in which two data signal lines are provided between adjacent second connection lines, FIG. 7b and FIG. 7d respectively illustrate an exemplary structure in which one data signal line is provided between adjacent second connection lines, and in some other exemplary embodiments, three or more data signal lines may be provided between adjacent second connection lines, which is not limited here in the present disclosure.

Figure 7E:
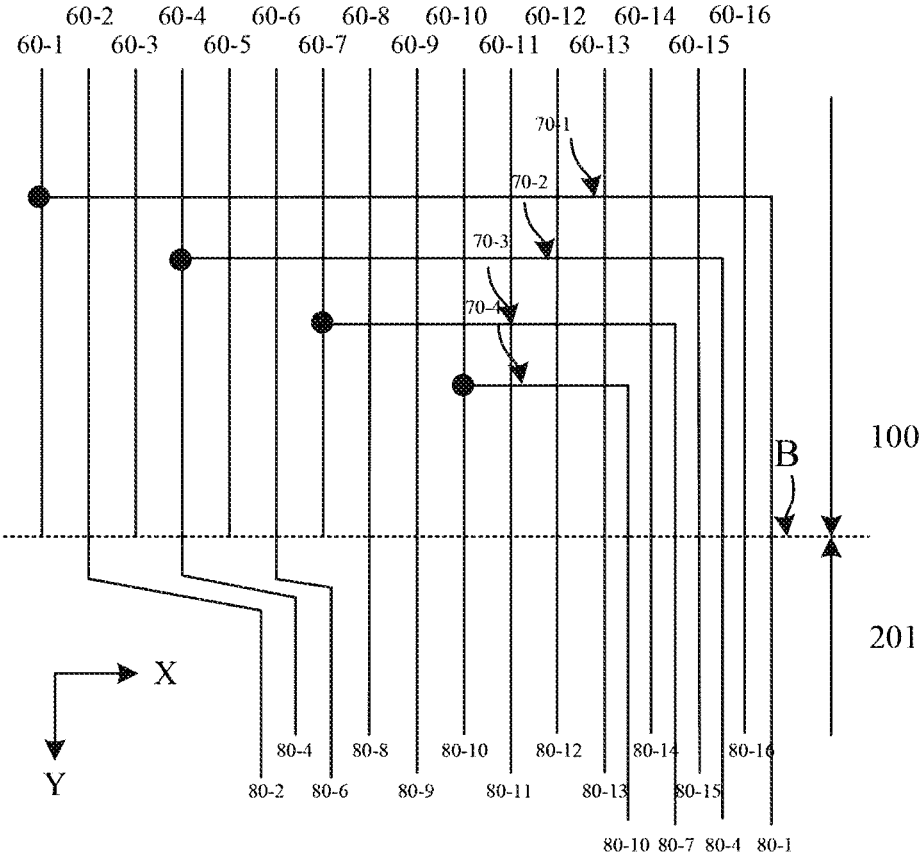

FIG. 7e is a schematic diagram of another arrangement of data connection lines according to an exemplary embodiment of the present disclosure, which is an enlarged view of C1 region in FIG. 6, illustrating a structure of 16 data signal lines, 4 data connection lines, and 16 lead-out lines. As shown in FIG. 7e, in the exemplary embodiment, the first connection holes of this exemplary embodiment are provided in the circuit units of the odd-numbered unit columns and the circuit units of the even-numbered unit columns respectively.

In an exemplary embodiment, the first data signal line group includes two odd-numbered data signal lines (a first data signal line 60-1 and a seventh data signal line 60-7) and two even-numbered data signal lines (a fourth data signal line 60-4 and a tenth data signal line 60-10), the second data signal line group includes the remaining 12 data signal lines, and the first data signal line 60-1 to the sixteenth data signal line 60-16 may be arranged sequentially along the first direction X.

In an exemplary embodiment, the first lead-out line group includes two odd-numbered lead-out lines (a first lead-out line 80-1 and a seventh lead-out line 80-7) and two even-numbered lead-out lines (a fourth lead-out line 80-4 and a tenth lead-out line 80-10), the second lead-out line group includes the remaining 12 lead-out lines. The plurality of lead-out lines of the first lead-out line group may be arranged sequentially along the opposite direction of the first direction X, the plurality of lead-out lines of the second lead-out line group may be arranged sequentially along the first direction X, and one lead-out line of the second lead-out line group is arranged between adjacent lead-out lines in the first lead-out line group.

In an exemplary embodiment, first connection holes are provided in the circuit units of odd-numbered unit columns and the circuit units of even-numbered unit columns respectively. A first end of the first data connection line 70-1 in the display area 100 is connected to the first data signal line 60-1 through a first connection hole, and a second end of the first data connection line 70-1 is connected to the first lead-out line 80-1 after extending to the lead region 201. A first end of the second data connection line 70-2 in the display area 100 is connected to the fourth data signal line 60-4 through a first connection hole, and a second end of the second data connection line 70-2 is connected to the fourth lead-out line 80-4 after extending to the lead region 201. A first end of the third data connection line 70-3 in the display area 100 is connected to the seventh data signal line 60-7 through a first connection hole, and a second end of the third data connection line 70-3 is connected to the seventh lead-out line 80-7 after extending to the lead region 201. A first end of the fourth data connection line 70-4 in the display area 100 is connected to the tenth data signal line 60-10 through a first connection hole, and a second end of the fourth data connection line 70-4 is connected to the tenth lead-out line 80-10 after extending to the lead region 201.

In an exemplary embodiment, one data signal line may be provided between adjacent second connection lines in the first direction X to form a structure in which one data signal line is provided between adjacent second connection lines.

FIG. 8a is a schematic diagram of a planar structure of another display substrate according to an exemplary embodiment of the present disclosure, and FIG. 8b is an enlarged view of C2 region in FIG. 8a. The drive circuit layer of the display area 100 may include a plurality of circuit units constituting a circuit unit array, a plurality of data signal lines 60, a plurality of data connection lines 70, and a power supply trace 90 in a mesh communication structure. The layout and structures of the plurality of circuit units, the plurality of data signal lines 60, and the plurality of data connection lines 70 are substantially the same as those shown in FIG. 6 above.

In an exemplary embodiment, a data connection line 70 may include a first connection line 71 extending along the first direction X and a second connection line 72 extending along the second direction Y. The first connection line 71 and the second connection line 72 may be arranged in different conductive layers, and the first connection line 71 and the data signal lines 60 may be arranged in different conductive layers. A first end of the first connection line 71 is connected to a data signal line 60 through a first connection hole K1, a second end of the first connection line 71 is connected to a first end of the second connection line 72 through a second connection hole K2 after extending along the first direction X or the opposite direction of the first direction X. A second end of the second connection line 72 is connected to the lead-out line 80 after extending towards the lead region along the second direction Y, and the second connection line 72 may be provided between adjacent data signal lines 60.

In an exemplary embodiment, the first connection hole K1 and the second connection hole K2 connecting the same first connection line 71 may be arranged on two sides of the first connection line 71 in the second direction Y, respectively.

In an exemplary embodiment, the power supply trace 90 may include a plurality of first power supply traces 91 extending along the first direction X and a plurality of second power supply traces 92 extending along the second direction Y. The plurality of first power supply traces 91 may be arranged sequentially along the second direction Y, and the plurality of second power supply traces 92 may be arranged sequentially along the first direction X.

In an exemplary embodiment, the first power supply traces 91 and the second power supply traces 92 may be arranged in different conductive layers. The second power supply traces 92 may be arranged between adjacent data signal lines 60, and at least one second power supply trace 92 may be connected to at least one first power supply trace 91 through a third connection hole K3, so that the plurality of first power supply traces 91 and the plurality of second power supply traces 92 constitute the power supply trace 90 in a mesh communication structure.

In an exemplary embodiment, the first connection holes K1 may be arranged in circuit units of the odd-numbered unit columns, and one data signal line 60 and two second power supply traces 92 may be provided between two first connection holes K1 adjacent in the first direction X.

In an exemplary embodiment, two data signal lines 60 and one second power supply trace 92 may be provided between two second connection lines 72 adjacent in the first direction X.

In an exemplary embodiment, the first power supply traces 91 and the first connection lines 71 may be arranged in a same layer and be formed synchronously by a same patterning process, and the second power supply traces 92 and the second connection lines 72 may be arranged in a same layer and be formed synchronously by a same patterning process.

In an exemplary embodiment, only one first power supply trace 91 may be provided in at least one circuit row, and no first connection line 71 may be provided in the at least one circuit row.

In an exemplary embodiment, at least one first power supply trace 91 and at least one first connection line 71 may be provided in at least one circuit row, and a first fracture DF1 is provided between a first power supply trace 91 and a first connection line 71, and the first fracture DF1 is configured to achieve insulation between the first power supply trace 91 and the first connection line 71.

In an exemplary embodiment, only one second power supply trace 92 may be provided in at least one circuit column, and no second connection line 72 may be provided in the at least one circuit column.

In an exemplary embodiment, at least one second power supply trace 92 and at least one second connection line 72 may be provided in at least one circuit column, and a second fracture DF2 is provided between a second power supply trace 92 and a second connection line 72, and the second fracture DF2 is configured to achieve insulation between the second power supply trace 92 and the second connection line 72.

In an exemplary embodiment, the power supply trace 90 may provide a low-level signal continuously. For example, the power supply trace 90 may be the second power supply line VSS.

FIG. 9 is a schematic diagram of a planar structure of a power supply trace according to an exemplary embodiment of the present disclosure. As shown in FIG. 9, the display substrate may include a display area 100, a bonding area 200 located on a side of the display area 100 in the second direction Y, and a bezel area 300 located on other sides of the display area 100. The display area 100 is provided with a mesh-shaped power supply trace 90, the bonding area 200 is provided with a bonding power supply lead 410, and the bezel area 300 is provided with a bezel power supply lead 510. The power supply trace 90 is connected to the bonding power supply lead 410 and the bezel power supply lead 510 respectively.

In an exemplary embodiment, the bonding power supply lead 410 of the bonding area 200 and the bezel power supply lead 510 of the bezel area 300 may be of an integral structure connected to each other.

In an exemplary embodiment, the power supply trace 90 of the display area 100 may include a plurality of first power supply traces 91 extending along the first direction X and a plurality of second power supply traces 92 extending along the second direction Y. The plurality of first power supply traces 91 may be arranged sequentially along the second direction Y and one end or two ends of each first power supply traces 91 in the first direction X are connected to the bezel power supply lead 510, and the plurality of second power supply traces 92 may be arranged sequentially along the first direction X and one end of each second power supply trace 92 in the second direction Y is connected to the bonding power supply lead 410.

In an exemplary embodiment, an end of the second power supply trace 92 in the opposite direction of the second direction Y may be connected to the bezel power supply lead 510.

In an exemplary embodiment, the first power supply traces 91 and the second power supply traces 92 may be arranged in different conductive layers, and at least one second power supply trace 92 may be connected to at least one first power supply trace 91 through a third connection hole, such that the plurality of first power supply traces 91 and the plurality of second power supply traces 92 have a same potential. In the present disclosure, a structure in which a low-voltage line is arranged in the sub-pixel (VSS pixel) is achieved by arranging the power supply trace in the display area, which may greatly reduce a width of the bezel power supply lead and is conducive to achieving a narrow bezel. The power supply trace is configured to be in a mesh communication structure according to the present disclosure, which may not only effectively reduce the resistance of the power supply trace, effectively reduce a voltage drop of the low-voltage power supply signals and achieve low power consumption, but also effectively improve the uniformity of the power supply signals in the display substrate, effectively improve the display uniformity, and improve the display quality.

Figure 10:
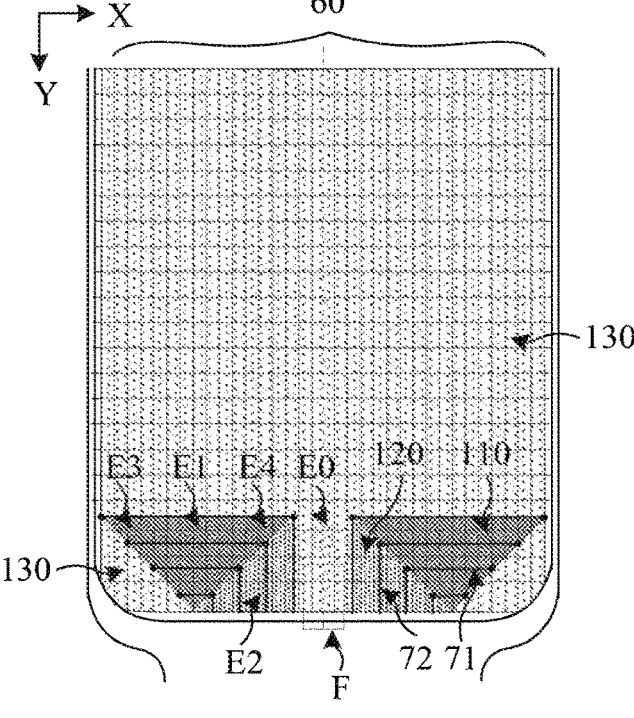
FIG. 10 is a schematic diagram of a structure of a data connection line according to an exemplary embodiment of the present disclosure.

FIG. 10 is a schematic diagram of a structure of data connection lines according to an exemplary embodiment of the present disclosure. As shown in FIG. 10, since the data connection lines are arranged in a portion of the display area, and include first connection lines extending along the first direction X and second connection lines extending along the second direction Y. The display area may be divided into a first region 110, a second region 120 and a third region 130 according to presence or absence of data connection lines and an extension direction of the data connection lines. The first region 110 may be a region where the first connection lines 71 are provided (lateral trace region for fan-out lines), the second region 120 may be a region where the second connection lines 72 are provided (longitudinal trace region for fan-out lines), and the third region 130 may be a region where the first connection lines 71 and the second connection lines 72 are not provided (a normal region).

In an exemplary embodiment, the first region 110 may include a plurality of circuit units, an orthographic projection of the first connection lines 71 on a plane of the display substrate is at least partially overlapped with an orthographic projection of pixel drive circuits in the plurality of circuit units of the first region 110 on the plane of the display substrate. The orthographic projection of the pixel drive circuits in the plurality of circuit units of the first region 110 on the plane of the display substrate is not overlapped with an orthographic projection of the second connection lines 72 on the plane of the display substrate.

In an exemplary embodiment, the second region 120 may include a plurality of circuit units, an orthographic projection of the second connection lines 72 on the plane of the display substrate is at least partially overlapped with an orthographic projection of pixel drive circuits in the plurality of circuit units of the second region 120 on the plane of display substrate, and the orthographic projection of the pixel drive circuits in the plurality of circuit units of the second region 120 on the plane of the display substrate is not overlapped with an orthographic projection of the first connection lines 71 on the plane of the display substrate.

In an exemplary embodiment, the third region 130 may include a plurality of circuit units, and an orthographic projection of pixel drive circuits in the plurality of circuit units of the third region 130 on the plane of the display substrate are not overlapped with orthographic projections of the first connection lines 71 and the second connection lines 72 on the plane of the display substrate.

In an exemplary embodiment, the division of the respective regions shown in FIG. 10 is only an exemplary illustration. Since the first region 110, the second region 120 and the third region 130 are divided according to presence or absence of data connection lines and an extension direction of the data connection lines, shapes of the three regions may be regular polygons or irregular polygons, and the display area may be divided into one or more first regions 110, one or more second regions 120, and one or more third regions 130, which are not limited in the present disclosure.

In an exemplary embodiment, in a plane perpendicular to the display substrate, the drive circuit layer includes a first conductive layer, a second conductive layer, a third conductive layer and a fourth conductive layer which are arranged sequentially on the base substrate. The third conductive layer at least includes the first connection lines, and the fourth conductive layer at least includes the data signal lines and the second connection lines. Each data signal line is connected to a first end of a first connection line through a first connection hole, and each second connection line is connected to a second end of a first connection line through a second connection hole.

In an exemplary embodiment, the third conductive layer further includes a plurality of first power supply traces extending along the first direction, the fourth conductive layer further includes a plurality of second power supply traces extending along the second direction, and the second power supply traces are connected to the first power supply traces through third connection holes.

In an exemplary embodiment, the bonding area at least includes a lead region, which includes a plurality of lead-out lines, and the plurality of lead-out lines include a plurality of first lead-out lines arranged in the first conductive layer and a plurality of second lead-out lines arranged in the second conductive layer. The first lead-out lines are connected to data signal lines of odd-numbered unit columns in the display area, and the second lead-out lines are connected to data signal lines of even-numbered unit columns in the display area. Or, the first lead-out lines are connected to data signal lines of even-numbered unit columns in the display area, and the second lead-out lines are connected to data signal lines of odd-numbered unit columns in the display area.

In an exemplary embodiment, the first conductive layer further includes a plurality of first lead electrodes connected to the first lead-out lines. The second conductive layer further includes a plurality of second lead electrodes connected to the second lead-out lines. The third conductive layer further includes a plurality of third lead electrodes and a plurality of fourth lead electrodes, wherein the third lead electrodes are connected to the first lead electrodes through via holes, and the fourth lead electrodes are connected to the second lead electrodes through via holes. The data signal lines of the odd-numbered unit columns in the display area are connected to the third lead electrodes through via holes, and the data signal lines of the even-numbered unit columns in the display area are connected to the fourth lead electrodes through the via hole; and alternatively, the data signal lines of the even-numbered unit columns in the display area are connected to the third lead electrodes through via holes, and the data signal lines of the odd-numbered unit columns in the display area are connected to the fourth lead electrodes through via holes.

In an exemplary embodiment, the drive circuit layer may further include a first insulation layer, a second insulation layer, a third insulation layer, a fourth insulation layer and a first planarization layer. The first insulation layer is arranged between the base substrate and a semiconductor layer, the second insulation layer is arranged between the semiconductor layer and the first conductive layer, the third insulation layer is arranged between the first conductive layer and the second conductive layer, the fourth insulation layer is arranged between the second conductive layer and the third conductive layer, and the first planarization layer is arranged between the third conductive layer and the fourth conductive layer.

Exemplary description is made below through a manufacturing process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. The deposition may be any one or more of sputtering, evaporation, and chemical vapor deposition. The coating may be any one or more of spray coating, spin coating, and ink-jet printing. The etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process contains at least one "pattern". "A and B being arranged on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A coincides with the boundary of the orthographic projection of B.

In an exemplary embodiment, the manufacturing process of the display substrate may include following operations.

Figure 11A:
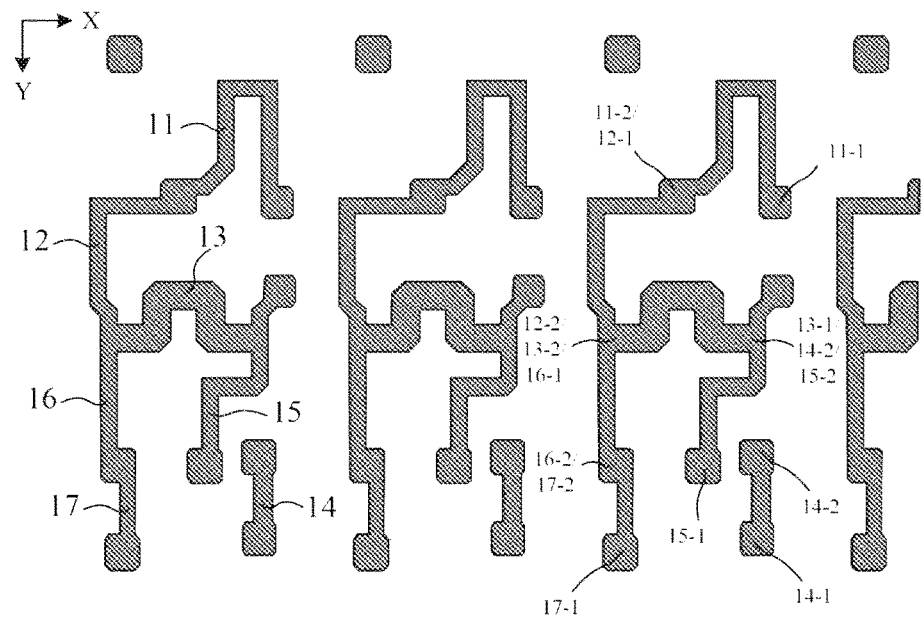
FIG. 11a and FIG. 11b are schematic diagrams of a display substrate of the present disclosure after a pattern of a semiconductor layer is formed.
Figure 11B:
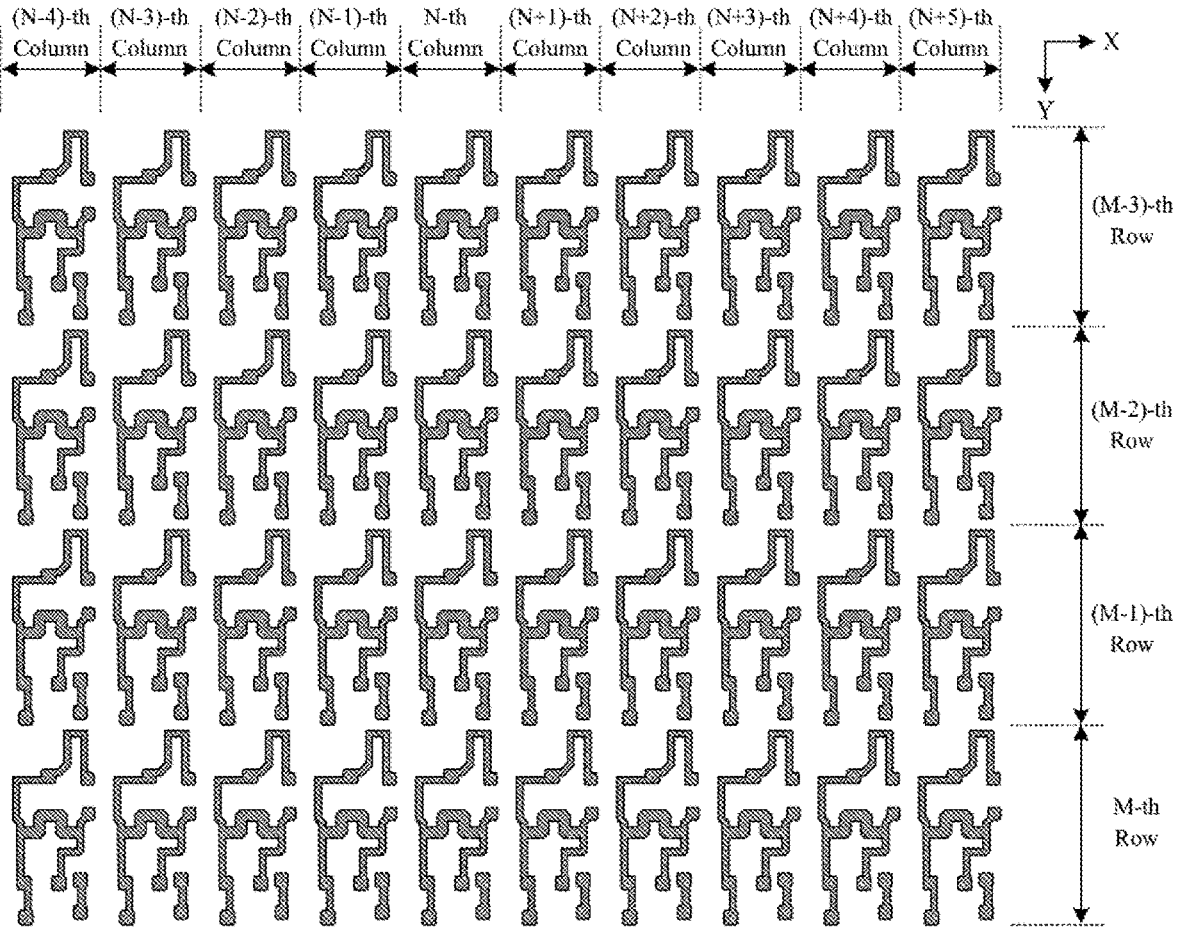

(1) A pattern of a semiconductor layer is formed. In an exemplary embodiment, forming the pattern of the semiconductor layer may include: depositing sequentially a first insulation thin film and a semiconductor thin film on a base substrate, and patterning the semiconductor thin film through a patterning process to form a first insulation layer overlying the base substrate and a semiconductor layer arranged on the first insulation layer. As shown in FIG. 11a and FIG. 11b, FIG. 11a is an enlarged view of E0 region in FIG. 10, and FIG. 11b is an enlarged view of F region in FIG. 10.

In an exemplary embodiment, the semiconductor layer of each circuit unit of the display area may at least include a first active layer 11 of the first transistor T1 to a seventh active layer 17 of the seventh transistor T7, and the first active layer 11 to the third active layer 13, and the fifth active layer 15 to the seventh active layer 17 may be of an integral structure connected to one another and the fourth active layer 14 may be individually arranged.

In an exemplary embodiment, the first active layer 11 and the second active layer 12 may be located on a side of the third active layer 13 of the present circuit unit in the opposite direction of the second direction Y, and the fourth active layer 14, the fifth active layer 15, the sixth active layer 16 and the seventh active layer 17 may be located on a side of the third active layer 13 of the circuit unit in the second direction Y.

In an exemplary embodiment, the first active layer 11 may be in an "n" shape, the second active layer 12 and the fifth active layer 15 may be in a "L" shape, the third active layer 13 may be in an "Ω" shape, the fourth active layer 14, the fifth active layer 15, the sixth active layer 16 and the seventh active layer 17 may be in an "I" shape.

In an exemplary embodiment, an active layer of each transistor may include a first region, a second region, and a channel region located between the first region and the second region. In an exemplary embodiment, a first region 11-1 of the first active layer 11, a first region 14-1 of the fourth active layer 14, a second region 14-2 of the fourth active layer 14, a first region 15-1 of the fifth active layer 15 and a first region 17-1 of the seventh active layer 17 may be individually provided. A second region 11-2 of the first active layer 11 may serve as a first region 12-1 of the second active layer 12. A first region 13-1 of the third active layer 13 may serve as a second region 14-2 of the fourth active layer 14 and a second region 15-2 of the fifth active layer 15 at the same time. A second region 13-2 of the third active layer 13 may serve as a second region 12-2 of the second active layer 12 and a first region 16-1 of the sixth active layer 16 at the same time. A second region 16-2 of the sixth active layer 16 may serve as a second region 17-2 of the seventh active layer 17.

In an exemplary embodiment, the first region of the third active layer may serve as a first electrode of the third transistor (a drive transistor), the second region of the fourth active layer may serve as a second electrode of the fourth transistor (a data write transistor), and the second region of the fifth active layer may serve as a second electrode of the fifth transistor, wherein the first electrode of the third transistor, the second electrode of the fourth transistor and the second electrode of the fifth transistor are connected to each other, and the connection point therebetween is a first node N1 of a pixel drive circuit.

In an exemplary embodiment, semiconductors patterns of the E1 region, the E2 region, the E3 region and the E4 region in FIG. 10 are substantially the same as the semiconductor patterns of the E0 region, and no semiconductor pattern is provided in the lead region of the bonding area.

Figures 12A, 12B:
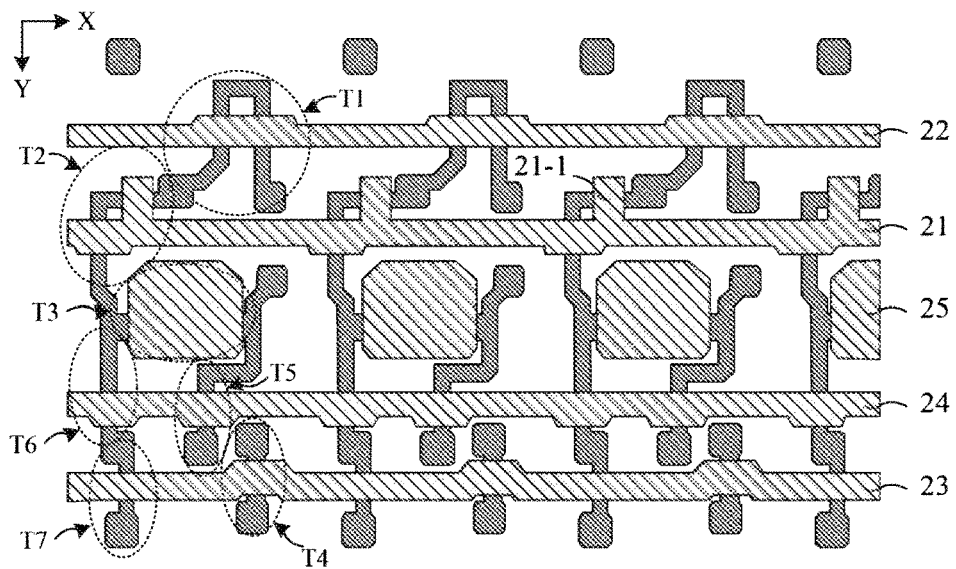
FIG. 12a and FIG. 12b are schematic diagrams of a display substrate after a pattern of a first conductive layer is formed according to the present disclosure.

(2) A pattern of a first conductive layer is formed. In an exemplary embodiment, forming the pattern of the first conductive layer may include: sequentially depositing a second insulation thin film and a first conductive thin film on the base substrate on which the aforementioned patterns are formed, and patterning the first conductive thin film through a patterning process to form a second insulation layer that covers the pattern of the semiconductor layer and form the pattern of the first conductive layer arranged on the second insulation layer. As shown in FIG. 12*a* and FIG. 12*b*, FIG. 12*a* is an enlarged view of the E0 region in FIG. 10, and FIG. 12*b* is an enlarged view of the F region in FIG. 10. In an exemplary embodiment, the first conductive layer may be referred to as a first gate metal (GATE1) layer.

In an exemplary embodiment, the pattern of each circuit unit in the display area at least includes a first scan signal line 21, a second scan signal line 22, a third scan signal line 23, a light emitting control line 24 and a first plate 25 of a storage capacitor.

In an exemplary embodiment, a shape of the first plate 25 of the storage capacitor may be a rectangle, corners of which may be provided with chamfers, and there is an overlapping region between an orthographic projection of the first plate 25 on the base substrate and an orthographic projection of the third active layer of the third transistor T3 on the base substrate. In an exemplary embodiment, the first plate 25 may simultaneously serve as a plate of the storage capacitor and a gate electrode of the third transistor T3.

In the exemplary embodiment, shapes of the first scan signal line 21, the second scan signal line 22, the third scan signal line 23 and the light emitting control line 24 may be line shapes of which the main body portion extends along the first direction X. The first scan signal line 21 and the second scan signal line 22 may be located on a side of the first plate 25 of the present circuit unit in the opposite direction of the second direction Y. The second scan signal line 22 may be located on a side of the first scan signal line 21 of the present circuit unit away from the first plate 25. The third scan signal line 23 and the light emitting control line 24 may be located on a side of the first plate 25 of the present circuit unit in the second direction Y, and the third scan signal line 23 may be located on a side of the light emitting control line 24 of the present circuit unit away from the first plate 25.

In an exemplary embodiment, the first scan signal line 21 may be provided with a gate block 21-1 protruding toward the second scan signal line 22, and a region where the first scan signal line 21 and the gate block 21-1 are overlapped with the second active layer may serve as a gate electrode of the second transistor T2 to form the second transistor T2 with a double-gate structure.

In an exemplary embodiment, a region where the first scan signal line 22 is overlapped with the second active layer 12 may serve as a gate electrode of the first transistor T1 with a double-gate structure. An overlapping region where the third scan signal line 23 is overlapped with the fourth active layer may serve as a gate electrode of the fourth transistor T4, and an overlapping region where the third scan signal line 23 is overlapped with the seventh active layer may serve as a gate electrode of the seventh transistor T7. An overlapping region where the light emitting control line 24 is overlapped with the fifth active layer may serve as a gate electrode of the fifth transistor T5, and an overlapping region where the second scan signal line 24 is overlapped with the sixth active layer may serve as a gate electrode of the sixth transistor T6

In an exemplary embodiment, the first scan signal line 21 and the third scan signal line 23 may be connected to a same signal source, that is, output signals of the first scan signal line 21 and the third scan signal line 23 are the same.

In an exemplary embodiment, patterns of the first conductive layers of the E1 region, the E2 region, the E3 region, and the E4 region in FIG. 10 are substantially the same as the pattern of the first conductive layer of the E0 region.

In an exemplary embodiment, the pattern of the first conductive layer of the lead region in the bonding area may at least include a plurality of first lead electrodes 210.

In an exemplary embodiment, a shape of each first lead electrode 210 may be a strip shape extending along the second direction Y, and the first lead electrode 210 is configured to be connected to a data signal line of an odd-numbered unit column to be formed subsequently.

In an exemplary embodiment, after the pattern of the first conductive layer is formed, the semiconductor layer may be subjected to a conductive treatment by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first regions and second regions of the first active layer to the seventh active layer are all made to be conductive.

(3) A pattern of a second conductive layer is formed. In an exemplary embodiment, forming the pattern of the second conductive layer may include: sequentially depositing a third insulation thin film and a second conductive thin film on the base substrate on which the aforementioned patterns are formed, and patterning the second conductive thin film through a patterning process to form a third insulation layer that covers the first conductive layer and form the pattern of the second conductive layer arranged on the third insulation layer.

Figures 13A, 13B:
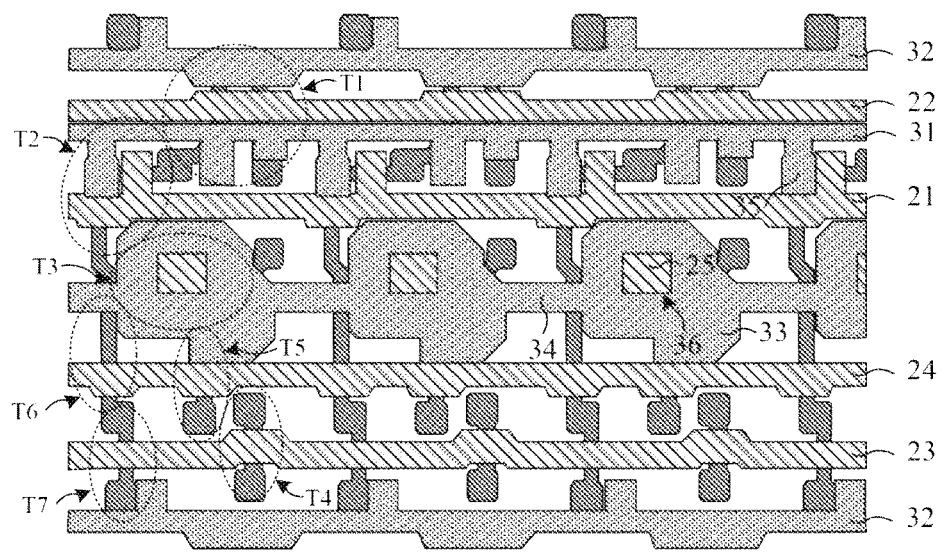
FIG. 13a and FIG. 13b are schematic diagrams of a display substrate after a pattern of a second conductive layer is formed according to the present disclosure.

The pattern of the second conductive layer may include, as shown in FIG. 13a and FIG. 13b, FIG. 13a is an enlarged view of the E0 region in FIG. 10, and FIG. 13b is an enlarged view of the F region in FIG. 10. In an exemplary embodiment, the second conductive layer may be referred to as a second gate metal (GATE2) layer.

In an exemplary embodiment, the pattern of the second conductive layer of each circuit unit of the display area at least includes a first initial signal line 31, a second initial signal line 32, a second plate 33 of the storage capacitor, a plate connection line 34 and a shield electrode 35.

In an exemplary embodiment, shapes of the first initial signal line 31 and the second initial signal line 32 may be line shapes of which the main body portion may extend along the first direction X. The first initial signal line 31 may be located between the first scan signal line 21 and the second scan signal line 22 of the present circuit unit, and the second initial signal line 32 may be located on a side of the third scan signal line 23 of the present circuit unit away from the light emitting control line 24.

In an exemplary embodiment, a contour shape of the second plate 33 may be a rectangular shape, corners of which may be provided with chamfers, there is an overlapping region between an orthographic projection of the second plate 33 on the base substrate and an orthographic projection of the first plate 25 on the base substrate, the second plate 33 serves as another plate of the storage capacitor and is located between the first scan signal line 21 and the light emitting control line 24 of the present circuit unit, and the first plate 25 and the second plate 33 constitute the storage capacitor of the pixel drive circuit.

In an exemplary embodiment, the plate connection line 34 may be arranged on a side of the second plate 33 in the first direction X or the opposite direction of the first direction X, a first end of the plate connection line 34 is connected to the second plate 33 of the present circuit unit, and a second end of the plate connection line 34 is connected to a second plate 33 of an adjacent circuit unit after extending along the first direction X or the opposite direction of the first direction X, that is, second plates 33 of adjacent circuit units in a unit row are made to be connected to each other. In an exemplary embodiment, second plates of a plurality of circuit units in one unit row form an integrated structure connected to each other through the plate connection line, and the second plates with the integrated structure may be reused as a power supply signal connection line, thus ensuring that a plurality of second plates in one unit row have a same potential, which is conducive to improving uniformity of the panel, avoiding a poor display of the display substrate and ensuring a display effect of the display substrate.

In an exemplary embodiment, the second plate 33 is provided with an opening 36. The opening 36 may be located in the middle of the second plate 33 and the opening 36 may be rectangular, so that the second plate 33 forms an annular structure. The opening 36 exposes the third insulation layer covering the first plate 25, and an orthographic projection of the first plate 25 on the base substrate contains an orthographic projection of the opening 36 on the base substrate. In an exemplary embodiment, the opening 36 is configured to accommodate a first via hole to be formed subsequently, which is located in the opening 36 and exposes the first plate 25, so that a second electrode of the first transistor T1 to be formed subsequently is connected to the first plate 25.

In the exemplary embodiment, the orthographic projection of the second plate 33 on the base substrate is at least partially overlapped with an orthographic projection of the first node N1 on the base substrate, and since the second plate 33 is connected to the first signal line to be formed subsequently, the second plate 33 may effectively shield the first node N1, avoid a potential of the first node N1 from being affected by the outside environment, and improve the display effect.

In an exemplary embodiment, the shield electrode 35 may be located on a side of the first initial signal line 31 close to the first scan signal line 21, and is connected to the first initial signal line 31, an orthographic projection of the shield electrode 35 on the base substrate is at least partially overlapped with an orthographic projection of the first region of the second active layer on the base substrate, and the shield electrode 35 is configured to shield an influence of a data voltage jump on a key node, prevent the data voltage jump from affecting a potential of the key node of the pixel drive circuit, and improve the display effect.

In an exemplary embodiment, patterns of the second conductive layers of the E1 region, the E2 region, the E3 region and the E4 region in FIG. 10 are substantially the same as the pattern of the second conductive layer of the E0 region.

In an exemplary embodiment, the pattern of the second conductive layer of the lead region in the bonding area may at least include a plurality of second lead electrodes 220.

In an exemplary embodiment, a shape of each second lead electrode 220 may be a strip shape extending along the second direction Y, and the second lead electrode 220 is configured to be connected to a data signal line of an even-numbered unit column to be formed subsequently.

In an exemplary embodiment, the second lead electrode 220 may be arranged between the first lead electrodes 210 adjacent in the first direction X, each first lead electrode 210 may be arranged between the second lead electrodes 220 adjacent in the first direction X, and ends of the plurality of first lead electrodes 210 close to the display area may be flush with ends of the plurality of second lead electrodes 220 close to the display area.

Figure 14A:
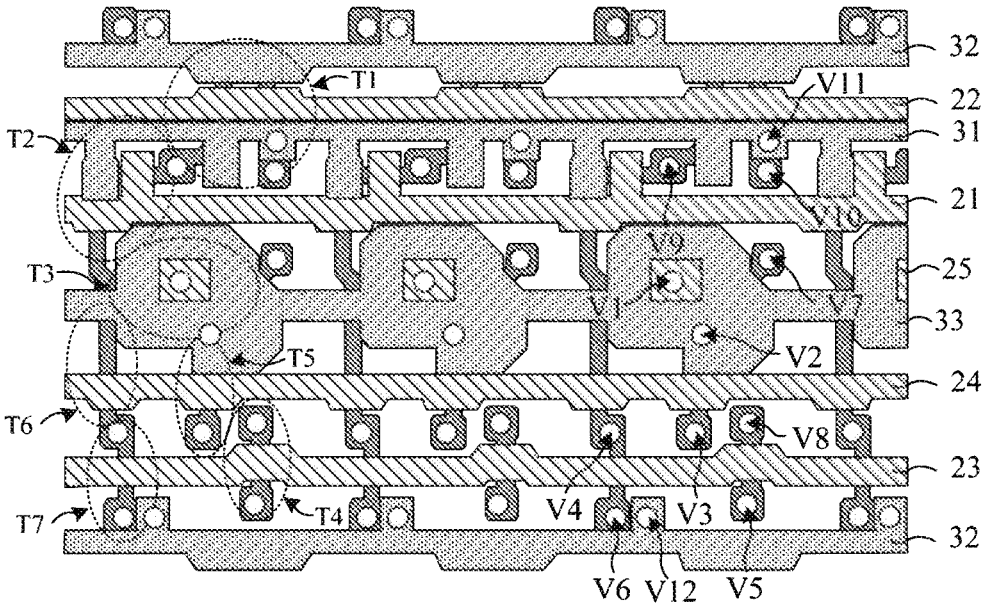
FIG. 14a and FIG. 14b are schematic diagrams of a display substrate after a pattern of a fourth insulation layer is formed according to the present disclosure.
Figure 14B:
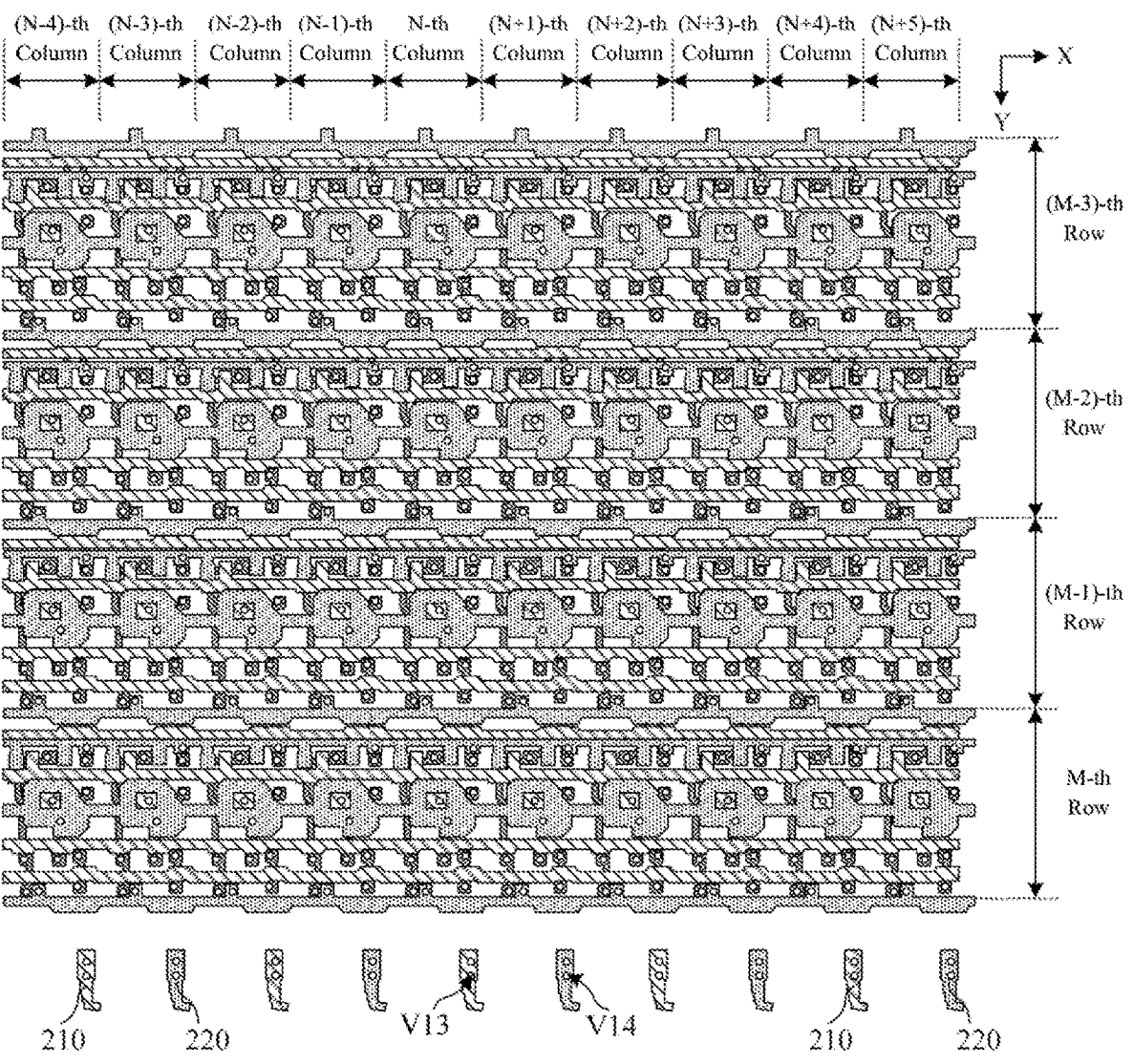

(4) A pattern of a fourth insulation layer is formed. In an exemplary embodiment, forming the pattern of the fourth insulation layer may include: depositing a fourth insulation thin film on the base substrate on which the aforementioned patterns are formed, and patterning the fourth insulation thin film through a patterning process to form a fourth insulation layer covering the second conductive layer, and each circuit unit is provided with a plurality of via holes. As shown in FIG. 14a and FIG. 14b, FIG. 14a is an enlarged view of the E0 region in FIG. 10, and FIG. 14b is an enlarged view of the F region in FIG. 10.

In an exemplary embodiment, a plurality of via holes of each circuit unit in the display area at least includes a first via hole V1, a second via hole V2, a third via hole V3, a fourth via hole V4, a fifth via hole V5, a sixth via hole V6, a seventh via hole V7, an eighth via hole V8, a ninth via hole V9, a tenth via hole V10, an eleventh via hole V11 and a twelfth via hole V12.

In an exemplary embodiment, an orthographic projection of the first via hole V1 on the base substrate is within a range of the orthographic projection of the opening 36 of the second plate 33 on the base substrate, the fourth insulation layer and the third insulation layer within the first via hole V1 are etched away to expose a surface of the first plate 25, and the first via hole V1 is configured such that the second electrode of the first transistor T1 to be formed subsequently is connected to the first plate 25 through the via hole V1.

In an exemplary embodiment, an orthographic projection of the second via hole V2 on the base substrate is within a range of an orthographic projection of the second plate 33 on the base substrate, the fourth insulation layer within the second via hole V2 is etched away to expose a surface of the second plate 33, and the second via hole V2 is configured such that a first electrode of the fifth transistor T5 to be formed subsequently is connected to the second plate 33 through the via hole V2.

In an exemplary embodiment, an orthographic projection of the third via hole V3 on the base substrate is within a range of an orthographic projection of the first region of the fifth active layer on the base substrate. The fourth insulation layer, the third insulation layer and the second insulation layer within the third via hole V3 are etched away to expose a surface of the first region of the fifth active layer, and the third via hole V3 is configured such that a first electrode of the fifth transistor T5 to be formed subsequently is connected to the first region of the fifth active layer through the via hole V3.

In an exemplary embodiment, an orthographic projection of the fourth via hole V4 on the base substrate is located within a range of an orthographic projection of the second region of the sixth active layer (also the second region of the seventh active layer) on the base substrate. The fourth insulation layer, the third insulation layer and the second insulation layer within the fourth via hole V4 are etched away to expose a surface of the second region of the sixth active layer, the fourth via hole V4 is configured such that a second electrode of the sixth transistor T6 (also the second electrode of the seventh transistor T7) to be formed subsequently is connected to the second region of the sixth active layer through the via hole V4.

In an exemplary embodiment, an orthographic projection of the fifth via hole V5 on the base substrate is within a range of an orthographic projection of the first region of the fourth active layer on the base substrate. The fourth insulation layer, the third insulation layer and the second insulation layer within the fifth via hole V5 are etched away to expose a surface of the first region of the fourth active layer, and the fifth via hole V5 is configured such that a first electrode of the fourth transistor T4 to be formed subsequently is connected to the first region of the fourth active layer through the via hole V5.

In an exemplary embodiment, an orthographic projection of the sixth via hole V6 on the base substrate is within a range of an orthographic projection of the first region of the seventh active layer on the base substrate. The fourth insulation layer, the third insulation layer and the second insulation layer within the sixth via hole V6 are etched away to expose a surface of the first region of the seventh active layer, and the sixth via hole V6 is configured such that a first electrode of the seventh transistor T7 to be formed subsequently is connected to the first region of the seventh active layer through the via hole V6.

In an exemplary embodiment, an orthographic projection of the seventh via hole V7 on the base substrate is within a range of an orthographic projection of the first region of the third active layer on the base substrate. The fourth insulation layer, the third insulation layer and the second insulation layer within the seventh via hole V7 are etched away to expose a surface of the first region of the third active layer, and the seventh via hole V7 is configured such that the first electrode of the third transistor T3 to be formed subsequently is connected to the first region of the third active layer through the via hole V7.

In an exemplary embodiment, an orthographic projection of the eighth via hole V8 on the base substrate is within a range of an orthographic projection of the second region of the fourth active layer on the base substrate. The fourth insulation layer, the third insulation layer and the second insulation layer within the eighth via hole V8 are etched away to expose a surface of the second region of the fourth active layer, and the eighth via hole V8 is configured such that the first electrode of the third transistor T3 to be formed subsequently is connected to the second region of the fourth active layer through the via hole V8.

In an exemplary embodiment, an orthographic projection of the ninth via hole V9 on the base substrate is within a range of an orthographic projection of the second region of the first active layer (also the first region of the second active layer) on the base substrate. The fourth insulation layer, the third insulation layer and the second insulation layer within the ninth via hole V9 are etched away to expose a surface of the second region of the first active layer, the ninth via hole V9 is configured such that the second electrode of the first transistor T1 (also the first electrode of the second transistor T2) to be formed subsequently is connected to the second region of the first active layer through the via hole V9.

In an exemplary embodiment, an orthographic projection of the tenth via hole V10 on the base substrate is within a range of an orthographic projection of the first region of the first active layer on the base substrate. The fourth insulation layer, the third insulation layer and the second insulation layer within the tenth via hole V10 are etched away to expose a surface of the first region of the first active layer, and the tenth via hole V10 is configured such that a first electrode of the first transistor T1 to be formed subsequently is connected to the first region of the first active layer through the via hole V10.

In an exemplary embodiment, an orthographic projection of the eleventh via hole V11 on the base substrate is within a range of an orthographic projection of the first initial signal line 31 on the base substrate, the fourth insulation layer within the eleventh via hole V11 are etched away to expose a surface of the first initial signal line 31, and the eleventh via hole V11 is configured such that the first electrode of the first transistor T1 to be formed subsequently is connected to the first initial signal line 31 through the via hole V11.

In an exemplary embodiment, an orthographic projection of the twelfth via hole V12 on the base substrate is within a range of an orthographic projection of the second initial signal line 32 on the base substrate, the fourth insulation layer within the twelfth via hole V12 is etched away to expose a surface of the second initial signal line 32, and the twelfth via hole V12 is configured such that the first electrode of the seventh transistor T7 to be formed subsequently is connected to the second initial signal line 32 through the via hole V12.

In an exemplary embodiment, the patterns of the plurality of via holes of the E1 region, the E2 region, the E3 region, and the E4 region in FIG. 10 are substantially the same as the patterns of the plurality of via holes of the E0 region.

In an exemplary embodiment, the plurality of via holes of the lead region in the bonding area at least include a thirteenth via hole V13 and a fourteenth via hole V14.

In an exemplary embodiment, an orthographic projection of the thirteenth via hole 13 on the base substrate is located within a range of an orthographic projection of a first lead electrode 210 on the base substrate, the fourth insulation layer and the third insulation layer within the thirteenth via hole V13 are etched away to expose a surface of the first lead electrode 210, and the thirteenth via hole V13 is configured such that a third lead electrode to be formed subsequently is connected to a first lead electrode 210 through the via hole V13.

In an exemplary embodiment, an orthographic projection of the fourteenth via hole 14 on the base substrate is located within a range of an orthographic projection of a second lead electrode 220 on the base substrate, the fourth insulation layer within the fourteenth via hole V14 is etched away to expose a surface of the second lead electrode 220, and the fourteenth via hole V14 is configured such that a fourth lead electrode to be formed subsequently is connected to the second lead electrode 220 through the via hole V14.

Figure 15A:
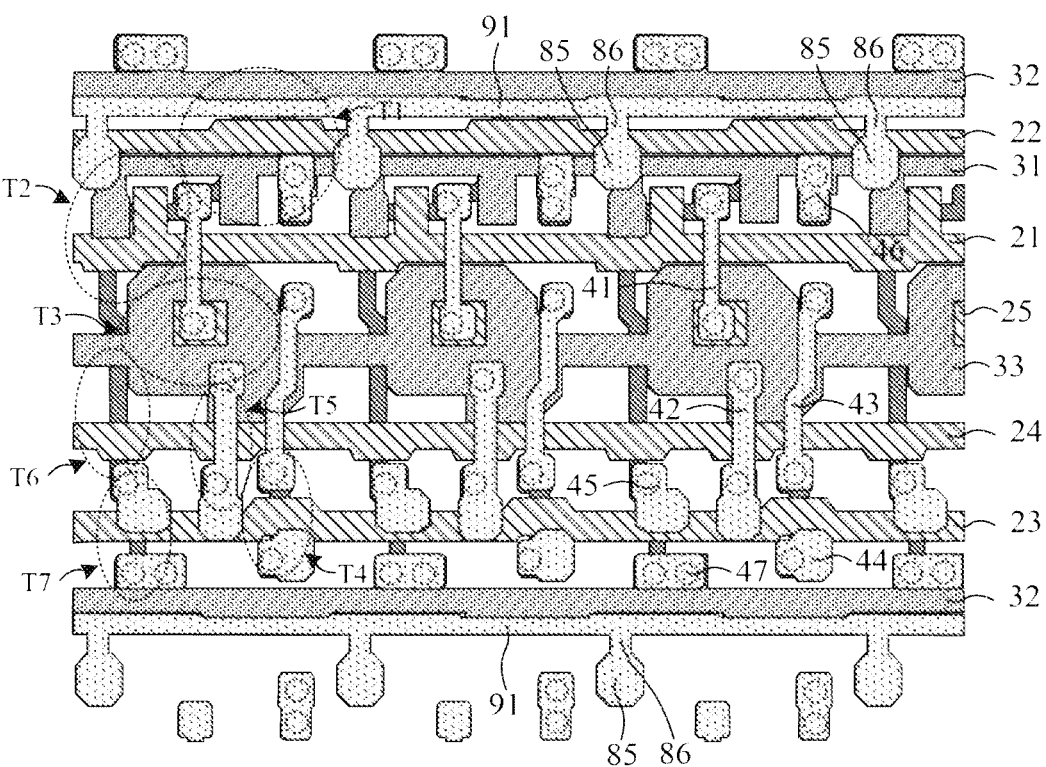
FIG. 15a to FIG. 15f are schematic diagrams of a display substrate after a pattern of a third conductive layer is formed according to the present disclosure.
Figure 15B:
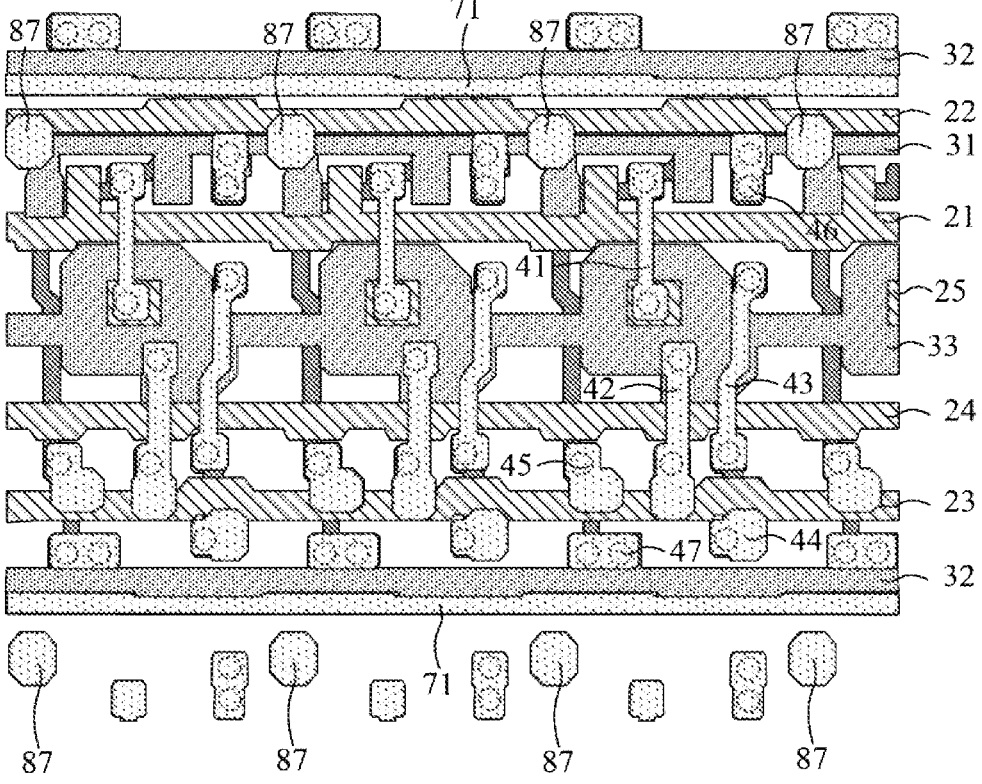
Figure 15C:
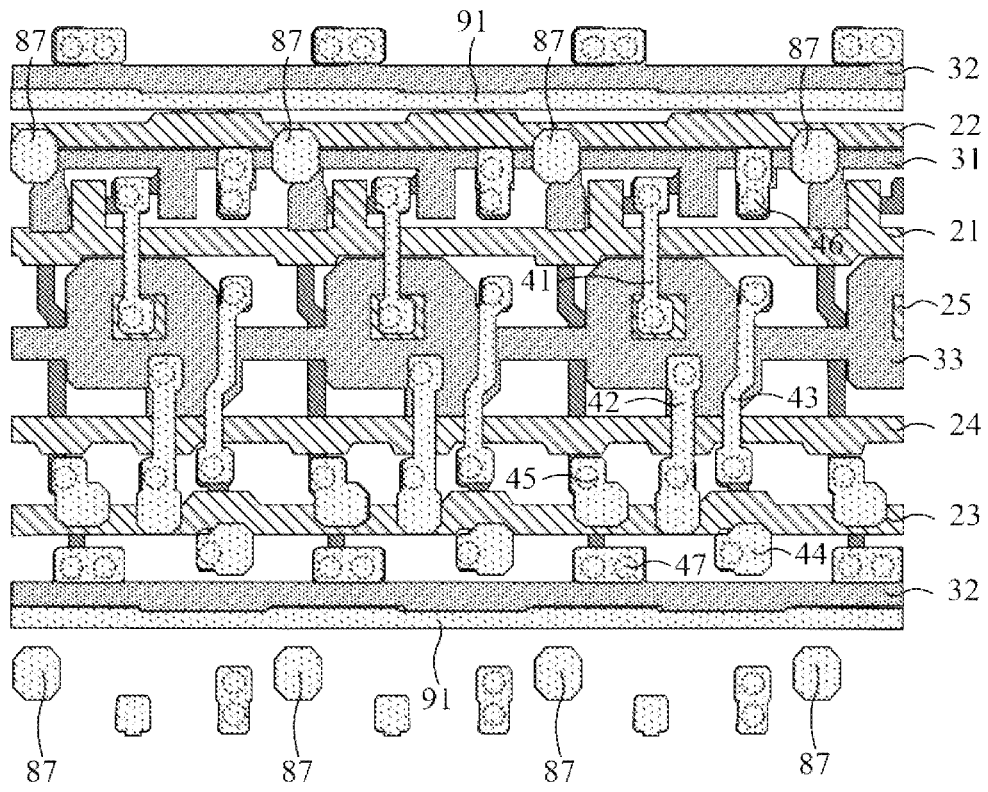
Figure 15D:
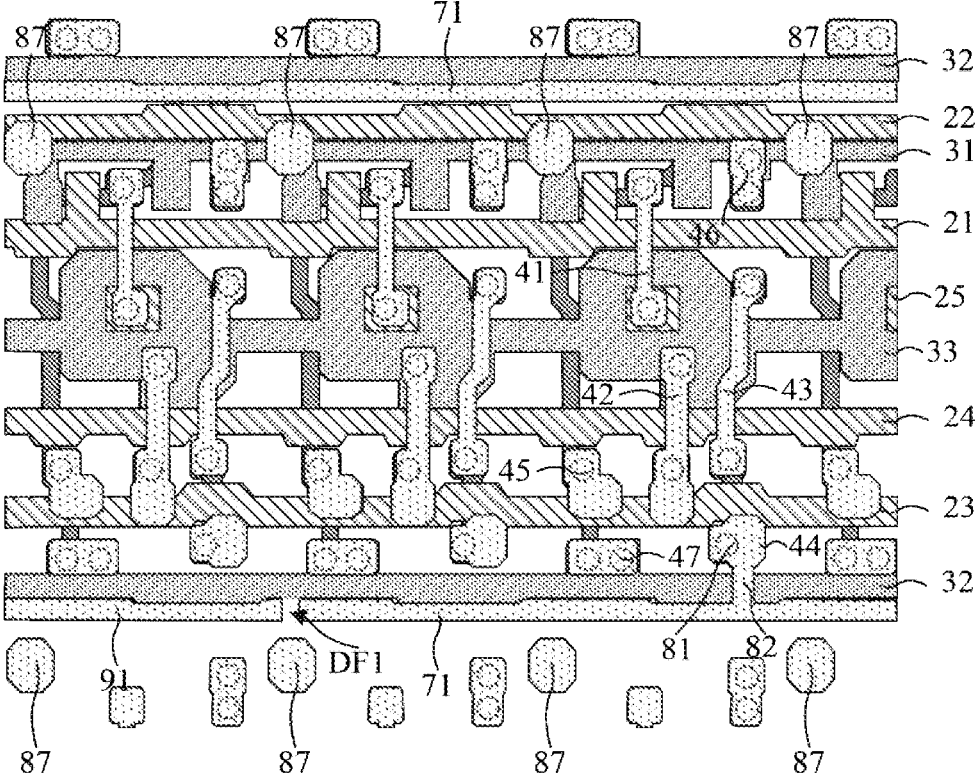
Figure 15E:
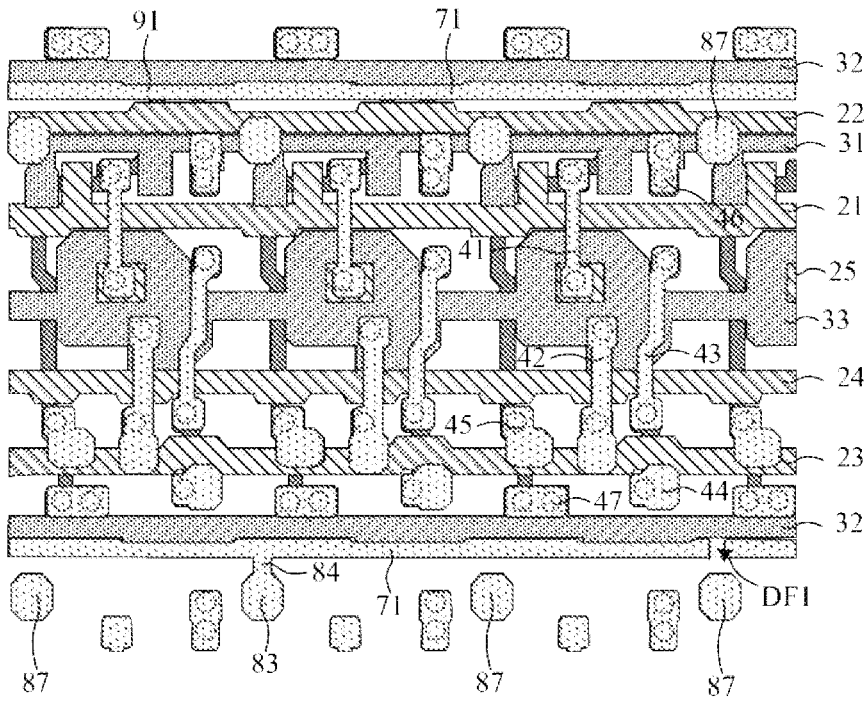
Figure 15F:
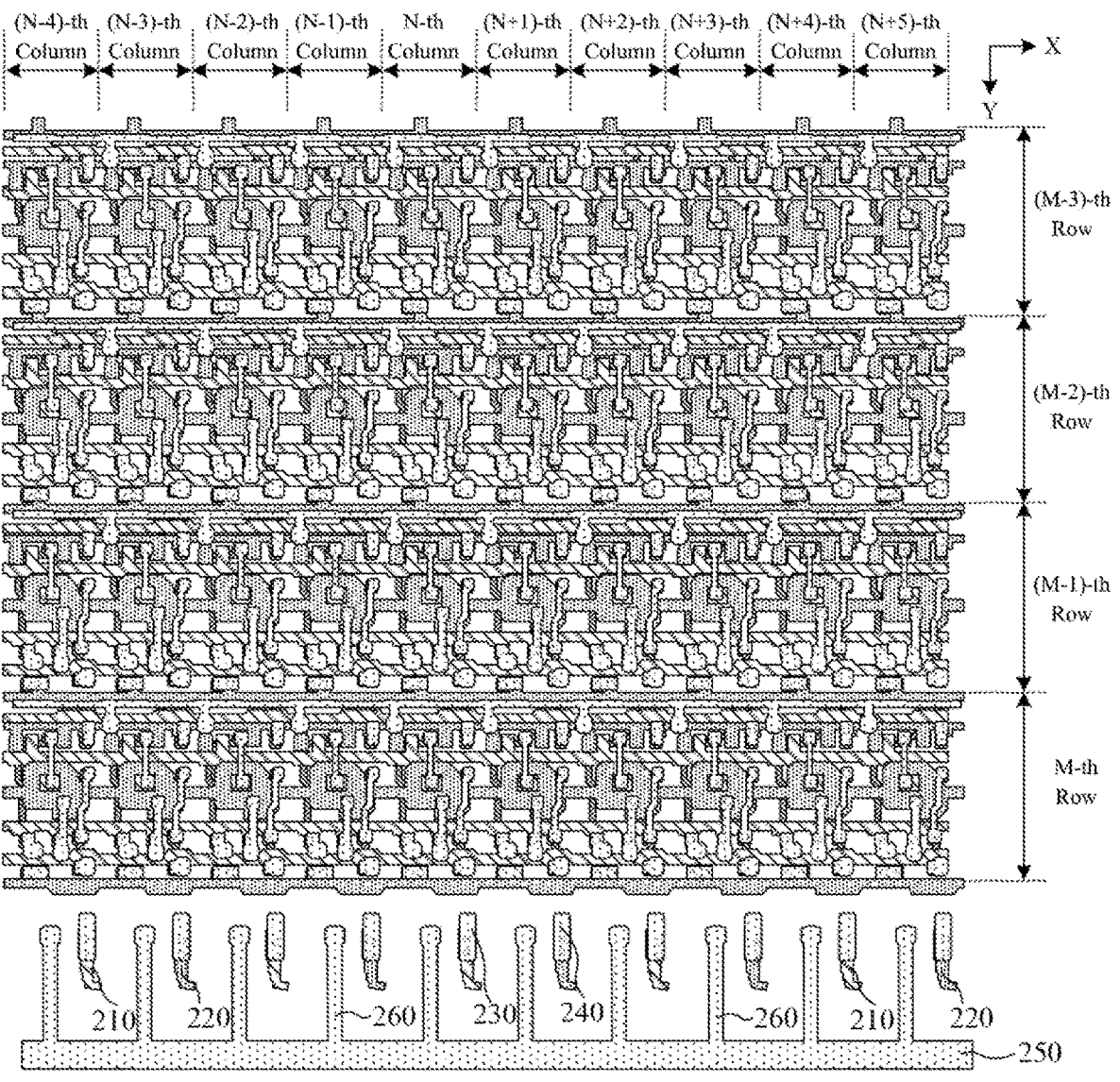

(5) A pattern of a third conductive layer is formed. In an exemplary embodiment, forming the pattern of the third conductive layer may include: depositing a third conductive thin film on the base substrate on which the aforementioned patterns are formed, and patterning the third conductive thin film through a patterning process to form a third conductive layer arranged on the fourth insulation layer. As shown in FIG. 15*a* to FIG. 15*f,* FIG. 15*a* is an enlarged view of the E0 region in FIG. 10, FIG. 15*b* is an enlarged view of the E1 region in FIG. 10, FIG. 15*c* is an enlarged view of the E2 region in FIG. 10, FIG. 15*d* is an enlarged view of the E3 region in FIG. 10, FIG. 15*e* is an enlarged view of the E4 region in FIG. 10, and FIG. 15*f* is an enlarged view of the F region in FIG. 10. In an exemplary embodiment, the third conductive layer may be referred to as a first source-drain metal layer (SD1).

In an exemplary embodiment, the pattern of the third conductive layer of each of the plurality of circuit units in the display area may include a first connection electrode 41, a second connection electrode 42, a third connection electrode 43, a fourth connection electrode 44, a fifth connection electrode 45, a sixth connection electrode 46 and a seventh connection electrode 47.

In an exemplary embodiment, a shape of the first connection electrode 41 may be a strip shape of which the main body portion extends along the second direction Y, a first end of the first connection electrode 41 is connected to the plate 25 through the first via hole V1, and a second end of the first connection electrode 41 is connected to the second region of the first active layer (also the first region of the second active layer) through the ninth via hole V9. In an exemplary embodiment, the first connection electrode 41 may serve as the second electrode of the first transistor T1 and the first electrode of the second transistor T2, so that the first plate 25, the second electrode of the first transistor T1 and the first electrode of the second transistor T2 have a same potential (a second node N2).

In an exemplary embodiment, a shape of the second connection electrode 42 may be a strip shape of which the main body portion extends along the second direction Y, a first end of the second connection electrode 42 is connected to the second plate 33 through the second via hole V2, and a second end of the second connection electrode 42 is connected to the first region of the fifth active layer through the third via hole V3. In an exemplary embodiment, the second connection electrode 42 may serve as the first electrode of the fifth transistor T5, so that the second plate 33 and the first electrode of the fifth transistor T5 have a same potential, and the second connection electrode 42 is configured to connect with a first power supply line to be formed subsequently.

In an exemplary embodiment, a shape of the third connection electrode 43 may be a strip shape of which the main body portion extends along the second direction Y, a first end of the third connection electrode 43 is connected to the first region of the third active layer through the seventh via hole V7, and a second end of the third connection electrode 43 is connected to the second region of the fourth active layer through the eighth via hole V8. In an exemplary embodiment, the third connection electrode 43 may serve as the first electrode of the third transistor T3 (also the second electrode of the fourth transistor T4), so that the first electrode of the third transistor T3, the second electrode of the fourth transistor T4 and the second electrode of the fifth transistor T5 have a same potential (the first node N1).

In an exemplary embodiment, a shape of the fourth connection electrode 44 may be a rectangular shape, and the fourth connection electrode 44 is connected to the first region of the fourth active layer through the fifth via hole V5. The fourth connection electrode 44 may serve as the first electrode of the fourth transistor T4, and the fourth transistor T4 is configured to be connected to a data signal line to be formed subsequently.

In an exemplary implementation, a shape of the fifth connection electrode 45 may be a strip shape, and the fifth connection electrode 45 is connected to the second region of the sixth active layer (also the first region of the seventh active layer) through the fourth via hole V4. The fifth connection electrode 45 may serve as the second electrode of the sixth transistor T6 (also the first electrode of the seventh transistor T7), and the fifth connection electrode 45 is configured to be connected to an anode connection electrode to be formed subsequently.

In an exemplary embodiment, a shape of the sixth connection electrode 46 may be a rectangular shape, a first end of the sixth connection electrode 46 is connected to the first region of the first active layer through the tenth via hole V10, and a second end of the sixth connection electrode 46 is connected to the first initial signal line 31 through the eleventh via hole V11. The sixth connection electrode 46 may serve as the first electrode of the first transistor T1, so that the first initial signal line 31 can write a first initial signal into the first electrode of the first transistor T1.

In an exemplary embodiment, a shape of the seventh connection electrode 47 may be a rectangular shape, a first end of the seventh connection electrode 47 is connected to the first region of the seventh active layer through the sixth via hole V6, and a second end of the seventh connection electrode 47 is connected to the second initial signal line 32 through the twelfth via hole V12. The seventh connection electrode 47 may serve as the first electrode of the seventh transistor T7, so that the second initial signal line 32 can write a second initial signal into the first electrode of the seventh transistor T7.

As shown in FIG. 15*a*, in an exemplary embodiment, the pattern of the third conductive layer of the plurality of circuit units in the third region may further include a first power supply trace 91, a power supply connection electrode 85 and a power supply connection block 86.

In an exemplary embodiment, a shape of the first power supply trace 91 may be a line shape of which the main body portion extends along the first direction X, and the first power supply trace 91 may be arranged on a side of the second scan signal line 22 away from the first scan signal line 21. In an exemplary embodiment, the first power supply trace 91 may be connected to a bezel power supply lead of the bezel area, and is configured to transmit a low-voltage signal (VSS).

In an exemplary embodiment, a shape of the power supply connection electrode 85 may be a rectangular shape, and the power supply connection electrode 85 may be arranged on a side of the first power supply trace 91 close to the first scan signal line 21. In an exemplary embodiment, the power supply connection electrode 85 is configured to be connected to a second power supply trace to be formed subsequently.

In an exemplary embodiment, the power supply connection block 86 is arranged between the first power supply trace 91 and the power supply connection electrode 85, a first end of the power supply connection block 86 is connected to the first power supply trace 91, and a second end of the power supply connection block 86 is connected to the power supply connection electrode 85, thereby achieving connection between the first power supply trace 91 and the power supply connection electrode 85.

In an exemplary embodiment, the first power supply trace 91, the power supply connection electrode 85 and the power supply connection block 86 of one circuit row in the third region may be of an integral structure connected to each other.

As shown in FIG. 15b, in an exemplary embodiment, the pattern of the third conductive layer of the plurality of circuit units in the first region may further include a first connection line 71 and a dummy electrode 87.

In an exemplary embodiment, a shape of the first connection line 71 of the data connection line may be a line shape of which the main body portion extends along the first direction X, and the first power supply trace 91 may be arranged on a side of the second scan signal line 22 away from the first scan signal line 21. In an exemplary embodiment, the first connection line 71 is configured to be connected to a second connection line of the data connection line to be formed subsequently.

In an exemplary embodiment, positions and shapes of dummy electrodes 87 of the plurality of circuit units in the first region may be substantially the same as the positions and shapes of the power supply connection electrodes 85 in the third region, but the difference is that the dummy electrodes 87 are arranged in isolation and are neither connected to the first connection line 71 nor to other electrodes. In an exemplary embodiment, the dummy electrodes 87 exhibits the same morphology and structure as the power supply connection electrodes and the data connection electrodes, which may not only improve the uniformity of the manufacturing process, but also make different regions have substantially the same switching connection structure and may achieve substantially the same display effect under the transmitted light and the reflected light, thus effectively avoiding a poor appearance of the display substrate and improving the display quality.

As shown in FIG. 15c, in an exemplary embodiment, the pattern of the third conductive layer of the plurality of circuit units in the second region further includes a first power supply trace 91 and a dummy electrode 87.

In an exemplary embodiment, positions and shapes of the first power supply traces 91 of the plurality of circuit units in the second region may be substantially the same as the positions and shapes of the first power supply traces 91 in the third region, and positions, shapes and functions of the dummy electrodes 87 of the plurality of circuit units in the second region may be substantially the same as those of the power supply connection electrodes 85 in the first region.

As shown in FIG. 15d, in an exemplary embodiment, the pattern of the third conductive layer of at least one circuit unit in a junction region between the first region and the third region may further include a first connection line 71, a data connection electrode 81 and a data connection block 82.

In an exemplary embodiment, the junction region between the first region and the third region may at least include one circuit unit of the first region, at least one circuit unit and a first connection unit of the third region, wherein the first connection unit may be a circuit unit where the data signal line and the first connection line can be connected through a first connection hole.

In an exemplary embodiment, the first connection unit may include the first connection line 71, the data connection electrode 81 and the data connection block 82. The circuit unit of the first region may include a first connection line 71 and a dummy electrode 87 which are located on a right side of the first connection unit. The circuit unit of the third region may include a first power supply trace 91 and a dummy electrode 87 which are located on a left side of the first connection unit.

In an exemplary embodiment, a shape of the data connection electrode 81 may be a rectangular shape, and the data connection electrode 81 may be arranged on a side of the first connection line 71 away from the dummy electrode 87. A shape of the data connection block 82 may be a rectangular shape, and the data connection block 82 may be arranged between the first connection line 71 and the data connection electrode 81. A first end of the data connection block 82 is connected to the first connection line 71 and a second end of the data connection block 82 is connected to the data connection block 82, thereby achieving the connection between the first connection line 71 and the data connection electrode 81. In an exemplary embodiment, the data connection electrode 81 is configured to be connected to a data signal line to be formed subsequently.

In an exemplary embodiment, the data connection electrode 81 may be connected to a fourth connection electrode 44 in the pixel drive circuit.

In an exemplary embodiment, the fourth connection electrode 44 in the pixel drive circuit may serve as the data connection electrode 81, that is, the data connection electrode 81 and the fourth connection electrode 44 (the first electrode of the fourth transistor) are of a common structure.

In an exemplary embodiment, at least one circuit unit in the third region adjacent to the first connection unit may be provided with at least one first fracture DF1, and the at least one first fracture DF1 cuts off the first connection line 71 and the first power supply trace 91 in the same circuit row. The first connection line 71 is located on a side of the at least one first fracture DF1 in the first direction X, and the first power supply trace 91 is located on a side of the at least one first fracture DF1 in the opposite direction of the first direction X.

As shown in FIG. 15e, in an exemplary embodiment, the pattern of the third conductive layer of at least one circuit unit in a junction region between the first region and the second region may further include a first connection line 71, a fan-out connection electrode 83 and a fan-out connection block 84.

In an exemplary embodiment, the junction region between the first region and the second region may at least include one circuit unit of the first region, at least one circuit unit and a second connection unit of the second region. The second connection unit may be a circuit unit where the first connection line and the second connection line can be connected through a second connection hole.

In an exemplary embodiment, the second connection unit may include a first connection line 71, a fan-out connection electrode 83 and a fan-out connection block 84. The circuit unit of the first region may include a first connection line 71 and a dummy electrode 87 which are located on a left side of the first connection unit. The circuit unit of the second region may include a first power supply trace 91 and a dummy electrode 87 which are located on a lower side of the second connection unit.

In an exemplary embodiment, a shape of the fan-out connection electrode 83 may be a rectangular shape, and the fan-out connection electrode 83 may be arranged on a side of the first connection line 71 away from the second initial signal line 32. A shape of the fan-out connection block 84 may be a rectangular shape, and the fan-out connection block 84 may be arranged between the first connection line 71 and the fan-out connection electrode 83. A first end of the fan-out connection block 84 is connected to the first connection line 71 and a second end of the fan-out connection block 84 is connected to the fan-out connection electrode 83, thereby achieving the connection between the first connection line 71 and the fan-out connection electrode 83. In an exemplary embodiment, the fan-out connection electrode 83 is configured to be connected to a second connection line to be formed subsequently.

In an exemplary embodiment, at least one circuit unit in a first region adjacent to the second connection unit may be provided with at least one first fracture DF1. The at least one first fracture DF1 cuts off the first connection line 71 and the first power supply trace 91 in a same circuit row, wherein the first connection line 71 is located on a side of the at least one first fracture DF1 in the first direction X, and the first power supply trace 91 is located on a side of the at least one first fracture DF1 in the opposite direction of the first direction X.

As shown in FIG. 15f, in an exemplary embodiment, the pattern of the third conductive layer of the lead region in the bonding area at least includes a plurality of third lead electrodes 230, a plurality of fourth lead electrodes 240, a bonding high-voltage line 250 and a plurality of bonding high-voltage electrodes 260.

In an exemplary embodiment, a shape of each third lead electrode 230 may be a strip shape extending along the second direction Y, positions of the plurality of third lead electrodes 230 may correspond to positions of the plurality of first lead electrodes 210. An orthographic projection of the third lead electrodes 230 on the base substrate is at least partially overlapped with an orthographic projection of the first lead electrodes 210 on the base substrate, and the third lead electrodes 230 are connected to the first lead electrodes 210 through the thirteenth via holes V13. In an exemplary embodiment, the plurality of third lead electrodes 230 are configured to be correspondingly connected to data signal lines of odd-numbered unit columns to be formed subsequently.

In an exemplary embodiment, a shape of each fourth lead electrode 240 may be a strip shape extending along the second direction Y, positions of the plurality of fourth lead electrodes 240 may correspond to positions of the plurality of second lead electrodes 220. An orthographic projection of the fourth lead electrodes 240 on the base substrate is at least partially overlapped with an orthographic projection of the second lead electrodes 220 on the base substrate, and the fourth lead electrodes 240 are connected to the second lead electrodes 220 through the fourteenth via holes V14. In an exemplary embodiment, the plurality of fourth lead electrodes 240 are configured to be correspondingly connected to data signal lines of even-numbered unit columns to be formed subsequently.

In an exemplary embodiment, a shape of the bonding high-voltage line 250 may be a strip shape extending along the first direction X, and the bonding high-voltage line 250 is configured to continuously provide a high-level signal to the plurality of first power supply lines of the display area.

In an exemplary embodiment, a shape of each bonding high-voltage electrode 260 may be a strip shape extending along the second direction Y, and the plurality of bonding high-voltage electrodes 260 may be arranged sequentially along the first direction X. First ends of the plurality of bonding high-voltage electrodes 260 are connected to the bonding high-voltage line 250, and second ends of the plurality of bonding high-voltage electrodes 260 extend towards the display area. In an exemplary embodiment, the plurality of bonding high-voltage electrodes 260 are configured to be connected correspondingly to the plurality of first power supply lines to be formed subsequently.

(6) A pattern of a first planarization layer is formed. In an exemplary embodiment, forming the pattern of the first planarization layer may include: coating the first planarization thin film on the base substrate on which the aforementioned pattern is formed, and patterning the first planarization thin film through a patterning process to form the first planarization layer covering the third conductive layer, wherein a plurality of via holes are provided on the first planarization layer. As shown in FIG. 16a to FIG. 16f, FIG. 16a is an enlarged view of the E0 region in FIG. 10, FIG. 16b is an enlarged view of the E1 region in FIG. 10, FIG. 16c is an enlarged view of the E2 region in FIG. 10, FIG. 16d is an enlarged view of the E3 region in FIG. 10, FIG. 16e is an enlarged view of the E4 region in FIG. 10, and FIG. 16f is an enlarged view of the F region in FIG. 10.

In an exemplary embodiment, the plurality of via holes of each of the plurality of circuit units in the display area include a twenty-first via hole V21, a twenty-second via hole V22 and a twenty-third via hole V23.

In an exemplary embodiment, an orthographic projection of the twenty-first via hole V21 on the base substrate is located within a range of an orthographic projection of the second connection electrode 42 on the base substrate, the first planarization layer within the twenty-first via hole V21 is removed to expose a surface of the second connection electrode 42, and the twenty-first via hole V21 is configured such that a first power supply line to be formed subsequently is connected to the second connection electrode 42 through the via hole V21.

In an exemplary embodiment, an orthographic projection of the twenty-second via hole 22 on the base substrate is located within a range of an orthographic projection of the fourth connection electrode 44 on the base substrate, the first planarization layer within the twenty-second via hole V22 is removed to expose a surface of the fourth connection electrode 44, and the twenty-second via hole V22 is configured such that a data signal line to be formed subsequently is connected to the fourth connection electrode 44 through the via hole V22.

In an exemplary embodiment, an orthographic projection of the thirteenth via hole V23 on the base substrate is located within a range of an orthographic projection of the fifth connection electrode 45 on the base substrate, the first planarization layer within the twenty-third via hole V23 is removed to expose a surface of the fifth connection electrode 45, and the twenty-third via hole V23 is configured such that an anode connection electrode to be formed subsequently is connected to the fifth connection electrode 45 through the via hole V23.

Figure 16A:
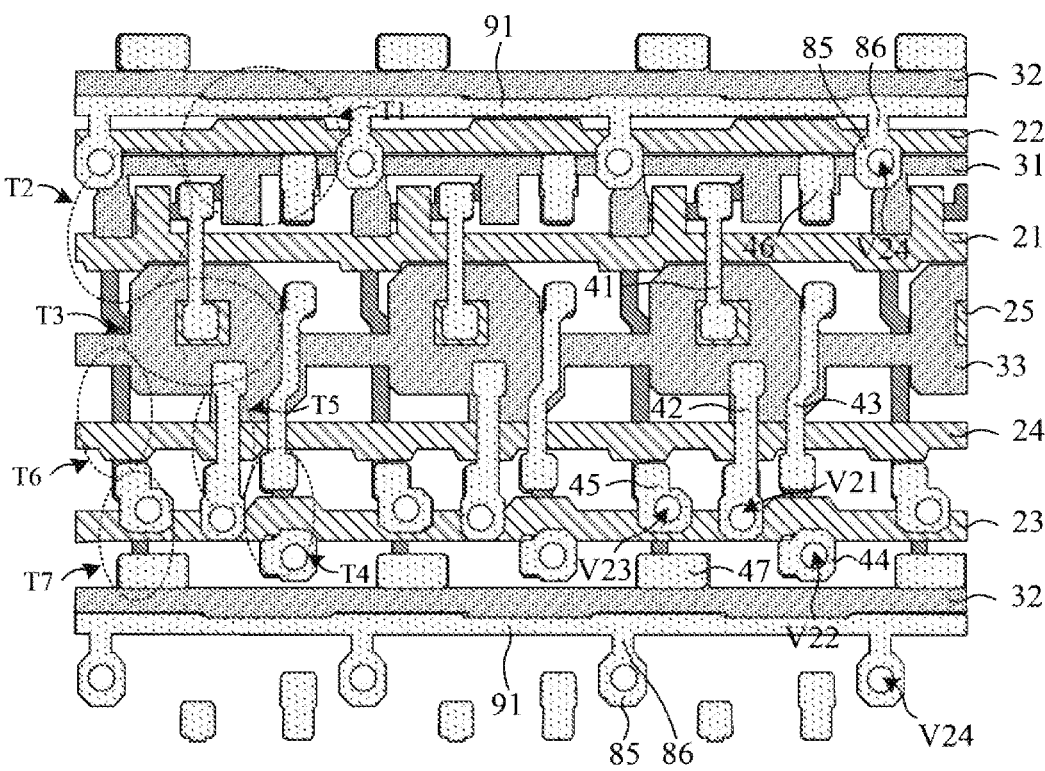
FIG. 16a to FIG. 16f are schematic diagrams of a display substrate after a pattern of a first planarization layer is formed according to the present disclosure.
Figure 16B:
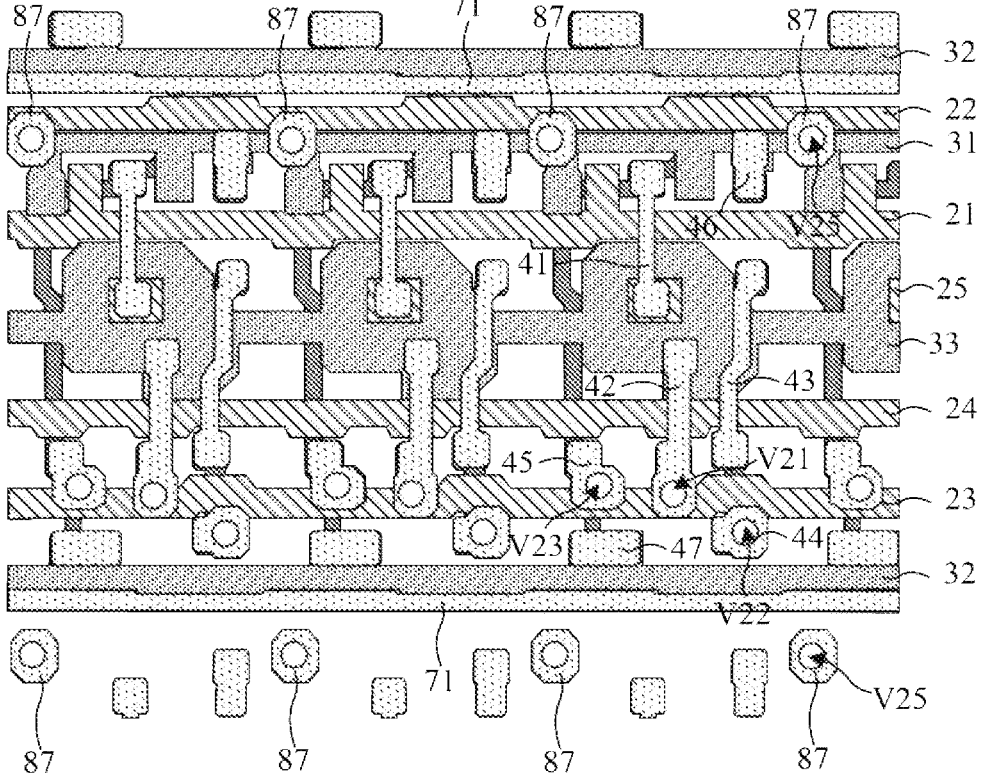
Figure 16C:
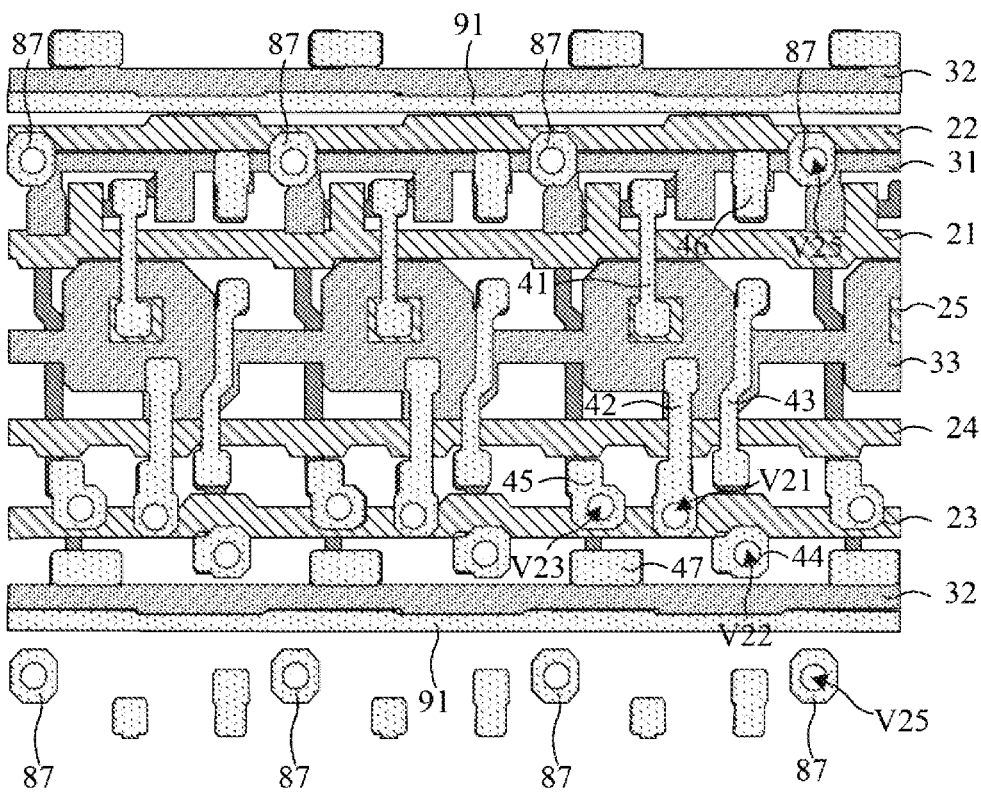
Figure 16D:
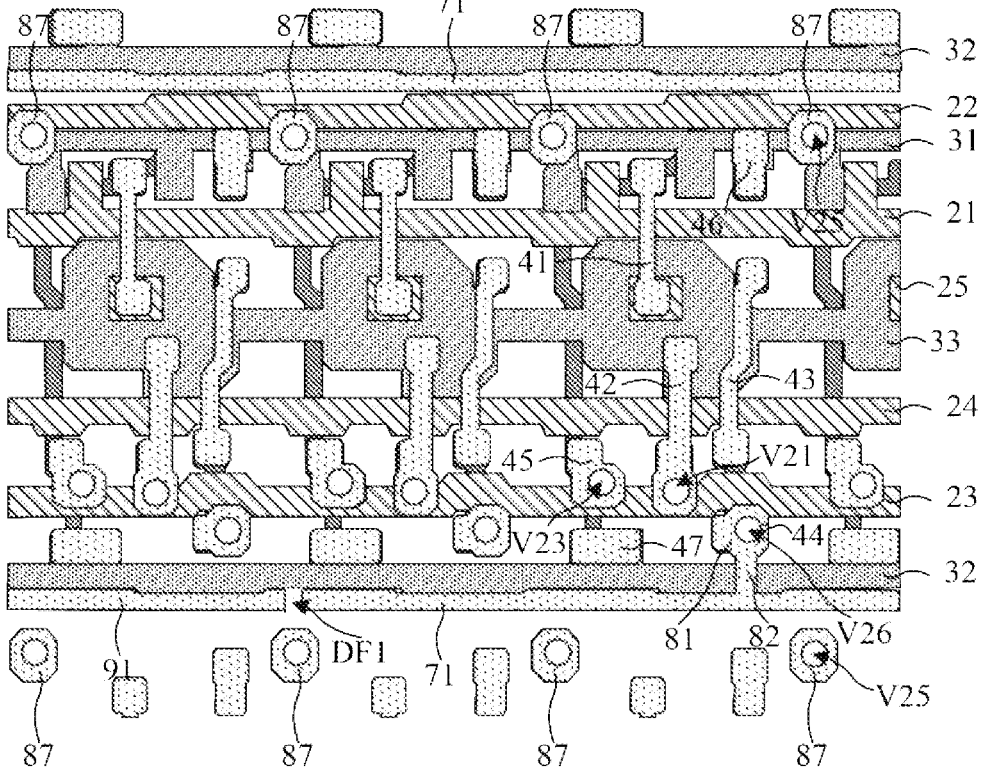
Figure 16E:
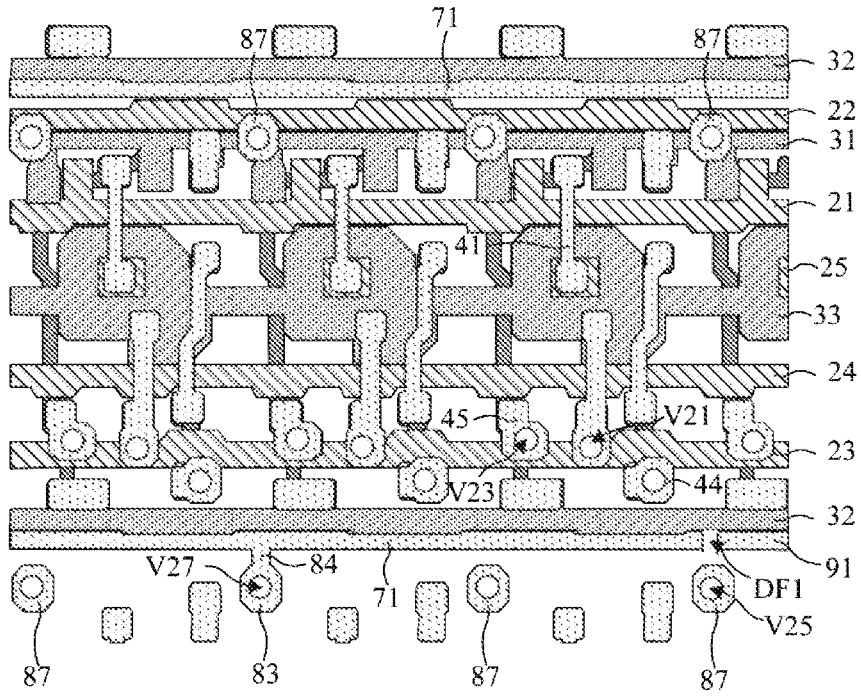
Figure 16F:
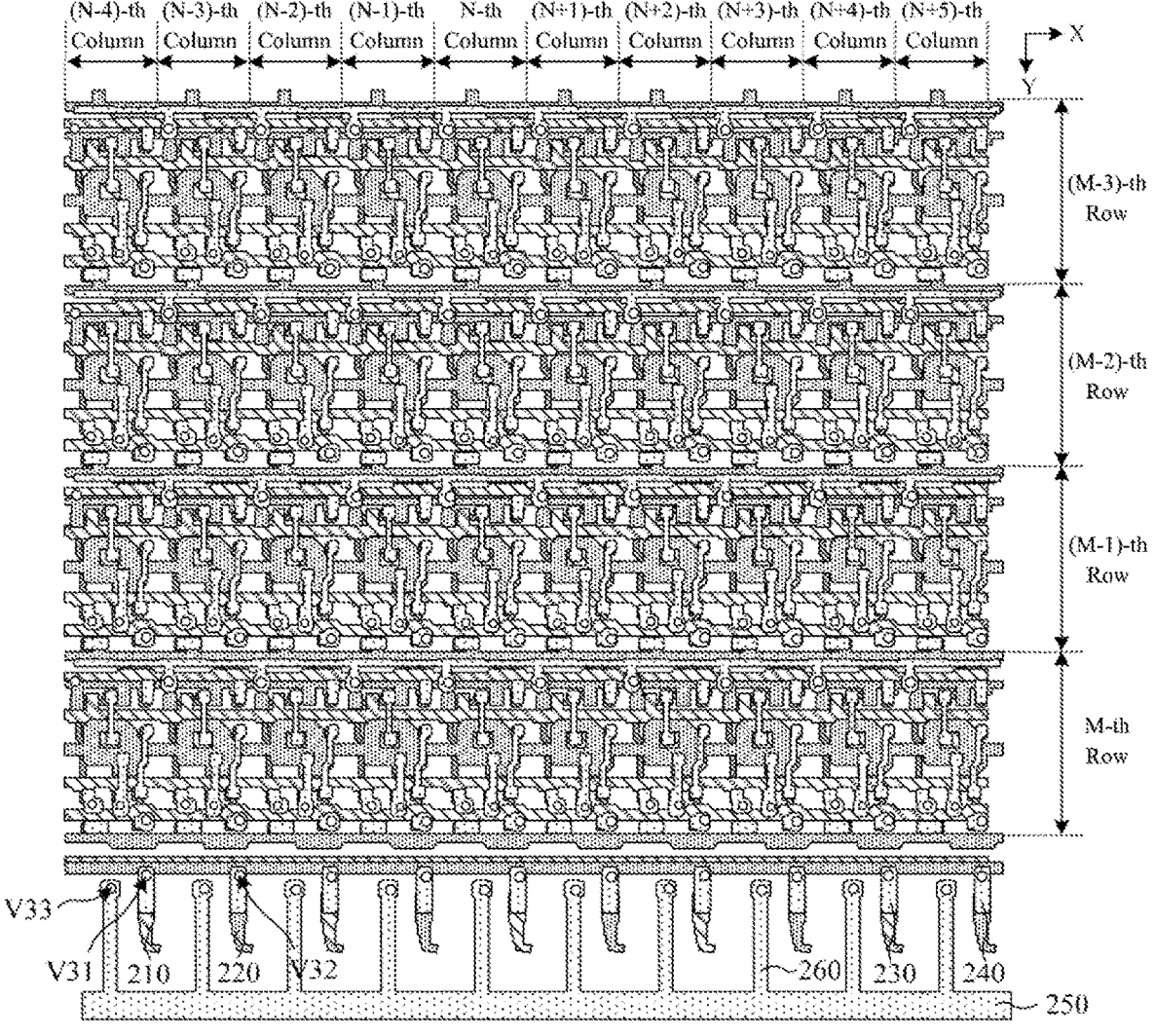

As shown in FIG. 16a, in an exemplary embodiment, the plurality of circuit units in the third region further include a twenty-fourth via hole V24.

In an exemplary embodiment, an orthographic projection of the twenty-fourth via hole V24 on the base substrate is located within a range of an orthographic projection of the power supply connection electrode 85 on the base substrate, the first planarization layer within the twenty-fourth via hole V24 is etched away to expose a surface of the power supply connection electrode 85, and the twenty-fourth via hole V24 is configured such that a second power supply trace to be formed subsequently is connected to the power supply connection electrode 85 through the via hole V24. In an exemplary embodiment, the twenty-fourth via hole V24 may be referred to as a third connection hole.

As shown in FIG. 16b and FIG. 16c, in an exemplary embodiment, the plurality of circuit units in the first region and the plurality of circuit units in the second region further include a twenty-fifth via hole V25.

In an exemplary embodiment, an orthographic projection of the twenty-fifth via hole V25 on the base substrate is located within a range of an orthographic projection of the dummy electrode 87 on the base substrate, the first planarization layer within the twenty-fifth via hole V25 is etched away to expose a surface of the dummy electrode 87, and the twenty-fifth via hole V25 is configured such that the second power supply trace to be formed subsequently is connected to the dummy electrode 87 through the via hole V25.

As shown in FIG. 16d, in an exemplary embodiment, at least one circuit unit of the junction region between the first region and the third region further includes a twenty-sixth via hole V26.

In an exemplary embodiment, an orthographic projection of the twenty-six via hole 26 on the base substrate is located within a range of an orthographic projection of the data connection electrode 81 on the base substrate, the first planarization layer within the twenty-sixth via hole V26 is removed to expose a surface of the data connection electrode 81, and the twenty-sixth via hole V26 is configured such that a data signal line to be formed subsequently is connected to the data connection electrode 81 through the via hole V26.

In an exemplary embodiment, the twenty-sixth via hole V26 and the twenty-second via hole V22 may be of a common structure of the same hole. In an exemplary embodiment, the twenty-sixth via hole V26 may be referred to as a first connection hole.

As shown in FIG. 16e, in an exemplary embodiment, the at least one circuit unit of the junction region between the first region and the second region further includes a twenty-seventh via hole V27.

In an exemplary embodiment, an orthographic projection of the twenty-seventh via hole V27 on the base substrate is located within a range of an orthographic projection of the fan-out connection electrode 83 on the base substrate, the first planarization layer within the twenty-seventh via hole V27 is etched away to expose a surface of the fan-out connection electrode 83, and the twenty-seventh via hole V27 is configured such that a second connection line to be formed subsequently is connected to the fan-out connection electrode 83 through the via hole V27. In an exemplary embodiment, the twenty-seventh via hole V27 may be referred to as a second connection hole.

In an exemplary embodiment, the twenty-sixth via hole V26 may be located on a side of the first connection line 71 in the opposite direction of the second direction Y, and the twenty-seventh via hole V27 may be located on a side of the first connection line 71 in the second direction Y, that is, the first connection hole (the twenty-sixth via hole V26) and the second connection hole (the twenty-seventh via hole V27) connecting the same first connection line 71 are provided on two sides of the first connection line 71 in the second direction Y respectively.

As shown in FIG. 16f, in an exemplary embodiment, the plurality of via holes of the lead region in the bonding area at least include a thirty-first via hole V31, a thirty-second via hole V32 and a thirty-third via hole V33.

In an exemplary embodiment, an orthographic projection of the thirty-first via hole 31 on the base substrate is located within a range of an orthographic projection of a third lead electrode 230 on the base substrate, the first planarization layer within the thirty-first via hole V31 is removed to expose a surface of the third lead electrode 230, and the thirty-first via hole V31 is configured such that a data signal line of an odd-numbered column to be formed subsequently in the display area is connected to the third lead electrode 230 through the via hole V31.

In an exemplary embodiment, an orthographic projection of the thirty-second via hole 32 on the base substrate is located within a range of an orthographic projection of a fourth lead electrode 240, the first planarization layer within the thirty-second via hole V32 is removed to expose a surface of the fourth connection electrode 240, and the thirty-second via hole V32 is configured such that a data signal line of an even-numbered column to be formed subsequently in the display area is connected to the fourth lead electrode 240 through the via hole V32.

In an exemplary embodiment, an orthographic projection of the thirty-third via hole V33 on the base substrate is located within a range of an orthographic projection of the bonding high-voltage electrode 260 on the base substrate, the first planarization layer within the thirty-third via hole V33 is removed to expose a surface of the bonding high-voltage electrode 260, and the thirty-third via hole V33 is configured such that a first power supply line to be formed subsequently in the display area is connected to the bonding high-voltage electrode 260 through the via hole V33.

(7) A pattern of a fourth conductive layer is formed. In an exemplary embodiment, forming the pattern of the fourth conductive layer may include: depositing a fourth conductive thin film on the base substrate on which the aforementioned patterns are formed, and patterning the fourth conductive thin film through a patterning process to form a fourth conductive layer arranged on the first planarization layer. As shown in FIG. 17a to FIG. 17f, FIG. 17a is an enlarged view of the E0 region in FIG. 10, FIG. 17b is an enlarged view of the E1 region in FIG. 10, FIG. 17c is an enlarged view of the E2 region in FIG. 10, FIG. 17d is an enlarged view of the E3 region in FIG. 10, FIG. 17e is an enlarged view of the E4 region in FIG. 10, and FIG. 17f is an enlarged view of the F region in FIG. 10. In an exemplary embodiment, the fourth conductive layer may be referred to as a second source-drain metal layer (SD2).

In an exemplary embodiment, the pattern of the fourth conductive layer of each of the plurality of circuit units in the display area includes a first power supply line 51, an anode connection electrode 52 and a data signal line 60.

In an exemplary embodiment, a shape of the first power supply line 51 may be a polygonal shape of which the main body portion extends along the second direction Y. On the one hand, the first power supply line 51 is connected to the second connection electrode 42 through the twenty-first via hole V21 in the display area, and on the other hand, after extending to the lead region, the first power supply line 51 is connected to the bonding high-voltage electrode 260 through the thirty-third via hole V33 of the lead region. Since the second connection electrode 42 is respectively connected to the second plate and the first region of the fifth active layer through a via hole, the first power supply line 51 can write a power supply signal into the first electrode of the fifth transistor T5, and the second plate of the storage capacitor has a same potential as the first power supply line 51. Since the bonding high-voltage electrode 260 is connected to the bonding high-voltage line 250, the bonding high-voltage line 250 can provide a high-level signal to the first power supply line 51 through the bonding high-voltage electrode 260.

In an exemplary embodiment, an orthographic projection of the first power supply line 51 on the base substrate is at least partially overlapped with an orthographic projection of the first connection electrode 41 on the base substrate. The first power supply line 51 may effectively shield influence of data voltage jump on the second node N2 in the pixel drive circuit, which avoids the influence of data voltage jump on the potential of the second node N2, and improves the display effect.

In an exemplary implementation, an orthographic projection of the first power supply line 51 on the base substrate is at least partially overlapped with an orthographic projection of the second connection electrode 42 on the base substrate.

In an exemplary embodiment, the first power supply line 51 may have an unequal width design, and the first power supply line 51 with the unequal width design may not only facilitate a layout of the pixel structure, but also reduce a parasitic capacitance between the first power supply line and the data signal line.

In an exemplary embodiment, a shape of a data signal line 60 may be a straight line of which the main body portion extends along the second direction Y. On one hand, the data signal line 60 is connected to the fourth connection electrode 44 through the twenty-second via hole V22 of the display area, and on the other hand, after the data signal lines 60 extend to the lead region, a data signal line 60 of an odd-numbered unit column is connected to the third lead electrode 230 through the thirty-first via hole V31, and a data signal line 60 of an even-numbered unit column is connected to the fourth lead electrode 240 through the thirty-second via hole V32. Since the fourth connection electrode 44 is connected to the first region of the fourth active layer through the via hole, the data signal line 60 can write a data signal into the first electrode of the fourth transistor T4.

In the exemplary embodiment, since the third lead electrode 230 is connected to the first lead electrode 210 through the via hole, and the first lead electrode 210 is connected to the first lead-out line, the connection between the data signal lines 60 of the odd-numbered unit columns and the first lead-out line located in the first conductive layer (GATE1) is achieved. Since the fourth lead electrode 240 is connected to the second lead electrode 220 through the via hole, and the second lead electrode 220 is connected to the second lead-out line, the connection between the data signal line 60 of the even-numbered unit column and the second lead-out line located in the second conductive layer (GATE2) is achieved.

In an exemplary embodiment, in the lead region at a position corresponding to the third region in the display area, the plurality of lead-out lines may include a plurality of first lead-out lines arranged in the first conductive layer (GATE1) and a plurality of second lead-out lines arranged in the second conductive layer (GATE2). The plurality of first lead-out lines may be correspondingly connected to the data signal lines 60 of the odd-numbered unit columns through the first lead electrodes 210 and the third lead electrodes 230, and the plurality of second lead-out lines may be correspondingly connected to the data signal lines 60 of the even-numbered unit columns through the second lead electrodes 220 and the fourth lead electrodes 240. According to the present disclosure, the plurality of lead-out lines are arranged in two conductive layers, which may increase the widths of the lead-out lines on the premise of avoiding short circuit, and improve the reliability of data transmission.

In an exemplary embodiment, the plurality of first lead-out lines may be correspondingly connected to the data signal lines of even-numbered unit columns, and the plurality of second leads may be correspondingly connected to the data signal lines of odd-numbered unit columns, which is not limited here in the present disclosure.

In an exemplary embodiment, a shape of the anode connection electrode 52 may be rectangular, and the anode connection electrode 52 is connected to the fifth connection electrode 45 through the twenty-third via hole V23. In the exemplary embodiment, the anode connection electrode 52 is configured to be connected to an anode to be formed subsequently, and since the fifth connection electrode 45 is connected to the second region of the sixth active layer through the via hole, the anode can be connected to the second electrode of the sixth transistor T6 through the anode connection electrode 52 and the fifth connection electrode 45.

Figure 17A:
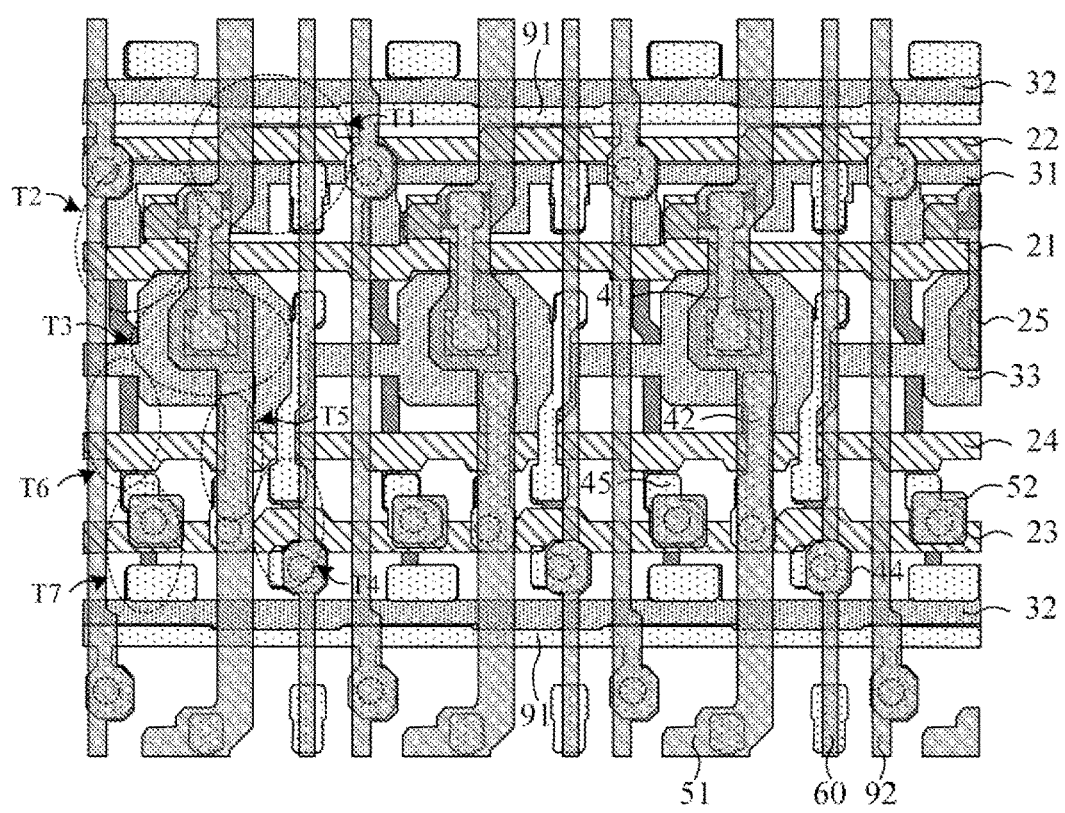
FIG. 17a to FIG. 17f are schematic diagrams of a display substrate after a pattern of a fourth conductive layer is formed according to the present disclosure.
Figure 17B:
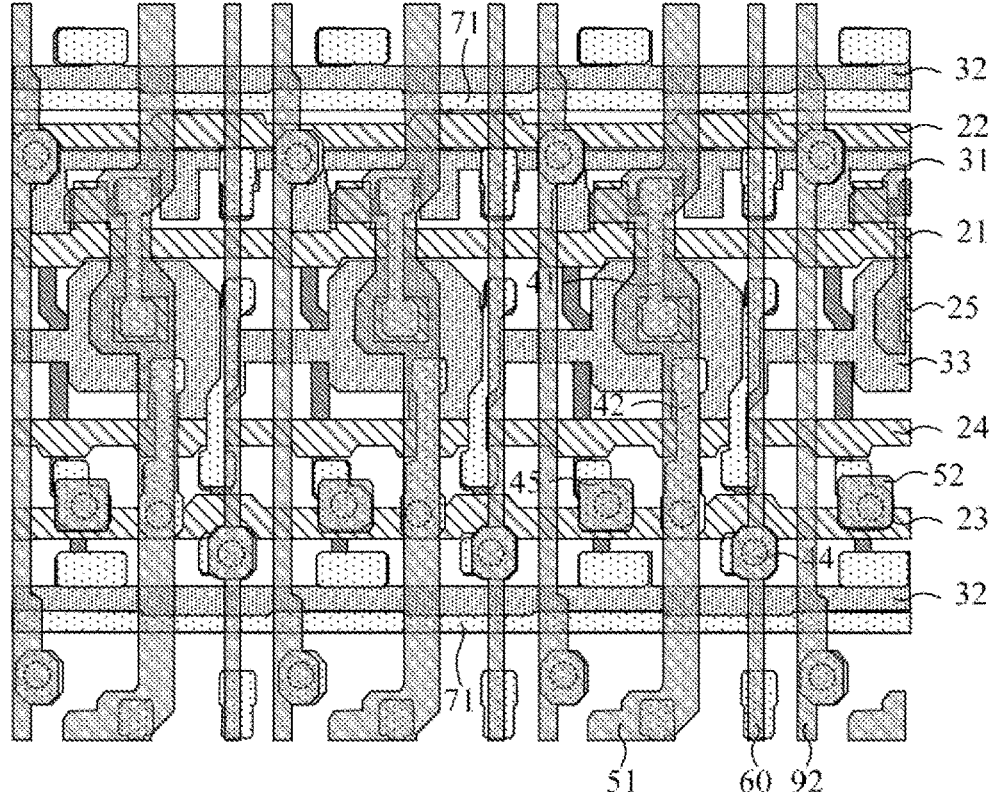
Figure 17C:
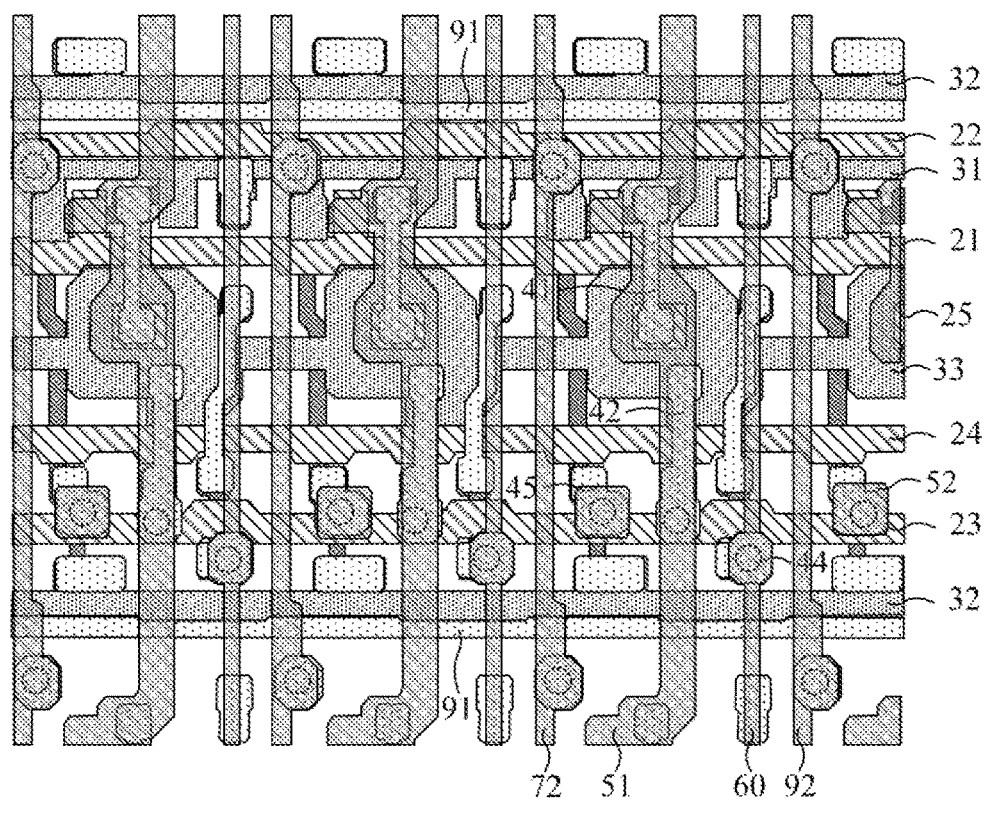
Figure 17D:
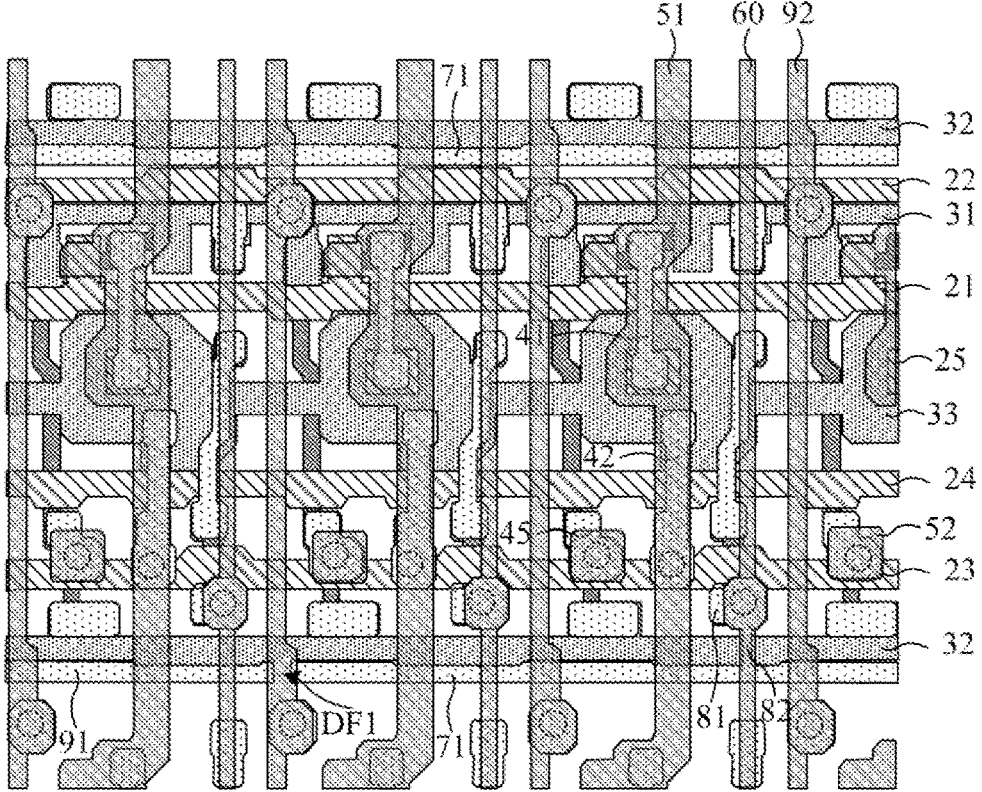
Figure 17E:
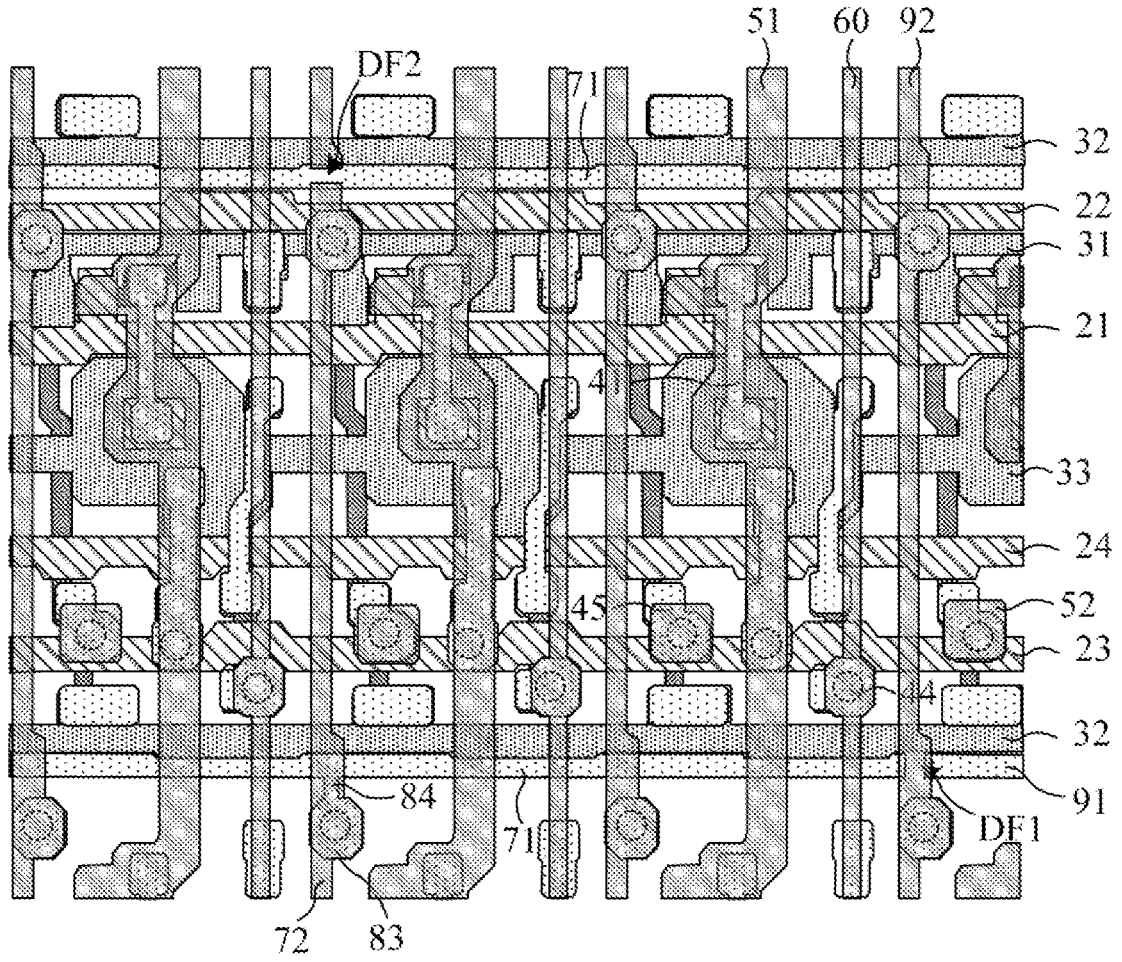
Figures 17F, 18A:
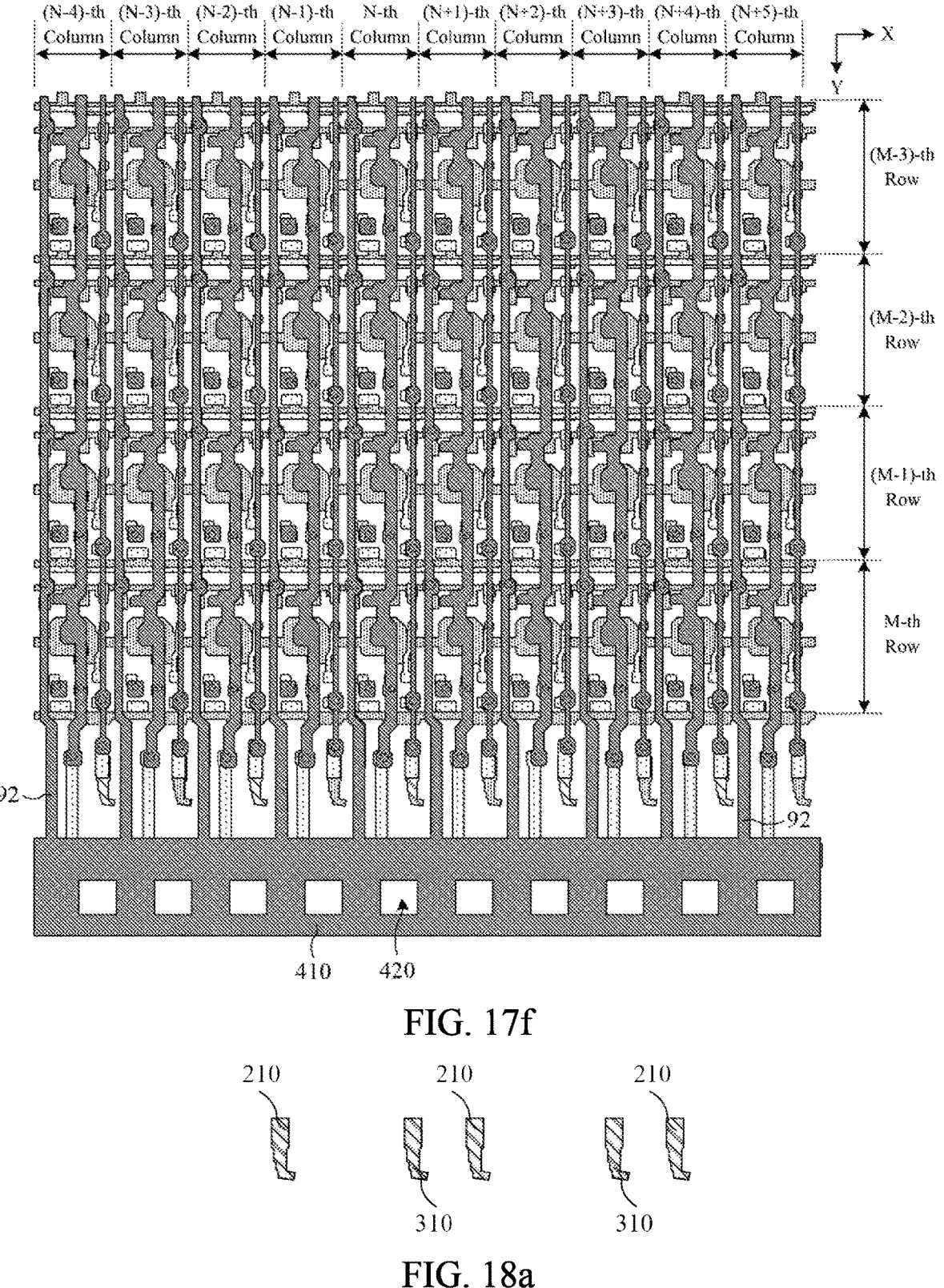
FIG. 18a to FIG. 18f are schematic diagrams of a structure of a lead region of a display substrate according to the present disclosure.

As shown in FIG. 17a, in an exemplary embodiment, the pattern of the fourth conductive layer of the plurality of circuit units in the third region may further include a second power supply trace 92.

In an exemplary embodiment, a shape of the second power supply trace 92 may be a straight line shape of which the main body portion extends along the second direction Y, and the second power supply trace 92 is connected to the power supply connection electrode 85 through the twenty-fourth via hole V24. Since the power supply connection electrode 85 is connected to the first power supply trace 91 through the power supply connection block 86, the second power supply trace 92 and the first power supply trace 91 are connected to each other, so that the first power supply trace 91 extending along the first direction X and the second power supply trace 92 extending along the second direction Y constitute a mesh communication structure. According to the present disclosure, the power supply traces with the mesh communication structure are arranged, and the power supply traces in a plurality of unit rows and a plurality of unit columns have a same potential, which not only effectively reduces the resistance of the power supply traces and reduces the voltage drop for transmitting low-voltage signals, but also effectively improves the uniformity of low-voltage signals in the display substrate, effectively improves the display uniformity, and improves the display quality.

As shown in FIG. 17b, in an exemplary embodiment, the pattern of the fourth conductive layer of the plurality of circuit units in the first region may further include a second power supply trace 92.

In an exemplary embodiment, the second power supply trace 92 is connected to the dummy electrode 87 through the twenty-fifth via hole V25.

In an exemplary embodiment, since positions and shapes of the dummy electrodes 87 are substantially the same as those of the power supply connection electrodes and the data connection electrodes, aperture connection structures of the second power supply traces 92 and the dummy electrodes 87 of the plurality of circuit units in the first region are substantially the same as aperture connection structures of the circuit units in the other regions, which may not only improve the uniformity of manufacturing process, but also achieve the same display effect in different regions under the transmitted light and the reflected light, and improve the uniformity of display picture.

As shown in FIG. 17c, in an exemplary embodiment, the pattern of the fourth conductive layer of at least one circuit unit in the second region may further include a second connection line 72, and other circuit units may include a second power supply trace 92.

In an exemplary embodiment, a shape of the second connection line 72 may be a straight line shape of which the main body portion extends along the second direction Y, and the second connection line 72 is connected to the dummy electrode 87 through the twenty-fifth via hole V25.

In an exemplary embodiment, the second power supply trace 92 is connected to the dummy electrode 87 through the twenty-fifth via hole V25.

As shown in FIG. 17d, in an exemplary embodiment, the data signal line 60 of the at least one circuit unit of the junction region between the first region and the third region is connected to the data connection electrode 81 through the twenty-sixth via hole V26. Since the data connection electrode 81 is connected to the first connection line 71 through the data connection block, the data signal line 60 can be connected to the first connection line 71.

In an exemplary embodiment, a second power supply trace 92 of other circuit units of the junction region between the first region and the third region are connected to the dummy electrode 87 through the twenty-fifth via hole V25.

In an exemplary embodiment, an orthographic projection of a first fracture DF1 located between the first connection line 71 and the first power supply line 91 on the base substrate is at least partially overlapped with an orthographic projection of the second power supply trace 92 on the base substrate.

In an exemplary embodiment, an orthographic projection of the first fracture DF1 on the base substrate may be located within a range of an orthographic projection of the second power supply trace 92 on the base substrate.

As shown in FIG. 17e, in an exemplary embodiment, the pattern of the fourth conductive layer of the second connection unit in the junction region between the first region and the second region may further include a second connection line 72.

In an exemplary embodiment, a shape of the second connection line 72 may be a straight line shape of which the main body portion extends along the second direction Y, and the second connection line 72 is connected to the fan-out connection electrode 83 through the twenty-seventh via hole V27. Since the fan-out connection electrode 83 is connected to the first connection line 71 through the fan-out connection block 84, the second connection line 72 and the first connection line 71 can be connected to each other. Since the first connection line 71 is connected to the data signal line, the data signal line 60 can be connected to the second connection line 72 through the first connection line 71.

In an exemplary embodiment, a second power supply trace 92 of the other circuit units of the junction region between the first region and the third region is connected to the dummy electrode 87 through the twenty-fifth via hole V25.

In an exemplary embodiment, at least one circuit unit of the first region adjacent to the second connection unit may be provided with at least one second fracture DF2. The at least one second fracture DF2 cuts off the second connection line 72 and the second power supply line 92 in a same circuit column, wherein the second connection line 72 is located on a side of the at least one second fracture DF2 in the second direction Y, and the second power supply trace 92 is located on a side of the at least one second fracture DF2 in the opposite direction of the second direction Y.

In an exemplary embodiment, an orthographic projection of the at least one second fracture DF2 on the base substrate is at least partially overlapped with an orthographic projection of the first connection line 71 on the base substrate.

In an exemplary embodiment, the orthographic projection of the at least one second fracture DF2 on the base substrate may be located within a range of the orthographic projection of the first connection line 71 on the base substrate.

As shown in FIG. 17f, in an exemplary embodiment, the pattern of the fourth conductive layer of the lead region in the bonding area at least includes a bonding power supply lead 410.

In an exemplary embodiment, a shape of the bonding power supply lead 410 may be a strip shape extending along the first direction X, and the bonding power supply lead 410 are respectively connected to a plurality of second power supply traces 92 of the display area. In an exemplary embodiment, the bonding power supply lead 410 is configured to continuously provide a low-level signal to the plurality of second power supply traces 92 of the display area.

In an exemplary embodiment, a plurality of lead openings 420 may be provided on the bonding power supply lead 410, and the fourth conductive thin film within the lead openings 420 is removed to expose the first planarization layer. In an exemplary embodiment, the plurality of lead openings 420 are configured to release moisture in the first planarization layer.

In an exemplary embodiment, the bonding high-voltage line 250 and the bonding power supply lead 410 of the lead region may be connected to a bonding pad of the bonding pin region after crossing the bending region and the drive chip region, and an external control device provides a high-voltage signal and a low-voltage signal to the bonding high-voltage line 250 and the bonding power supply lead 410 respectively, through a flexible circuit board and the bonding pad.

In an exemplary embodiment, the plurality of first power supply traces in the display area may be connected to the bezel power supply lead of the bezel area, and the connection structure between the first power supply traces and the bezel power supply lead is substantially the same as the connection structure between the aforementioned second power supply traces and the bonding power supply lead, which will not be described here.

FIG. 18a is a schematic diagram of a lead region of a display substrate after a pattern of a first conductive layer is formed according to the present disclosure. Since the lead region shown in FIG. 12b above is a lead region at a position corresponding to the third region in the display area, only the first lead electrodes 210 connected to the data signal lines of the odd-numbered unit columns are in the pattern of the first conductive layer of this lead region. As shown in FIG. 18a, for the lead region at a position corresponding to the second region in the display area, since the second connection line is to be formed subsequently, the pattern of the first conductive layer of this lead region may further include an eleventh lead electrode 310. The eleventh lead electrode 310 is configured to be connected to the second connection line to be formed subsequently through the thirteenth lead electrode.

In an exemplary embodiment, the lead region at the position corresponding to the second region in the display area includes not only a plurality of first lead electrodes 210, but also a plurality of eleventh lead electrodes 310. In the first conductive layer, the number of lead electrodes in a lead region at the position corresponding to the second region in the display area is different from the number of lead electrodes in the lead region at the position corresponding to the third region in the display area.

In an exemplary embodiment, structures of the eleventh lead electrodes 310 and the first lead electrodes 210 may be substantially the same.

In an exemplary embodiment, the pattern of the first conductive layer of the bonding area may further include a plurality of first lead-out lines (not shown). A shape of each first lead-out line may be a straight line shape or a polygonal line shape, first ends of the plurality of first lead-out lines are connected to the first lead electrodes 210 and the eleventh lead electrodes 310, and second ends of the plurality of first lead-out lines extend to the bending region of the bonding area along the direction away from the display area.

Figure 18B:
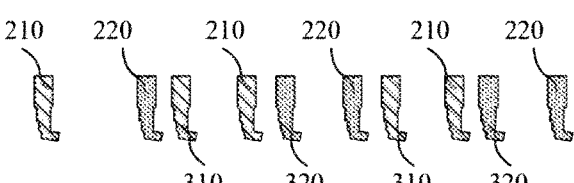

FIG. 18b is a schematic diagram of a lead region of a display substrate after a pattern of a second conductive layer is formed according to the present disclosure. Since the lead region shown in FIG. 13b above is a lead region at a position corresponding to the third region in the display area, only the second lead electrodes 220 connected to the data signal lines of the even-numbered unit columns are in the pattern of the second conductive layer of this lead region. As shown in FIG. 18b, for the lead region at a position corresponding to the second region in the display area, since the second connection line is to be formed subsequently, the pattern of the second conductive layer of this lead region may further include an twelfth lead electrode 320. The twelfth lead electrode 320 is configured to be connected to a second connection line to be formed subsequently through the fourteenth lead electrode.

In an exemplary embodiment, the lead region at the position corresponding to the second region in the display area includes not only a plurality of second lead electrodes 220, but also a plurality of twelfth lead electrodes 320. In the second conductive layer, the number of lead electrodes in the lead region at the position corresponding to the second region in the display area is different from the number of lead electrodes in the lead region at the position corresponding to the third region in the display area.

In an exemplary embodiment, the structures of the twelfth lead electrodes 320 and the second lead electrodes 220 may be substantially the same.

In an exemplary embodiment, the pattern of the second conductive layer of the bonding area may further include a plurality of second lead-out lines (not shown), wherein a shape of each second lead-out line may be a straight line shape or a polygonal line shape. First ends of the plurality of second lead-out lines are connected to the second lead electrodes 220 and the twelfth lead electrodes 320, and second ends of the plurality of second lead-out lines extend to the bending region of the bonding area along the direction away from the display area.

Figure 18C:
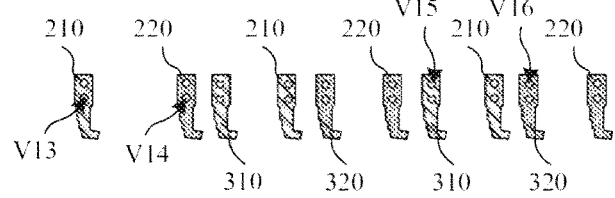

FIG. 18c is a schematic diagram of a region of a display substrate after a pattern of a fourth insulation layer is formed according to the present disclosure. Since the lead region shown in FIG. 14b above is a lead region at the position corresponding to the third region in the display area, only the thirteenth via hole V13 and the fourteenth via hole V14 are in the pattern of the fourth insulation layer of this lead region. As shown in FIG. 18c, for the lead region at the position corresponding to the second region in the display area, since the eleventh lead electrode 310 and the twelfth lead electrode 320 are provided in the lead region, the pattern of the fourth insulation layer of this lead region further includes a fifteenth via hole V15 and a sixteenth via hole V16. The fifteenth via hole V15 exposes a surface of the eleventh lead electrode 310, and is configured such that the thirteenth lead electrode 330 to be formed subsequently is connected to the eleventh lead electrode 310 through the via hole V15. The sixteenth via hole V16 exposes a surface of the twelfth lead electrode 320, which is configured such that the fourteenth lead electrode 340 to be formed subsequently is connected to the twelfth lead electrode 320 through the via hole V16.

Figure 18D:
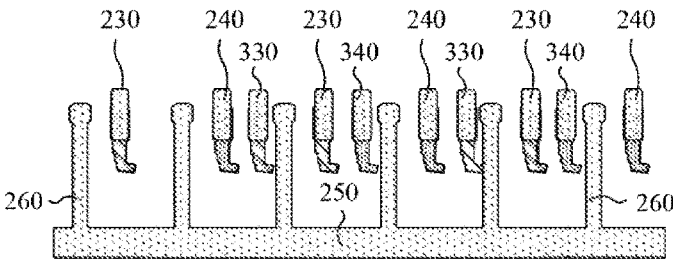

FIG. 18d is a schematic diagram of a lead region of a display substrate after a pattern of a third conductive layer is formed according to the present disclosure. Since the lead region shown in FIG. 15f above is a lead region at the position corresponding to the third region in the display area, only the third lead electrode 230 and the fourth lead electrode 240 are in the pattern of the third conductive layer of this lead region. As shown in FIG. 18d, for the lead region at the position corresponding to the second region in the display area, since the eleventh lead electrode 310 and the twelfth lead electrode 320 are provided in the lead region, the pattern of the second conductive layer of this lead region may further include a thirteenth lead electrode 330 and a fourteenth lead electrode 340. The thirteenth lead electrode 330 is connected to the eleventh lead electrode 310 through the fifteenth via hole, and the thirteenth lead electrode 330 is configured to be connected to a second connection line to be formed subsequently. The fourteenth lead electrode 340 is connected to the twelfth lead electrode 320 through the sixteenth via hole, and the fourteenth lead electrode 340 is configured to be connected to a second connection line to be formed subsequently.

In an exemplary embodiment, in the lead region at the position corresponding to the second region in the display area, two lead electrodes may be provided between bonding high-voltage electrodes 260 adjacent in the first direction X, and in the lead region at the position corresponding to the third region in the display area, only one lead electrode is provided between the bonding high-voltage electrodes 260 adjacent in the first direction X, so that the numbers of lead electrodes in the two regions are different.

In an exemplary embodiment, the structures of the thirteenth lead electrode 330 and the fourteenth lead electrode 340 may be substantially the same as the structures of the third lead electrode 230 and the fourth lead electrode 240.

Figure 18E:
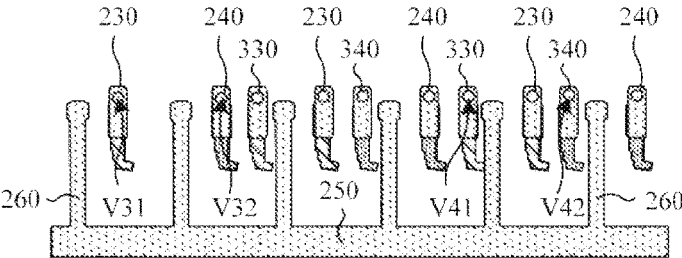

FIG. 18e is a schematic diagram of a lead region of a display substrate after a pattern of a first planarization layer is formed according to the present disclosure. Since the lead region shown in FIG. 16f above is a lead region at the position corresponding to the third region in the display area, only the thirty-first via hole V31 and the thirty-second via hole V32 are in the pattern of the first planarization layer of this lead region. As shown in FIG. 18e, for the lead region at the position corresponding to the second region in the display area, since the thirteenth lead electrode 330 and the fourteenth lead electrode 340 are provided in the lead region, the pattern of the first planarization layer of this lead region may further include a forty-first via hole V41 and a forty-second via hole V42. The forty-first via hole V41 exposes a surface of the thirteenth lead electrode 330, and is configured such that a second connection line to be formed subsequently is connected to the thirteenth lead electrode 330 through the via hole V41. The forty-second via hole V42 exposes a surface of the fourteenth lead electrode 340, and is configured such that a second connection line to be formed subsequently is connected to the thirteenth lead electrode 330 through the via hole V42.

Figure 18F:
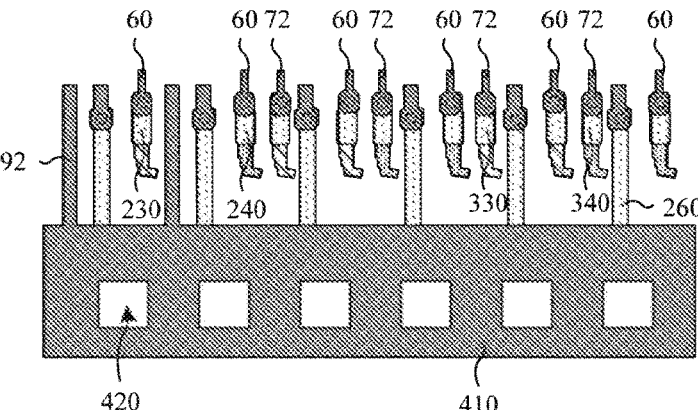

FIG. 18*f* is a schematic diagram of a lead region of a display substrate after a pattern of a fourth conductive layer is formed according to the present disclosure. Since the lead region shown in FIG. 17*f* above is a lead region at the position corresponding to the third region in the display area, only the data signal line 60 is respectively connected to the third lead electrode 230 and the fourth lead electrode 240 in the pattern of the fourth conductive layer of this lead region. As shown in FIG. 18*f,* for the lead region at the position corresponding to the second region in the display area, a plurality of second connection lines 72 are provided in this lead region. On the one hand, a part of the second connection lines 72 are connected to the thirteenth lead electrode 330 through the forty-first via hole V41 after extending to the lead region, and the other part of the second connection lines 72 are connected to the thirteenth lead electrode 330 through the forty-second via hole V42 after extending to the lead region.

In an exemplary embodiment, a connection structure between the second connection line and the lead electrode is substantially the same as the connection structure between the data signal line and the lead electrode, and will not be described here.

Hereto, the pattern of the drive circuit layer is manufactured on the base substrate. In a plane parallel to the display substrate, the drive circuit layer may include a plurality of circuit units, each of the circuits may include a pixel drive circuit, and a first scan signal line, a second scan signal line, a third scan signal line, a light emitting control line, a data signal line, a first power supply line, a first initial signal line and a second initial signal line which are connected to the pixel drive circuit. In a plane perpendicular to the display substrate, the drive circuit layer may at least include a first insulation layer, a semiconductor layer, a second insulation layer, a first conductive layer, a third insulation layer, a second conductive layer, a fourth insulation layer, a third conductive layer, a first planarization layer and a fourth conductive layer which are stacked sequentially on the base substrate.

In an exemplary embodiment, the base substrate may be a flexible substrate, or may be a rigid substrate. The rigid substrate may be made of, but not limited to, one or more of glass and quartz. The flexible substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible substrate may include a first flexible material layer, a first inorganic material layer, a semiconductor layer, a second flexible material layer and a second inorganic material layer which are stacked. Materials of the first flexible material layer and the second flexible material layer may be polyimide (PI), polyethylene terephthalate (PET) or surface treated polymer soft films. Materials of the first inorganic material layer and the second inorganic material layer may be silicon nitride (SiNx) or silicon oxide (SiOx), for improving water and oxygen resistance of the base substrate, and a material of the semiconductor layer may be amorphous silicon (a-si).

In an exemplary embodiment, the first conductive layer, the second conductive layer, the third conductive layer, and the fourth conductive layer may be made of metal materials, such as any one or more of silver (Ag), copper (Cu), aluminum (Al), and molybdenum (Mo), or an alloy material of the above metals, such as an Aluminum Neodymium alloy (AlNd) or a Molybdenum Niobium alloy (MoNb), and may be in a single-layer structure or a multi-layer composite structure, such as Mo/Cu/Mo. The first insulation layer, the second insulation layer, the third insulation layer, and the fourth insulation layer may be made of any one or more of silicon oxide (SiOx), silicon nitride (SiNx), and silicon oxynitride (SiON), and may be single-layer, multilayers, or composite layer. The first insulation layer is referred to as a buffer layer, the second insulation layer and the third insulation layer are referred to as Gate insulation (GI) layers, the third insulation layer is referred to as an Interlayer Dielectric (ILD) layer. The first planarization layer may be made of an organic material such as resin. The active layer may be made of a material such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology or organic matter technology.

In the exemplary embodiment, after the drive circuit layer is manufactured, the light emitting structure layer and the encapsulation structure layer may be sequentially manufactured on the drive circuit layer, and will not be described here.

As can be seen from the structure and manufacturing process of the display substrate described above, according to the present disclosure, the data connection lines are arranged in the display area, so that the leading lines of the bonding area are connected to the data signal lines through the data connection lines. Therefore, there is no need to arrange fan-shaped oblique lines in the lead region, which reduces a length of the lead region effectively, reduces a width of the lower bezel greatly, increases a screen-to-body ratio and is conducive to achieving a full-screen display. A structure of VSS in pixel is achieved by arranging the power supply traces in the display area according to the present disclosure, which may greatly reduce a width of the bezel power supply lead, greatly reduces widths of the left bezel and the right bezel, increases a screen-to-body ratio and is conducive to achieving a full-screen display. The data connection lines are arranged in the odd-numbered unit columns or the even-numbered unit columns according to the present disclosure, which may not only facilitates the layout of the data connection lines, but also reduce the load of the data signals and improve the display quality. The power supply traces are configured to be in a mesh communication structure according to the present disclosure, which may not only effectively reduce the resistance of the power supply traces, effectively reduce the voltage drop of the low-voltage power supply signals and achieve low power consumption, but also effectively improve the uniformity of the power supply signals in the display substrate, effectively improve the display uniformity, and improve the display quality. The dummy electrodes are arranged in the display area according to the present disclosure, so that different regions have substantially the same switching connection structure, and different regions may achieve substantially the same display effect under transmitted light and reflected light, thus effectively avoiding the poor appearance of the display substrate and improving the display quality. The manufacturing process in the present disclosure may be compatible well with an existing manufacturing process, which is simple in process implementation, easy to implement, high in production efficiency and yield, and low in production cost.

The structure shown and mentioned above in the present disclosure and the manufacturing process thereof are merely exemplary description. In an exemplary embodiment, corresponding structures may be altered and patterning processes may be added or reduced according to actual needs, which is not limited here in the present disclosure.

In an exemplary embodiment, the display substrate of the present disclosure may be applied to a display device with a pixel drive circuit, such as an OLED, a quantum dot display (QLED), a light emitting diode display (Micro LED or Mini LED) or a quantum dot light emitting diode display (QDLED), etc., which is not limited here in the present disclosure.

The present disclosure further provides a method for manufacturing a display substrate, for manufacturing the display substrate according to the foregoing embodiments. In an exemplary embodiment, the display substrate includes a display area and a bonding area on a side of the display area, and the display area includes a plurality of circuit units constituting a plurality of unit rows and a plurality of unit columns, a plurality of data signal lines and a plurality of data connection lines extending along the second direction, wherein the data connection lines include first connection lines extending along the first direction and second connection lines extending along the second direction, the first connection lines and the second connection lines are connected with each other, and the first direction intersects with the second direction; and the manufacturing method may include:

forming the data signal lines and the first connection lines in at least one circuit unit, wherein the first connection lines are connected to the data signal lines through first connection holes, and at least one data signal line is provided between two adjacent first connection holes in the first direction.

The present disclosure further provides a display device which includes the aforementioned display substrate. The display device may be any product or component with a display function, such as a mobile phone, a tablet computer, a television, a display, a laptop computer, a digital photo frame, or a navigator, and the embodiments of the present disclosure are not limited thereto.

Although the implementations disclosed in the present disclosure are described as above, the described contents are only implementations which are used for facilitating the understanding of the present disclosure, but are not intended to limit the present disclosure. Any skilled person in the art to which the present disclosure pertains may make any modification and variation in forms and details of implementation without departing from the spirit and scope of the present disclosure. However, the patent protection scope of the present disclosure should be subject to the scope defined by the appended claims.

The invention claimed is:

1. A display substrate, comprising a display area and a bonding area located on a side of the display area, wherein the display area comprises a plurality of circuit units constituting a plurality of unit rows and a plurality of unit columns, a plurality of data signal lines and a plurality of data connection lines, each data connection line comprise a first connection line extending along a first direction and a second connection line extending along a second direction, the first connection line is connected to the second connection line, and the first direction intersects with the second direction; and in at least one circuit unit, a data signal line is connected to the first connection line through a first connection hole, and at least one data signal line is provided between two first connection holes adjacent in the first direction.

2. The display substrate according to claim 1, wherein the first connection hole is arranged in a circuit unit of an odd-numbered unit column, and m data signal lines are provided between the two first connection holes adjacent in the first direction, where m is an odd number greater than or equal to 1.

3. The display substrate according to claim 1, wherein the first connection hole is arranged in a circuit unit of an even-numbered unit column, and m data signal lines are provided between the two first connection holes adjacent in the first direction, where m is an odd number greater than or equal to 1.

4. The display substrate according to claim 1, wherein the first connection hole is arranged in a circuit unit of an odd-numbered unit column, and another first connection hole adjacent to the first connection hole in the first direction is arranged in a circuit unit of an even-numbered unit column; and two data signal lines are provided between two first connection holes adjacent in the first direction.

5. The display substrate according to claim 1, wherein at least one second connection line is arranged between two data signal lines adjacent in the first direction.

6. The display substrate according to claim 1, wherein the second connection line is connected to the first connection line through a second connection hole, and the first connection hole and the second connection hole connecting a same first connection line are respectively arranged on two sides of the first connection line in the second direction.

7. The display substrate according to claim 1, wherein each circuit unit at least comprises a pixel drive circuit, and the data signal lines are connected to pixel drive circuits of a plurality of circuit units in one unit column; and the plurality of unit columns at least comprise a first unit column and a second unit column, wherein pixel drive circuits of a plurality of circuit units in the first unit column are respectively connected to a red light emitting device emitting red light and a blue light emitting device emitting blue light, pixel drive circuits of a plurality of circuit units in the second unit column are connected to a green light emitting device emitting green light, the first connection line is connected to a data signal line of the first unit column, and the first connection line is not connected to a data signal line of the second unit column.

8. The display substrate of claim 1, wherein the display area further comprises a plurality of first power supply traces extending along the first direction and a plurality of second power supply traces extending along the second direction, and the second power supply traces are connected to the first power supply traces through third connection holes.

9. The display substrate according to claim 8, wherein the second power supply traces are arranged between two data signal lines adjacent in the first direction; or the bonding area is provided with bonding power supply leads connected to the plurality of second power supply traces of the display are; or the display substrate further comprises a bezel area located on other sides of the display area, and the bezel area is provided with a bezel power supply lead, and the bezel power supply lead is connected to the plurality of first power supply traces of the display area; or the first power supply traces and the first connection lines are arranged in a same layer, the at least one circuit unit comprises a first fracture arranged between the first connection line and a first power supply trace, and an orthographic projection of the first fracture on a plane of the display substrate is at least partially overlapped with an orthographic projection of a second power supply trace on the plane of the display substrate.

10. The display substrate according to claim 9, wherein the second power supply trace and the second connection line are arranged in a same layer, the at least one circuit unit comprises a second fracture arranged between the second connection line and the second power supply trace, and an orthographic projection of the second fracture on the plane of the display substrate is at least partially overlapped with an orthographic projection of the first connection line on the plane of the display substrate.

11. The display substrate according to claim 1, wherein the bonding area at least comprises a lead region, the lead region comprises a plurality of lead-out lines, the plurality of lead-out lines comprise a first lead-out line group and a second lead-out line group, lead-out lines in the first lead-out line group are connected to the data signal lines through the data connection lines, and lead-out lines in the second lead-out line group are connected to the data signal lines; and a plurality of lead-out lines of the first lead-out line group are arranged sequentially along the first direction in an order of increasing numbers, and a plurality of lead-out lines of the second lead-out line group are arranged sequentially along an opposite direction of the first direction in an order of increasing numbers; or, the plurality of lead-out lines of the first lead-out line group are arranged sequentially along the opposite direction of the first direction in the order of increasing numbers, and the plurality of lead-out lines of the second lead-out line group are arranged sequentially along the first direction in the order of increasing numbers.

12. The display substrate according to claim 1, wherein each circuit unit at least comprises a pixel drive circuit, the pixel drive circuit comprises a storage capacitor and a plurality of transistors; and in a plane perpendicular to the display substrate, the drive circuit layer comprises a semiconductor layer, a first conductive layer, a second conductive layer, a third conductive layer and a fourth conductive layer which are arranged sequentially on the base substrate, wherein the semiconductor layer at least comprises active layers of the plurality of transistors, the first conductive layer at least comprises gate electrodes of the plurality of transistors and a first plate of the storage capacitor, the second conductive layer at least comprises a second plate of the storage capacitor, the third conductive layer at least comprises first electrodes and second electrodes of the plurality of transistors and the first connection line, and the fourth conductive layer at least comprises the data signal line, the second connection line and a first power supply line, the data signal line is connected to a first end of the first connection line through the first connection hole, and the second connection line is connected to a second end of the first connection line through a second connection hole.

13. The display substrate according to claim 12, wherein the bonding area at least comprises a lead region, the lead region comprises a plurality of lead-out lines, and the plurality of lead-out lines comprise a plurality of first lead-out lines arranged in the first conductive layer and a plurality of second lead-out lines arranged in the second conductive layer; the first lead-out lines are connected to data signal lines of odd-numbered unit columns in the display area, and the second lead-out lines are connected to data signal lines of even-numbered unit columns in the display area; or, the first lead-out lines are connected to data signal lines of even-numbered unit columns in the display area, and the second lead-out lines are connected to data signal lines of odd-numbered unit columns in the display area.

14. The display substrate according to claim 13, wherein the first conductive layer further comprises a plurality of first lead electrodes connected to the first lead-out lines; the second conductive layer further comprises a plurality of second lead electrodes connected to the second lead-out lines; the third conductive layer further comprises a plurality of third lead electrodes and a plurality of fourth lead electrodes, wherein the third lead electrodes are connected to the first lead electrodes through via holes, and the fourth lead electrodes are connected to the second lead electrodes through the via holes; data signal lines of the odd-numbered unit columns in the display area are connected to the third lead electrodes through via holes, and data signal lines of the even-numbered unit columns in the display area are connected to the fourth lead electrodes through via holes; or, the data signal lines of the even-numbered unit columns in the display area are connected to the third lead electrodes through via holes, and the data signal lines of the odd-numbered unit columns in the display area are connected to the fourth lead electrodes through the via holes.

15. The display substrate according to claim 12, wherein the third conductive layer further comprises a plurality of first power supply traces extending along the first direction, the fourth conductive layer further comprises a plurality of second power supply traces extending along the second direction, and the second power supply traces are connected to the first power supply traces through third connection holes.

16. The display substrate according to claim 15, the bonding area at least comprises the lead region, the lead region at least comprises a plurality of bonding high-voltage electrodes arranged sequentially along the first direction, the bonding high-voltage electrodes are configured to be connected to the first power supply lines, and one lead electrode connected to a data signal line is provided between bonding high-voltage electrodes adjacent in the first direction; and one lead electrode connected to a second connection line is further provided between part of adjacent bonding high-voltage electrodes.

17. The display substrate according to claim 12, wherein the plurality of transistors at least comprise a drive transistor, a reset transistor and a compensation transistor, the storage capacitor comprises the first plate and the second plate, and the third conductive layer further comprises a first connection electrode and a second connection electrode, wherein the first connection electrode is respectively connected to the first plate, a gate electrode of the drive transistor, a second electrode of the reset transistor and a first electrode of the compensation transistor, and the second connection electrode is respectively connected to the second plate and the first power supply line; or the plurality of transistors at least comprise a data write transistor, and in at least one circuit unit, a pattern of the third conductive layer further comprises a data connection electrode, wherein the data connection electrode is connected to the first connection line, and the data connection electrode and a first electrode of the data write transistor have a shared structure.

18. The display substrate according to claim 17, wherein an orthographic projection of the first connection electrode on the base substrate is at least partially overlapped with an orthographic projection of the first power supply line on the base substrate; or an orthographic projection of the second connection electrode on the base substrate is at least partially overlapped with the orthographic projection of the first power supply line on the base substrate.

19. A display device, comprising the display substrate according to claim 1.

20. A method for manufacturing a display substrate, the display substrate comprises a display area and a bonding area on a side of the display area, the display area comprises a plurality of circuit units constituting a plurality of unit rows and a plurality of unit columns, a plurality of data signal lines and a plurality of data connection lines, wherein each data connection line comprises a first connection line extending along a first direction and a second connection line extending along a second direction, the first connection line is connected to the second connection line, and the first direction intersects with the second direction; and the method comprises:

forming the data signal line and the first connection line in at least one circuit unit, wherein the first connection line is connected to the data signal line through a first connection hole, and at least one data signal line is provided between two first connection holes adjacent in the first direction.

* * * * *